United States Patent
Steele

(10) Patent No.: US 9,956,727 B2
(45) Date of Patent: May 1, 2018

(54) APPARATUS AND METHOD FOR FORMING 3D OBJECTS

(71) Applicant: Polar 3D LLC, Cincinnati, OH (US)

(72) Inventor: William Joseph Steele, Lawrenceburg, IN (US)

(73) Assignee: POLAR 3D LLC, Cincinnati, OH (US)

(*) Notice: Subject to any disclaimer, the term of this patent is extended or adjusted under 35 U.S.C. 154(b) by 0 days. days.

(21) Appl. No.: 15/437,054

(22) Filed: Feb. 20, 2017

(65) Prior Publication Data
US 2017/0173892 A1 Jun. 22, 2017

Related U.S. Application Data

(63) Continuation of application No. PCT/US2016/059687, filed on Oct. 31, 2016.
(Continued)

(51) Int. Cl.
B29C 67/00 (2017.01)
B22F 3/105 (2006.01)
(Continued)

(52) U.S. Cl.
CPC ........ B29C 67/0092 (2013.01); B22F 3/1055 (2013.01); B29C 67/0066 (2013.01);
(Continued)

(58) Field of Classification Search
CPC ............ B29C 67/0092; B29C 67/0066; B29C 67/0088; B22F 3/1055
See application file for complete search history.

(56) References Cited

U.S. PATENT DOCUMENTS 4,575,330 A 3/1986 Hull
4,752,498 A 6/1988 Fudim
(Continued)

FOREIGN PATENT DOCUMENTS

WO 2015056230 A1 4/2015
WO 2015056232 A1 4/2015

OTHER PUBLICATIONS

International Search Report and Written Opinion dated Jan. 17, 2017, for corresponding International Application No. PCT/US2016/059687, filed Oct. 31, 2016 (11 pages).
(Continued)

*Primary Examiner* — Jacob T Minskey
*Assistant Examiner* — Yung-Sheng M Tsui
(74) *Attorney, Agent, or Firm* — Daniel F. Nesbitt; Hasse & Nesbitt LLC

(57) ABSTRACT

A printer apparatus and a method for continuously printing a three-dimensional (3D) object. The printer apparatus has an elongated container for containing build fluid comprising a monomer from which the 3D object is made. A means for continuous conveying a build platform has a build surface that descending down into the build fluid. A matrix of light emitting elements are disposed above the elongated container, and emit a predetermined pattern of a reactive light toward the continuously conveyed build surface and at the upper surface of the build fluid. The reactive light has a predetermined pattern that polymerizes and/or agglomerates a portion of the upper surface of the build fluid into a build material having a build pattern comprising the build material. The build platform can have a plurality of build surface segments attached in series along a continuous conveyor.

29 Claims, 63 Drawing Sheets

Related U.S. Application Data

(60) Provisional application No. 62/248,927, filed on Oct. 30, 2015, provisional application No. 62/337,440, filed on May 17, 2016.

(51) Int. Cl.
- *B29K 101/12* (2006.01)
- *B33Y 10/00* (2015.01)
- *B33Y 30/00* (2015.01)
- *B33Y 50/02* (2015.01)

(52) U.S. Cl.
CPC .. *B29C 67/0088* (2013.01); *B22F 2003/1057* (2013.01); *B22F 2003/1058* (2013.01); *B29K 2101/12* (2013.01); *B33Y 10/00* (2014.12); *B33Y 30/00* (2014.12); *B33Y 50/02* (2014.12)

(56) References Cited

U.S. PATENT DOCUMENTS

| | | |
|---|---|---|
| 4,801,477 A | 1/1989 | Fudim |
| 5,182,055 A | 1/1993 | Allison et al. |
| 5,269,982 A | 12/1993 | Brotz |
| 5,603,983 A * | 2/1997 | Clough ............ C04B 35/62847 427/126.3 |
| 5,609,813 A | 3/1997 | Allison et al. |
| 5,779,967 A | 7/1998 | Hull |
| 5,885,511 A | 3/1999 | Heller et al. |
| 6,036,911 A | 3/2000 | Allison et al. |
| 6,492,651 B2 | 12/2002 | Kerekes |
| 8,182,882 B2 | 5/2012 | Johnson et al. |
| 8,226,395 B2 | 7/2012 | Pax et al. |
| 8,282,380 B2 | 10/2012 | Pax et al. |
| 8,287,794 B2 | 10/2012 | Pax et al. |
| 8,318,055 B2 | 11/2012 | Widman et al. |
| 8,778,252 B2 | 7/2014 | Mackie et al. |
| 8,801,418 B2 | 8/2014 | El-Siblani et al. |
| 8,888,480 B2 * | 11/2014 | Yoo .................... B29C 67/0081 264/113 |
| 9,205,601 B2 | 12/2015 | Desimone et al. |
| 9,211,678 B2 | 12/2015 | Desimone et al. |
| 9,216,546 B2 | 12/2015 | Desimone et al. |
| 2002/0195748 A1* | 12/2002 | Farnworth ............ B33Y 10/00 264/401 |
| 2004/0238111 A1* | 12/2004 | Siegel ................. B41F 23/0409 156/275.5 |
| 2013/0026680 A1* | 1/2013 | Ederer .................... B22F 3/105 264/401 |
| 2013/0059089 A1 | 3/2013 | Gullentops et al. |
| 2014/0183006 A1 | 7/2014 | Tully et al. |
| 2015/0042018 A1 | 2/2015 | Günther et al. |
| 2015/0093552 A1 | 4/2015 | Biskop et al. |
| 2015/0097316 A1 | 4/2015 | Desimone et al. |
| 2016/0046803 A1* | 2/2016 | Boday ................... B33Y 70/00 264/129 |
| 2016/0067922 A1 | 3/2016 | Voris et al. |
| 2016/0107340 A1* | 4/2016 | Joyce ..................... B29C 33/68 425/174.4 |

OTHER PUBLICATIONS

"Continuous 3D Printer VXC800 for Sand Moulds And Plastic Parts", [online] youtube video by Voxeljet, Aug. 6, 2013, retrieved from the Internet at www.youtube.com/watch?v=maO3XxB1imU, (1:28).

Krassenstein, Eddie, "Andreas Bastian Creates Incredible Bendable 3D Printed Mesostructured Material", [serialonline] Apr. 29, 2014, retrieved from the Internet at www.3dprint.com/2739/bastian-mesostructured/.

"This New Type of 3D Printing Was Inspired by Terminator 2", [online] youtube video by Vox.com, Mar. 16, 2015, retrieved from the Internet at www.youtube.com/watch?v=l3TgmvV2E1Q, (1:26).

"A Million Dollar+ Quad Laser 3D Metal Printer Demo, The SLM 500HL @ Rapid 2015", [online] youtube video by ElectricTV.com, May 28, 2015, retrieved from the Internet at www.youtube.com/watch?v=sbPpFHZL_cU, (3:28).

* cited by examiner

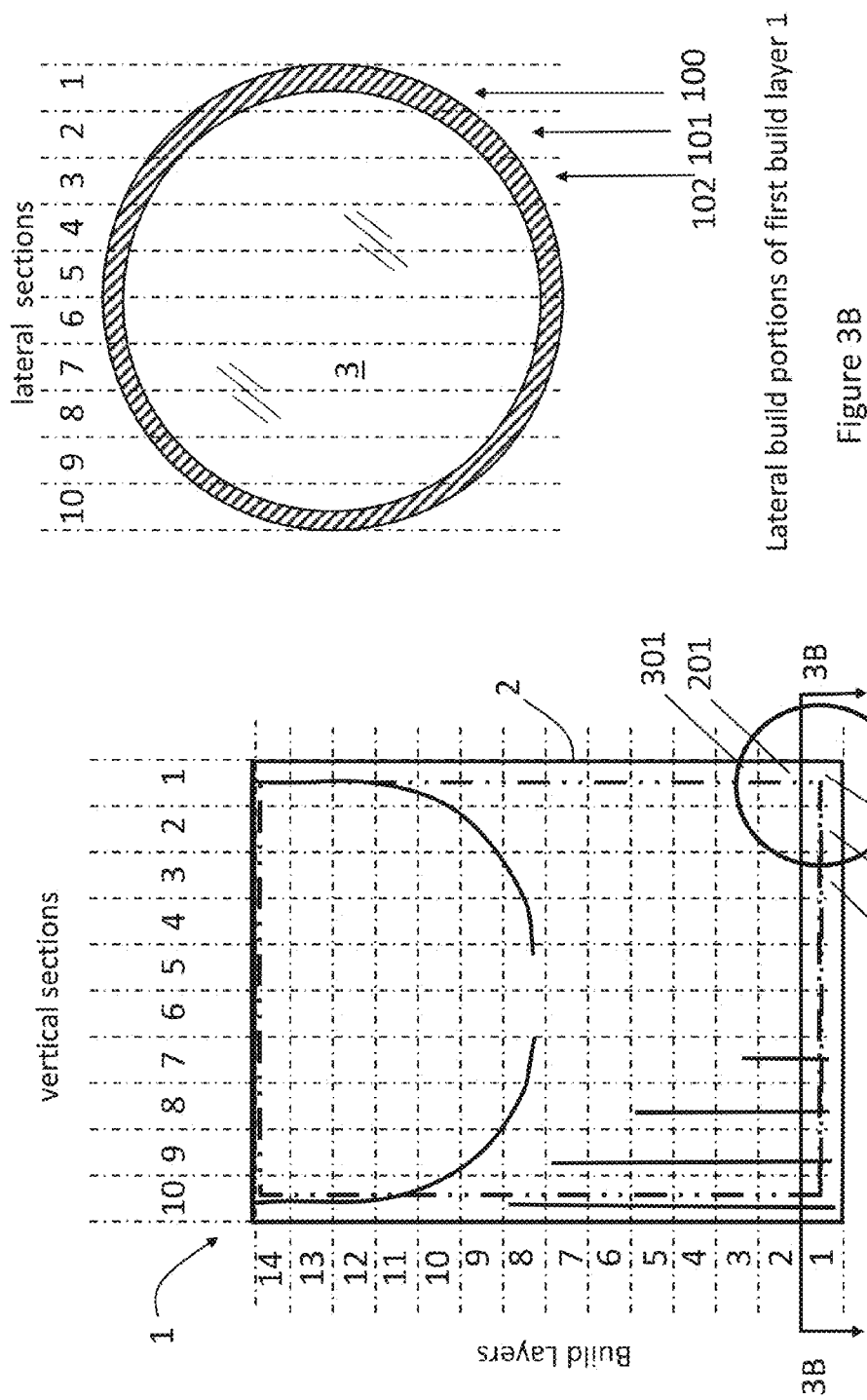

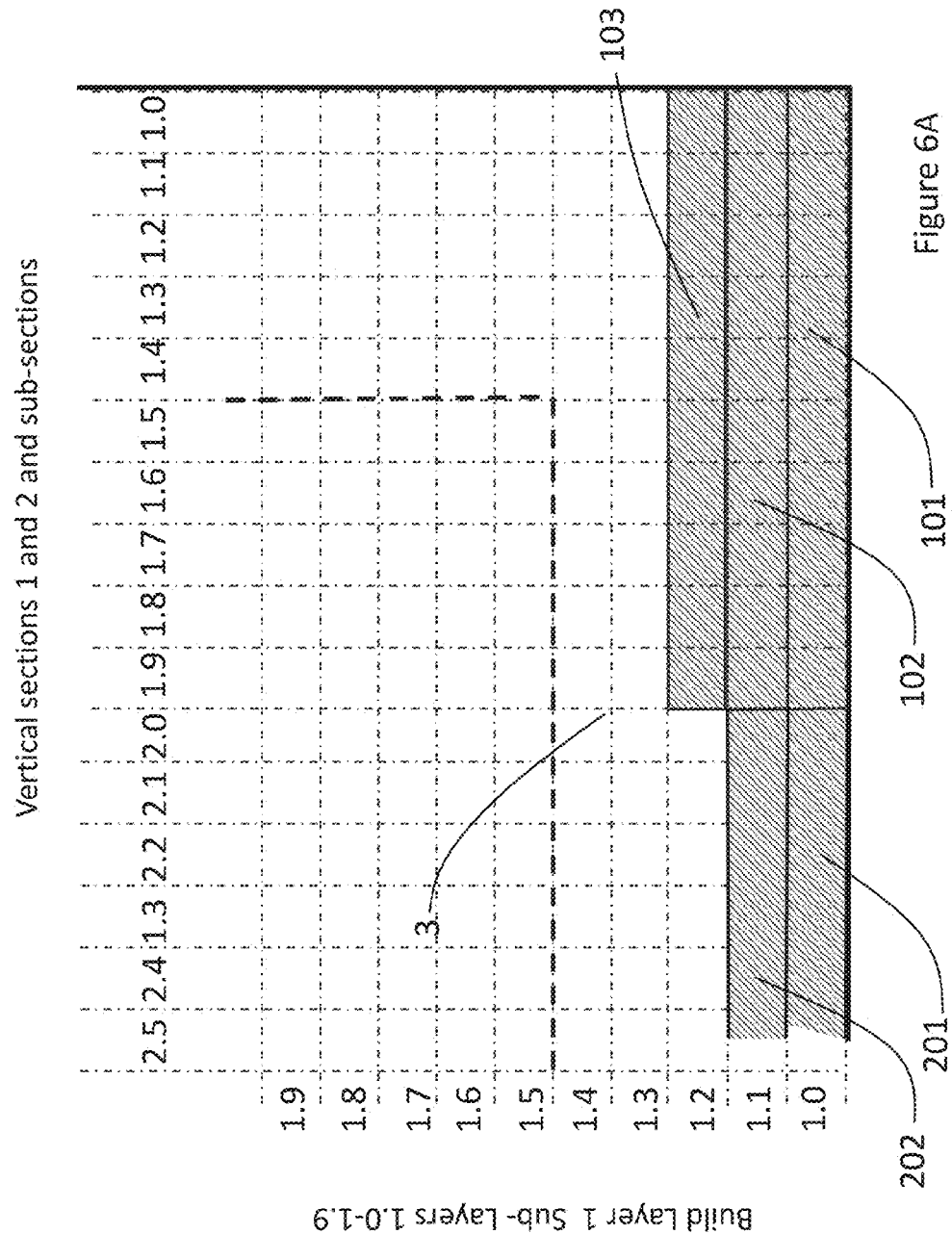

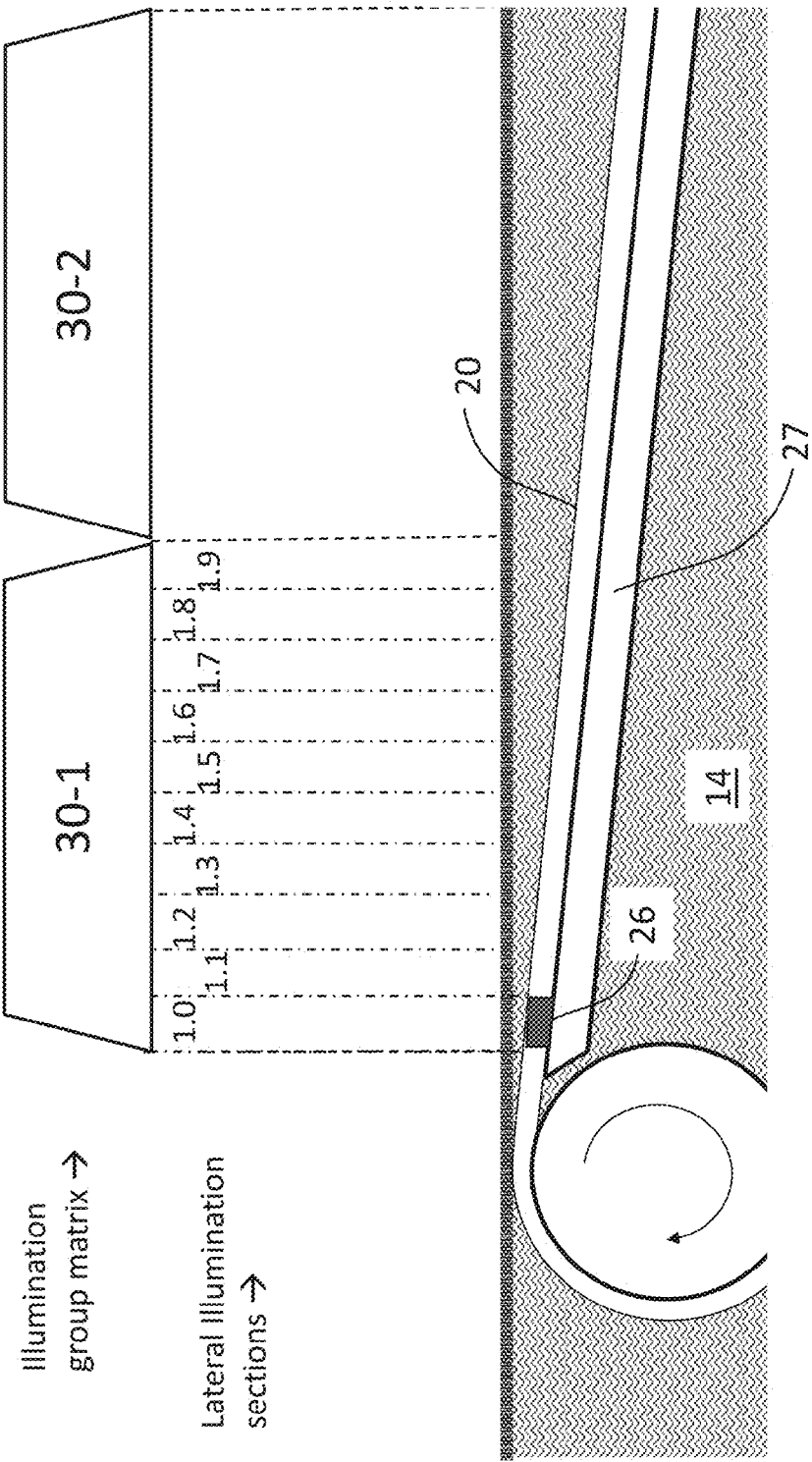

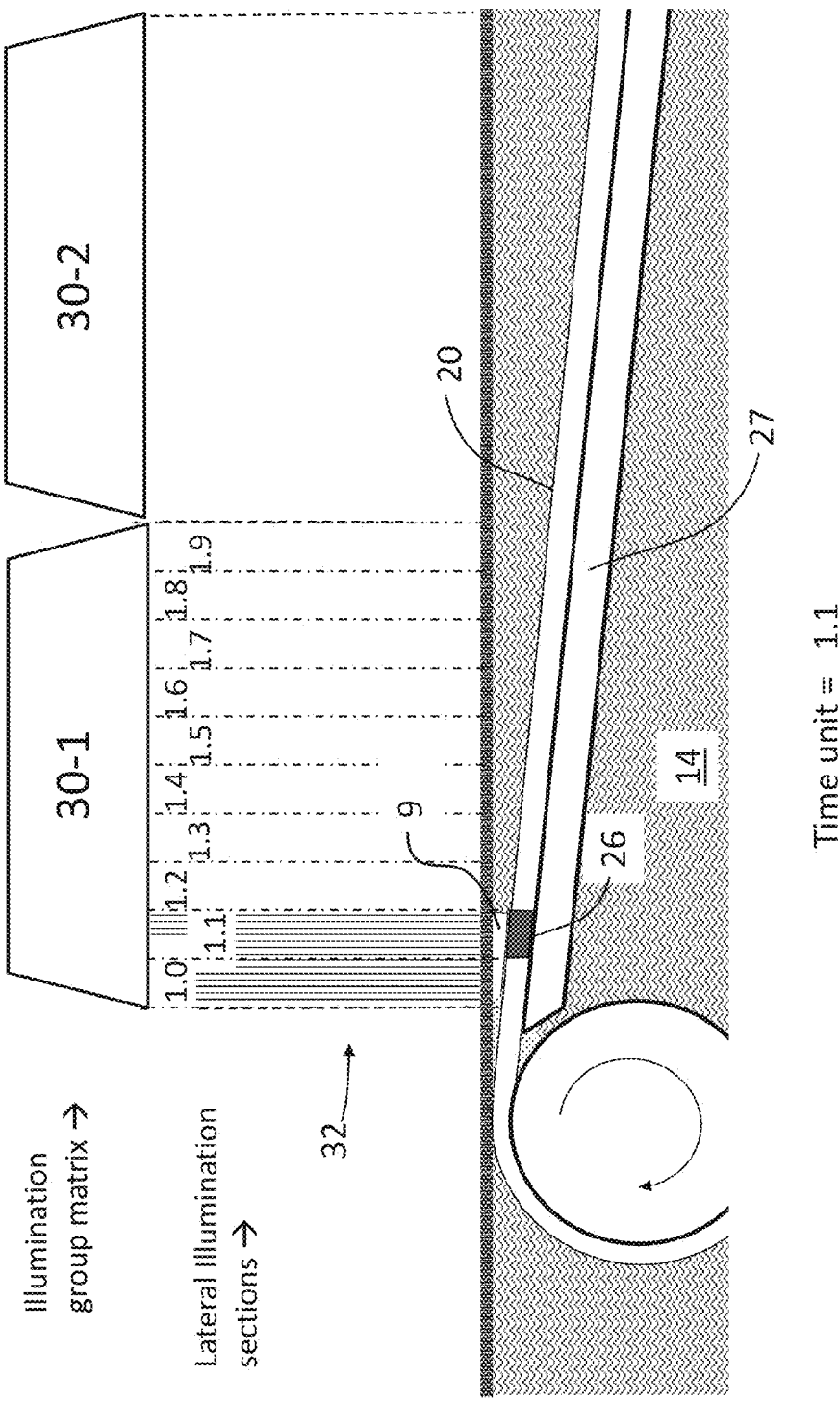

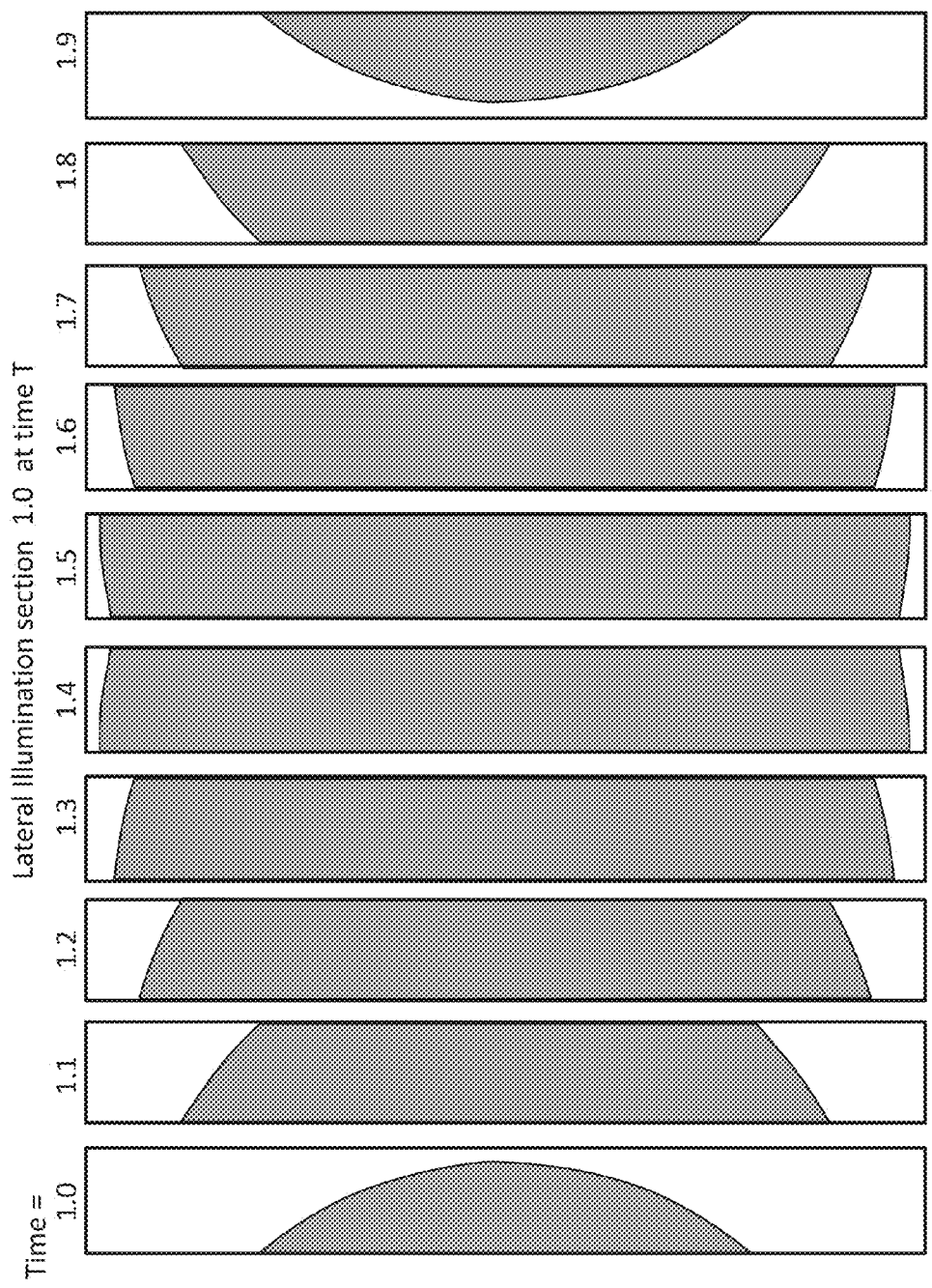

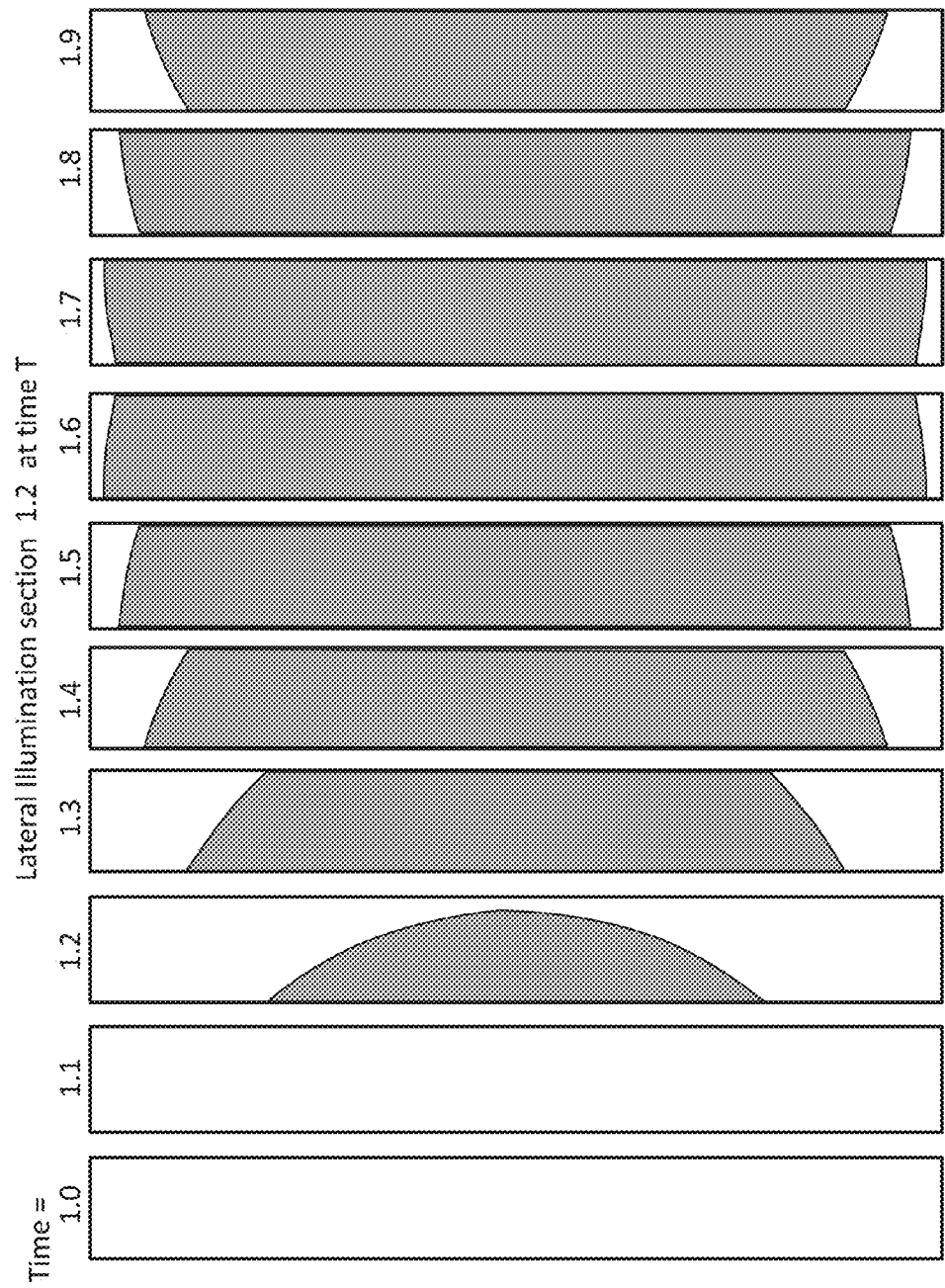

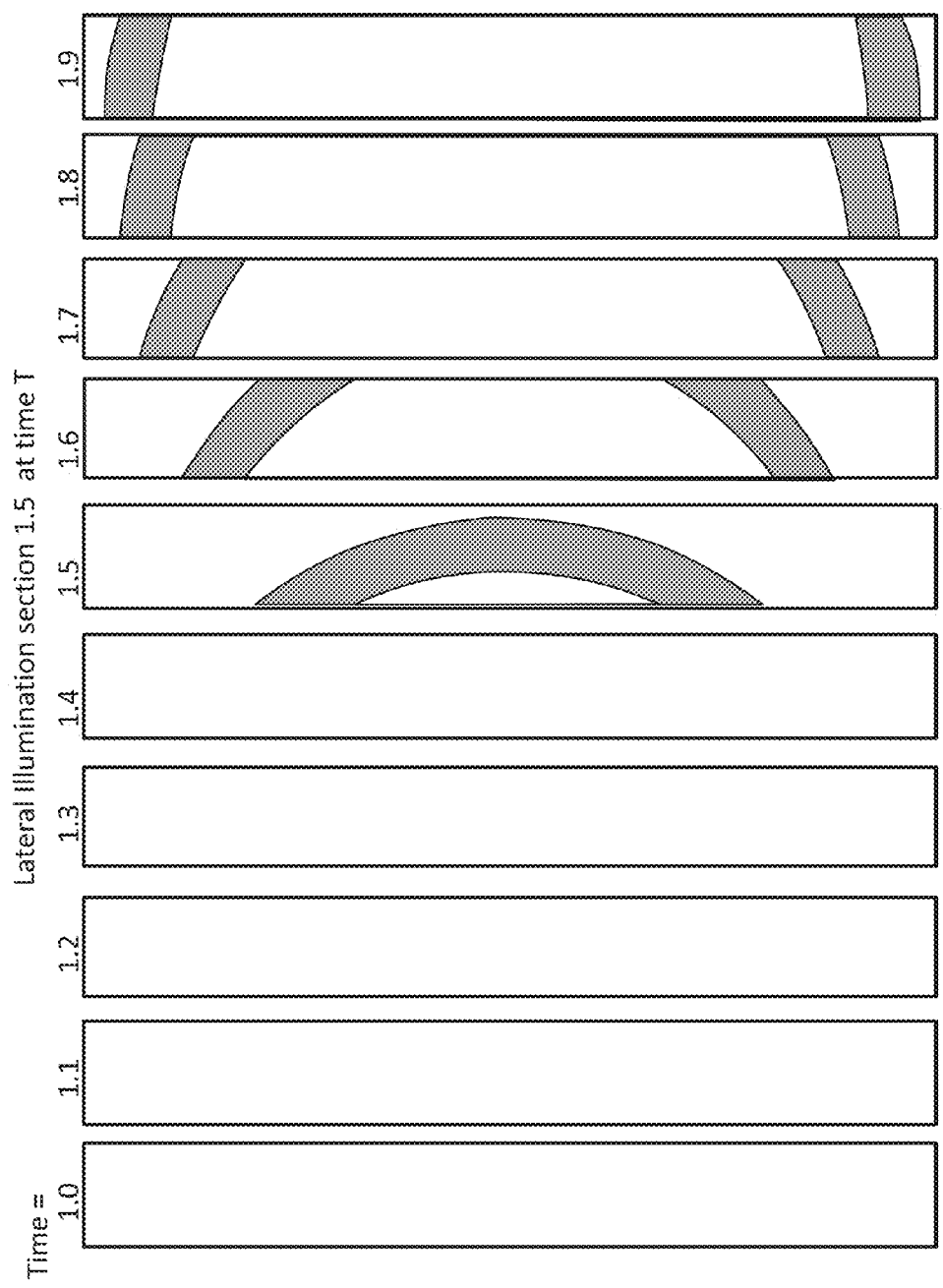

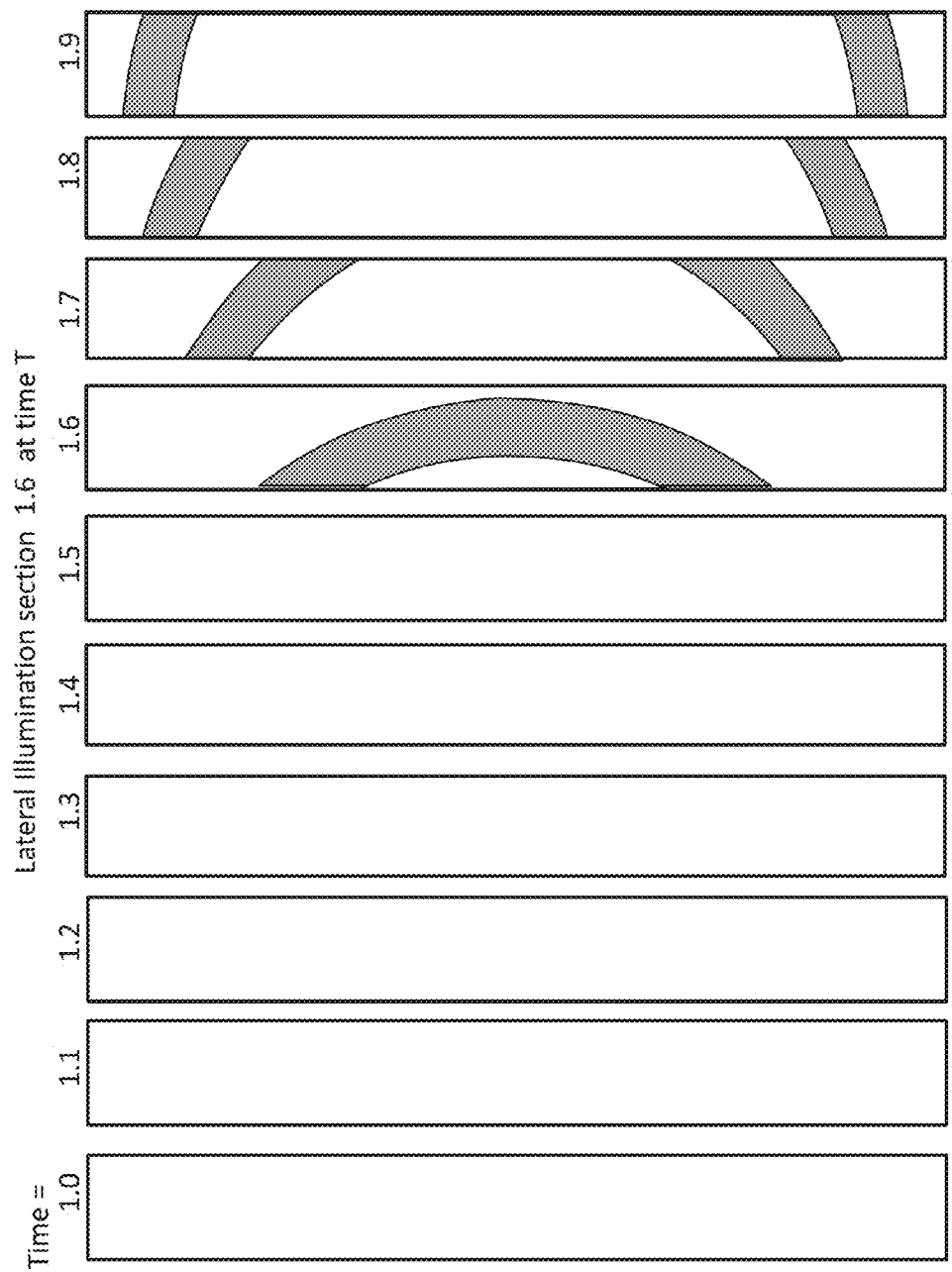

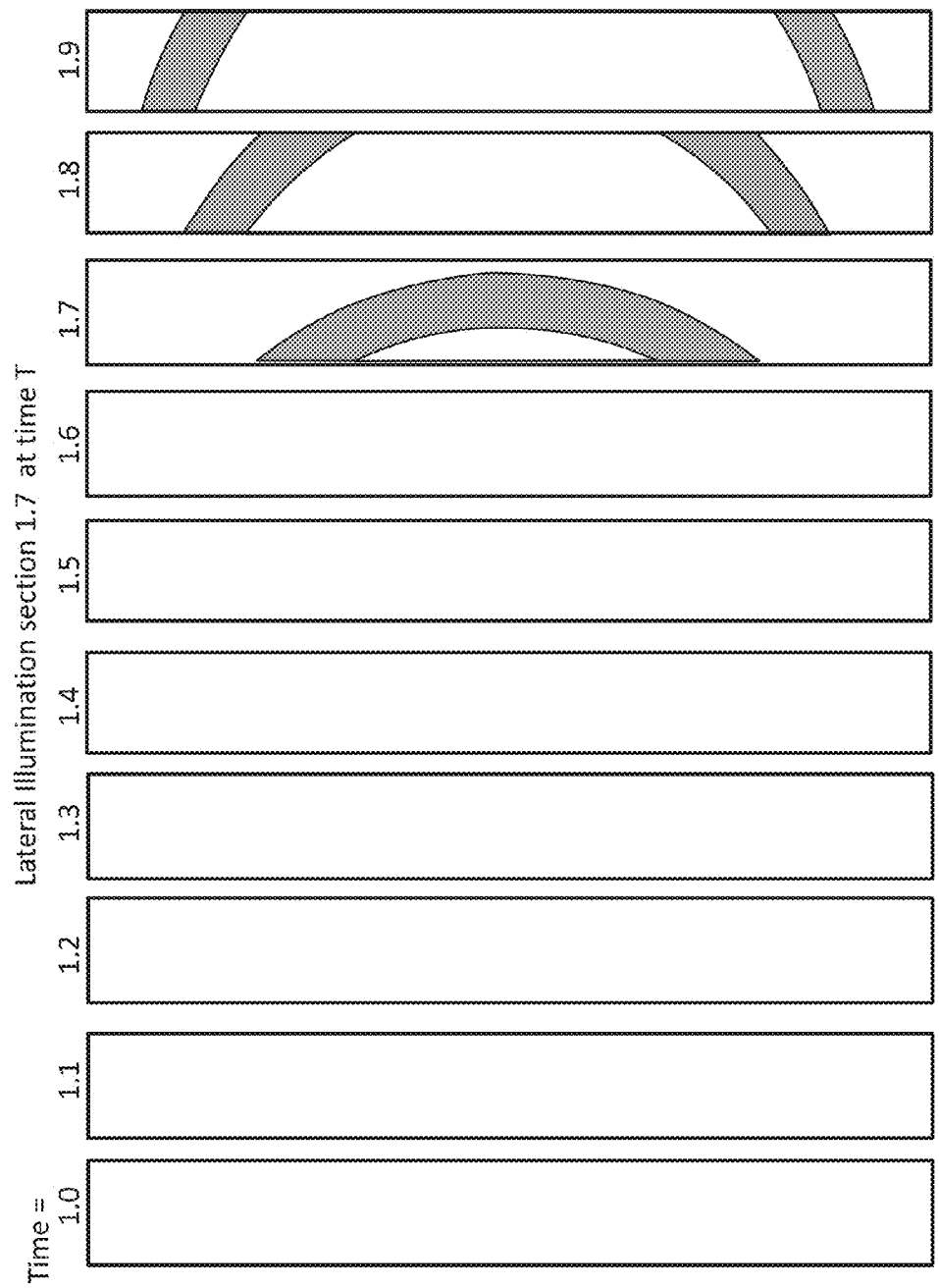

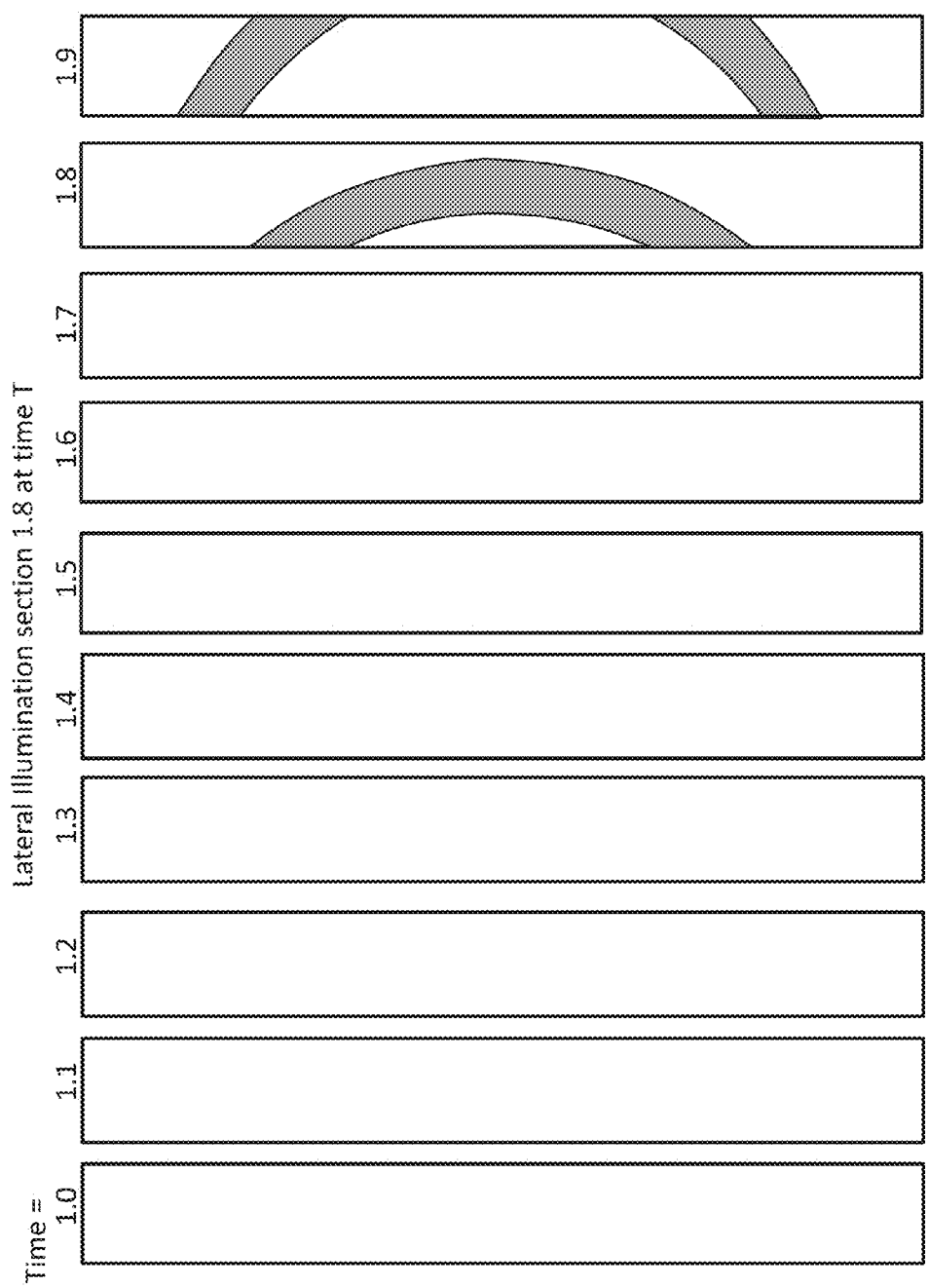

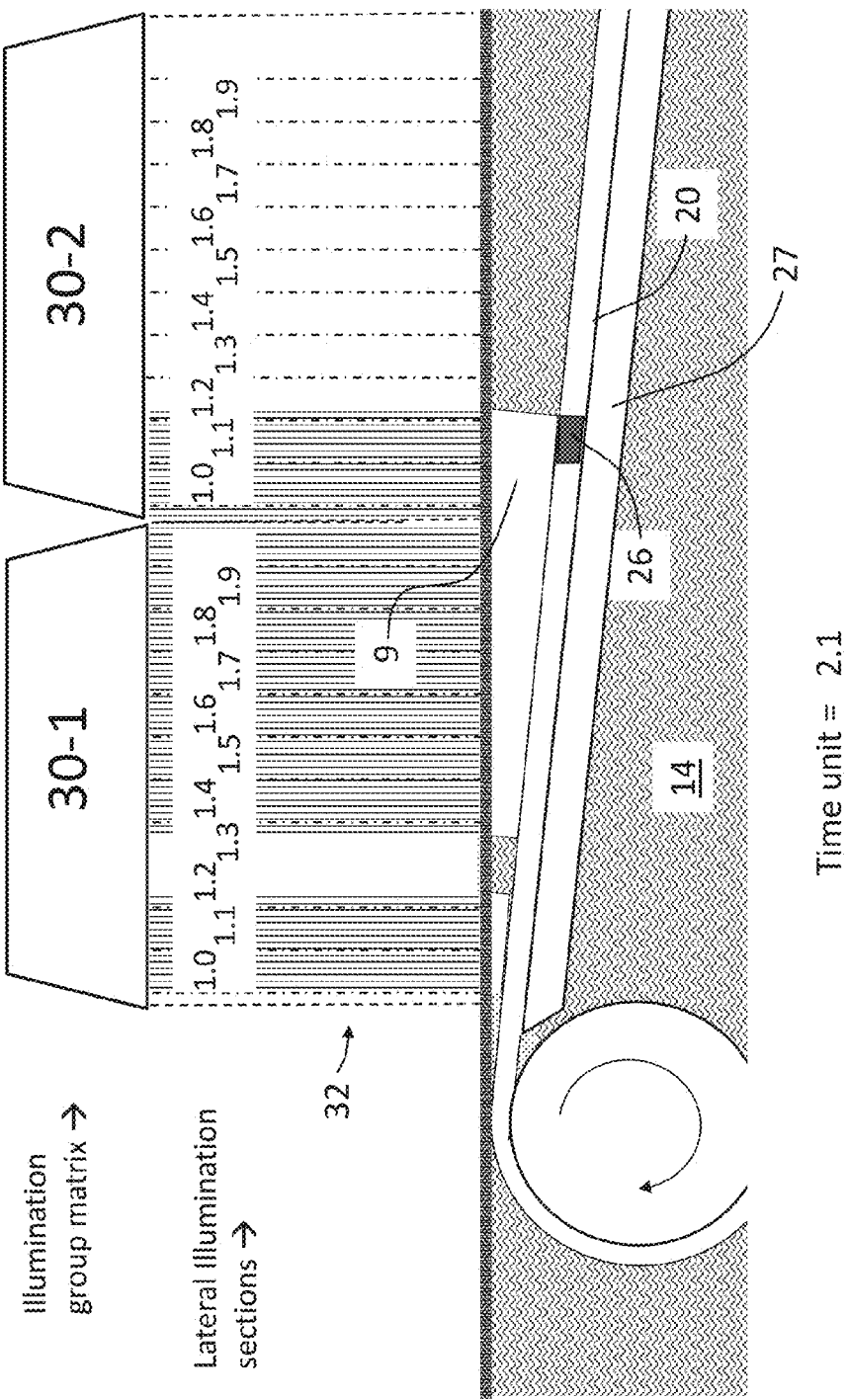

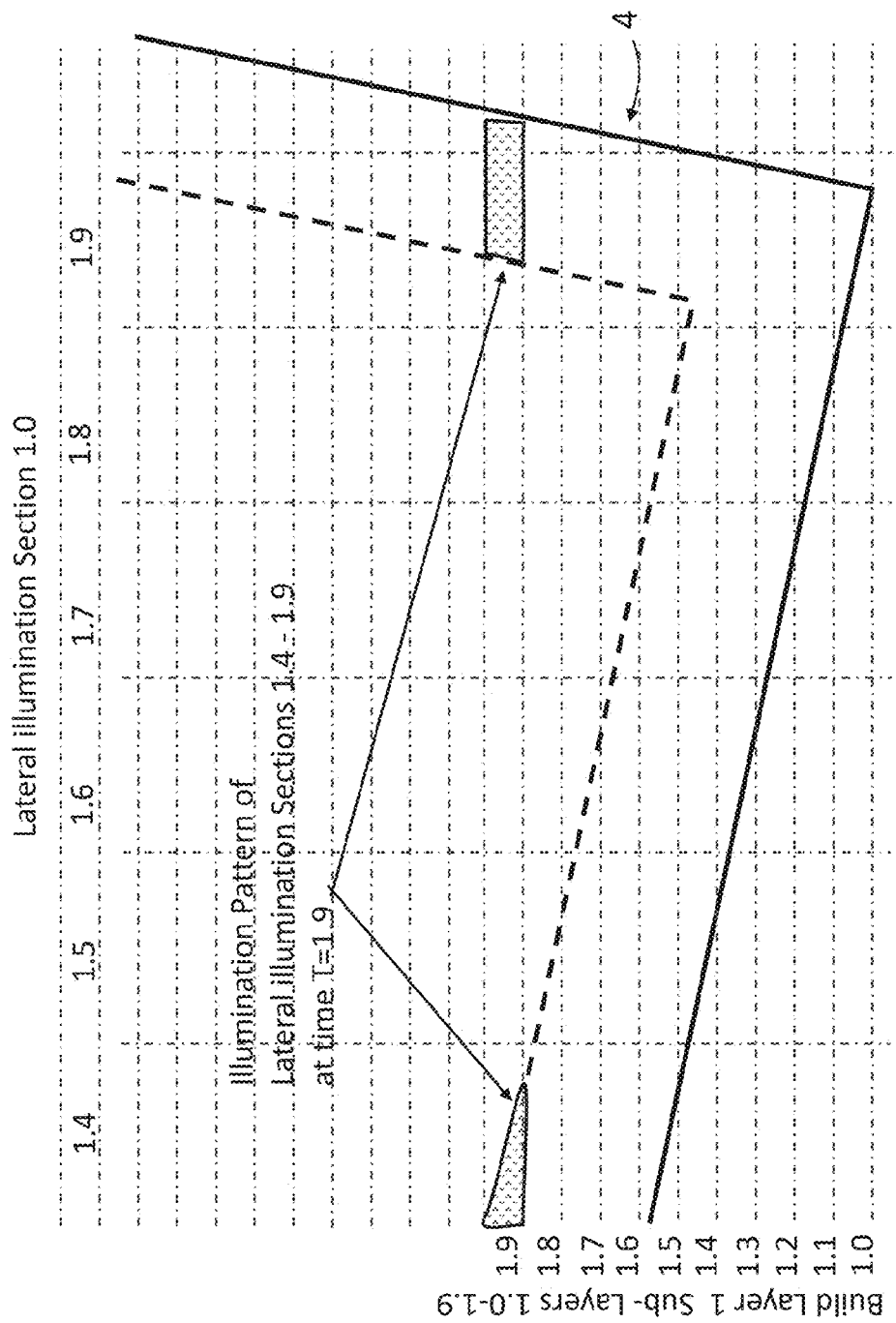

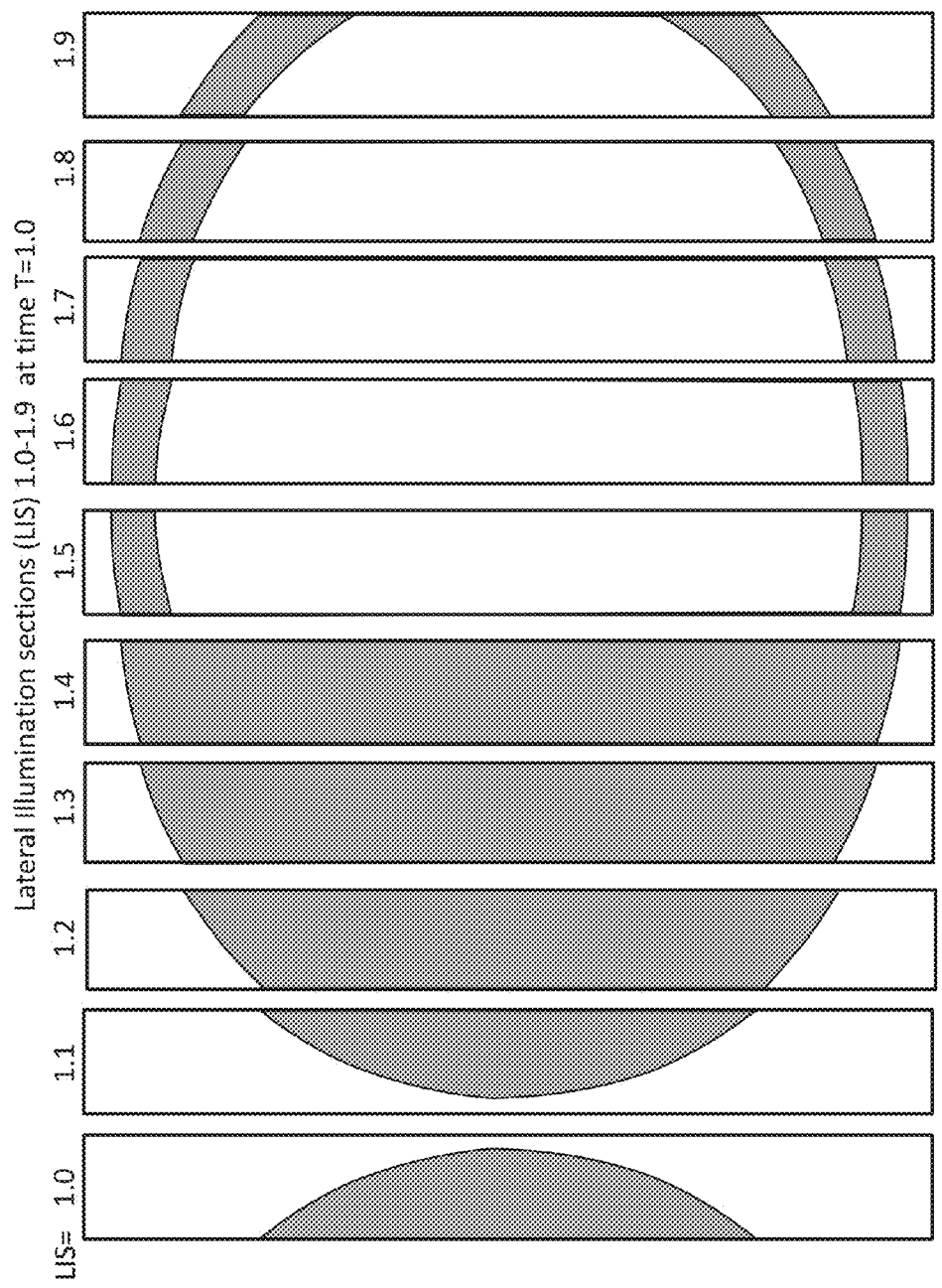

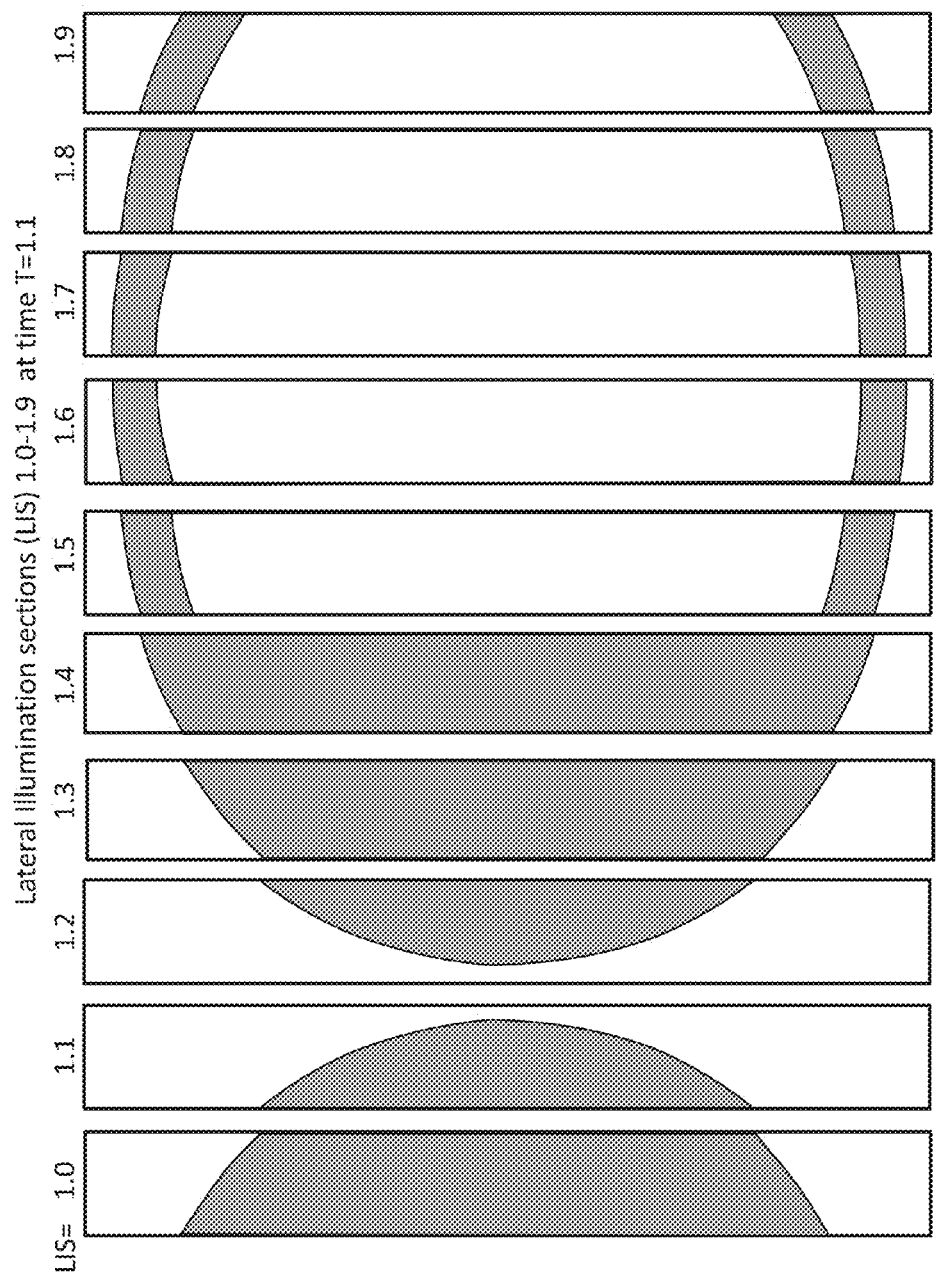

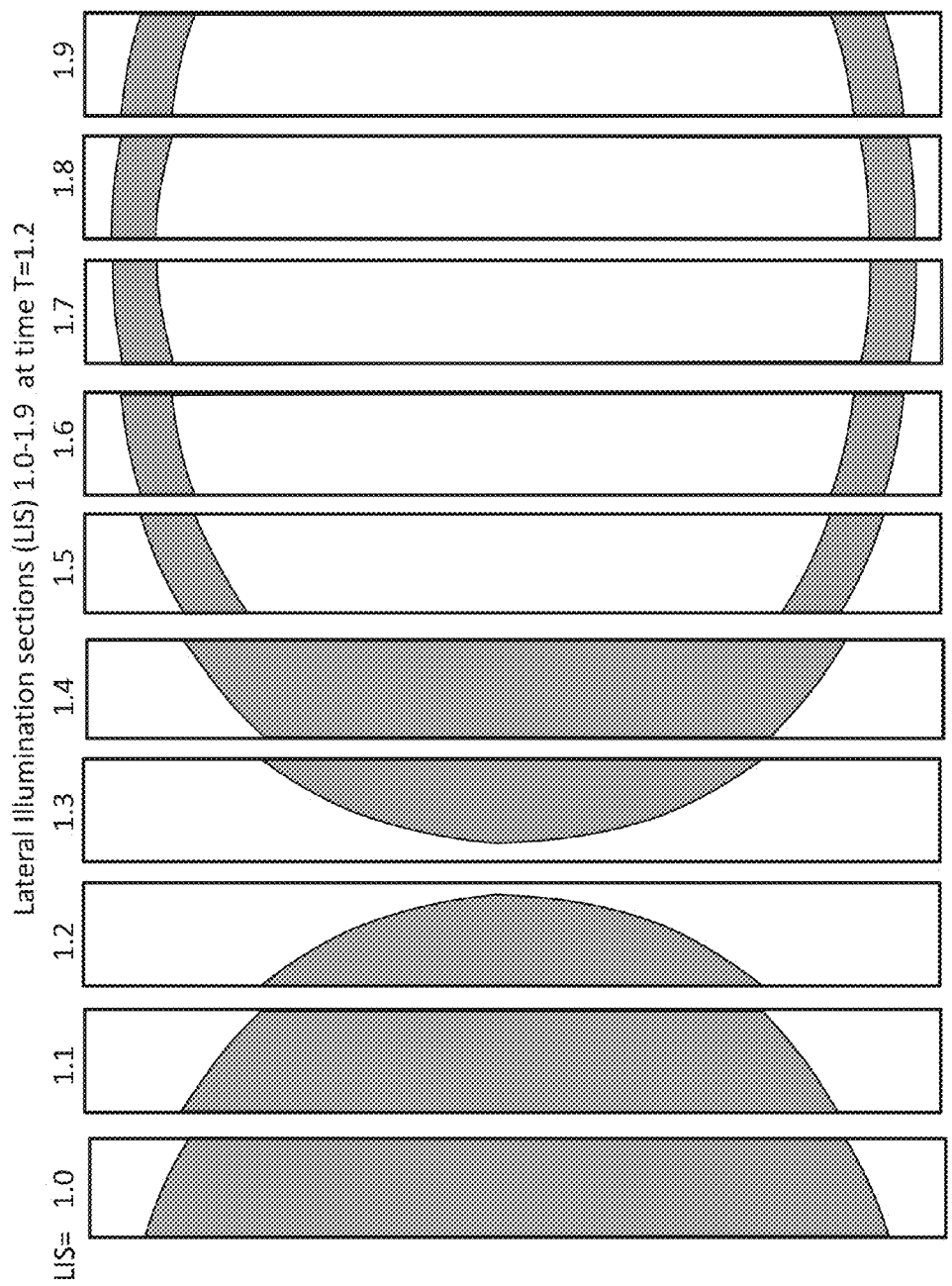

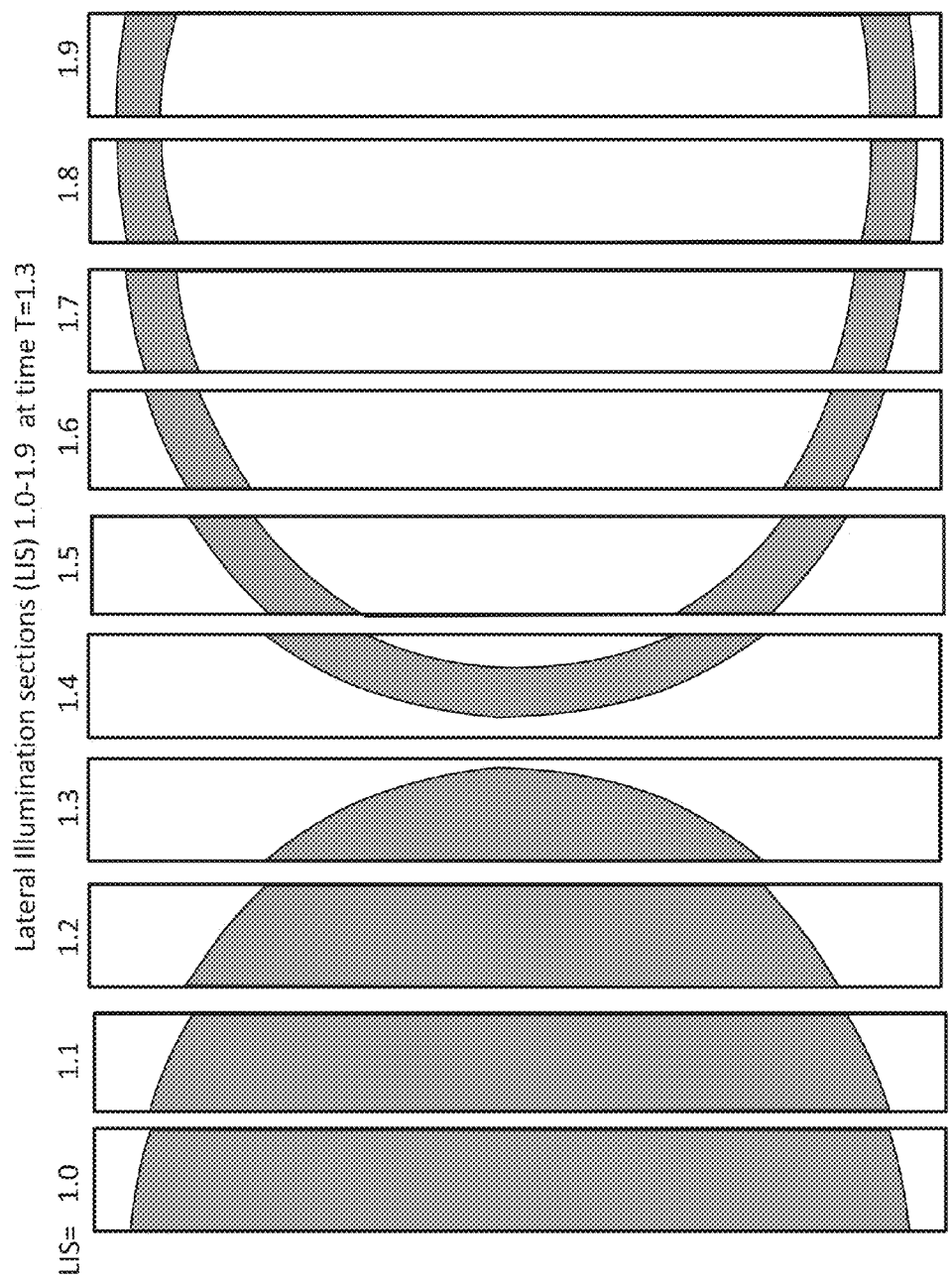

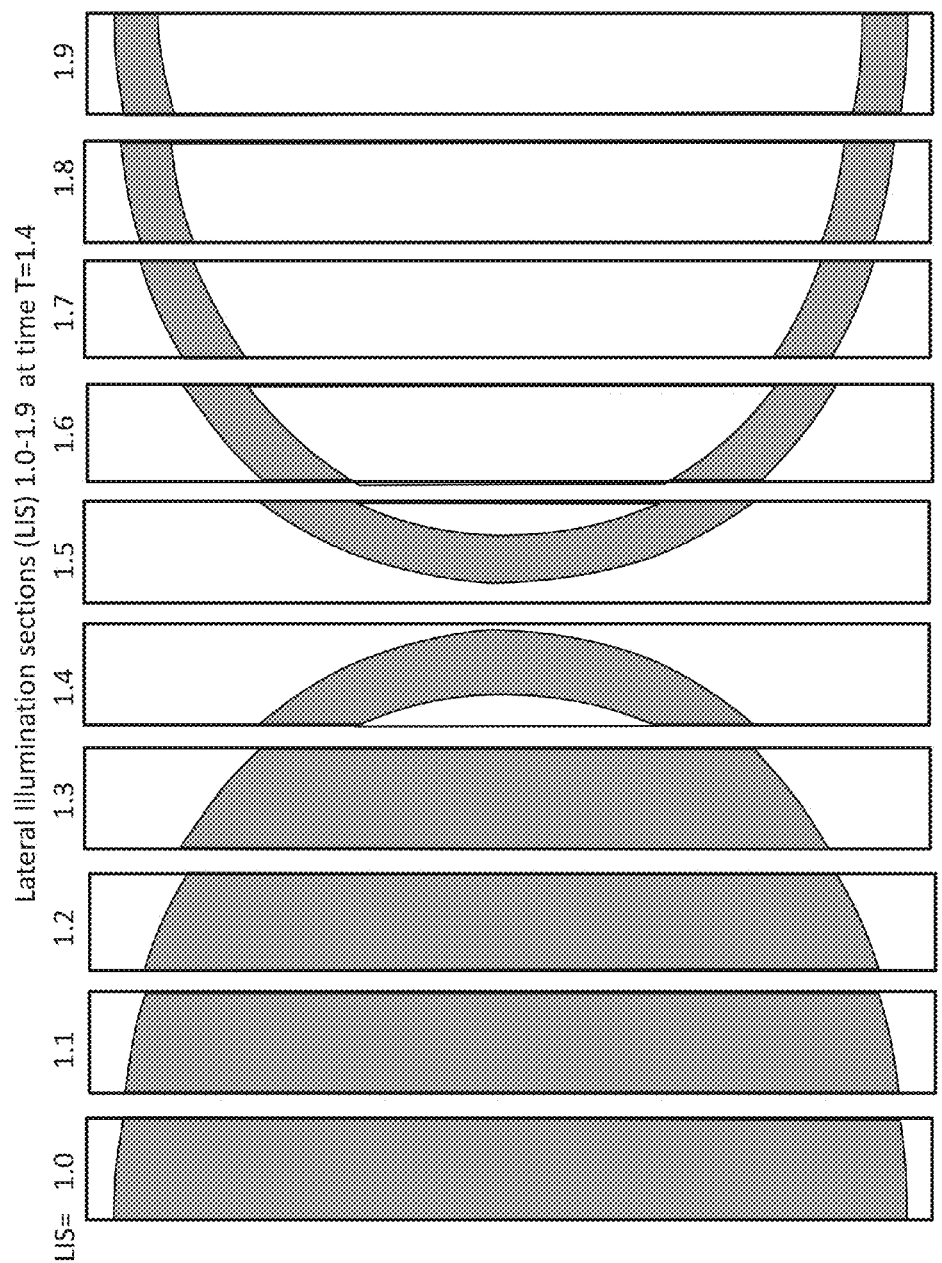

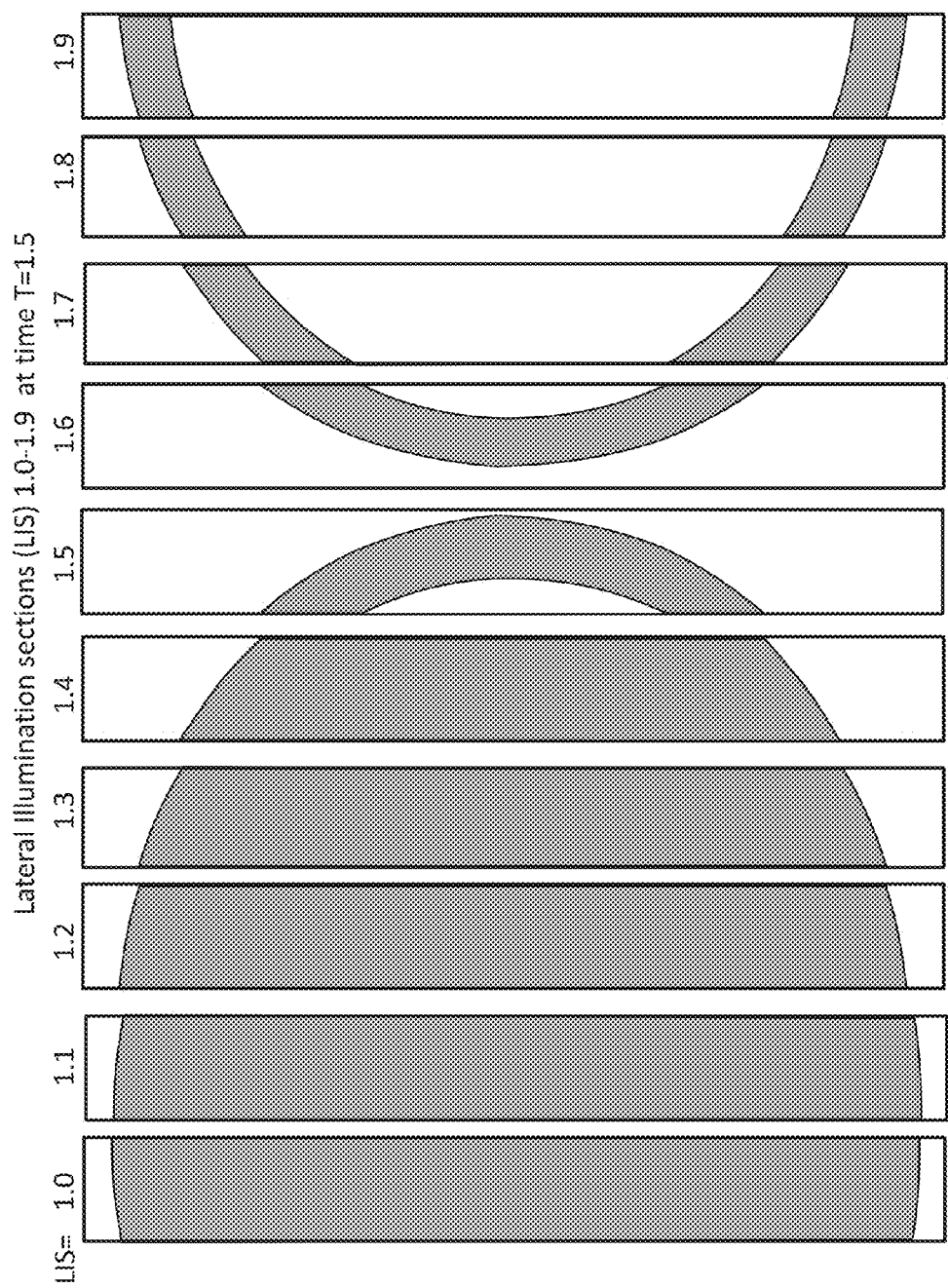

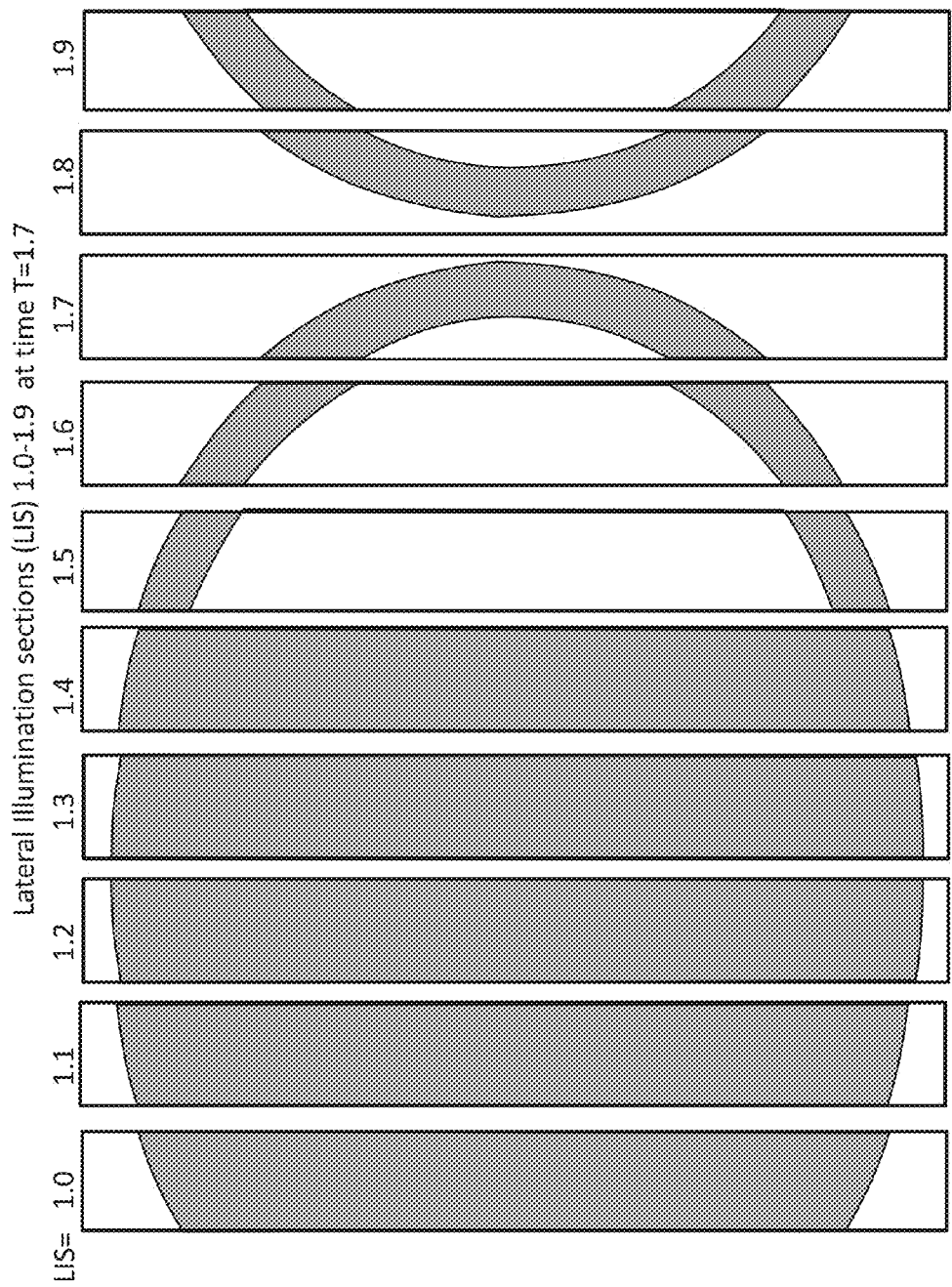

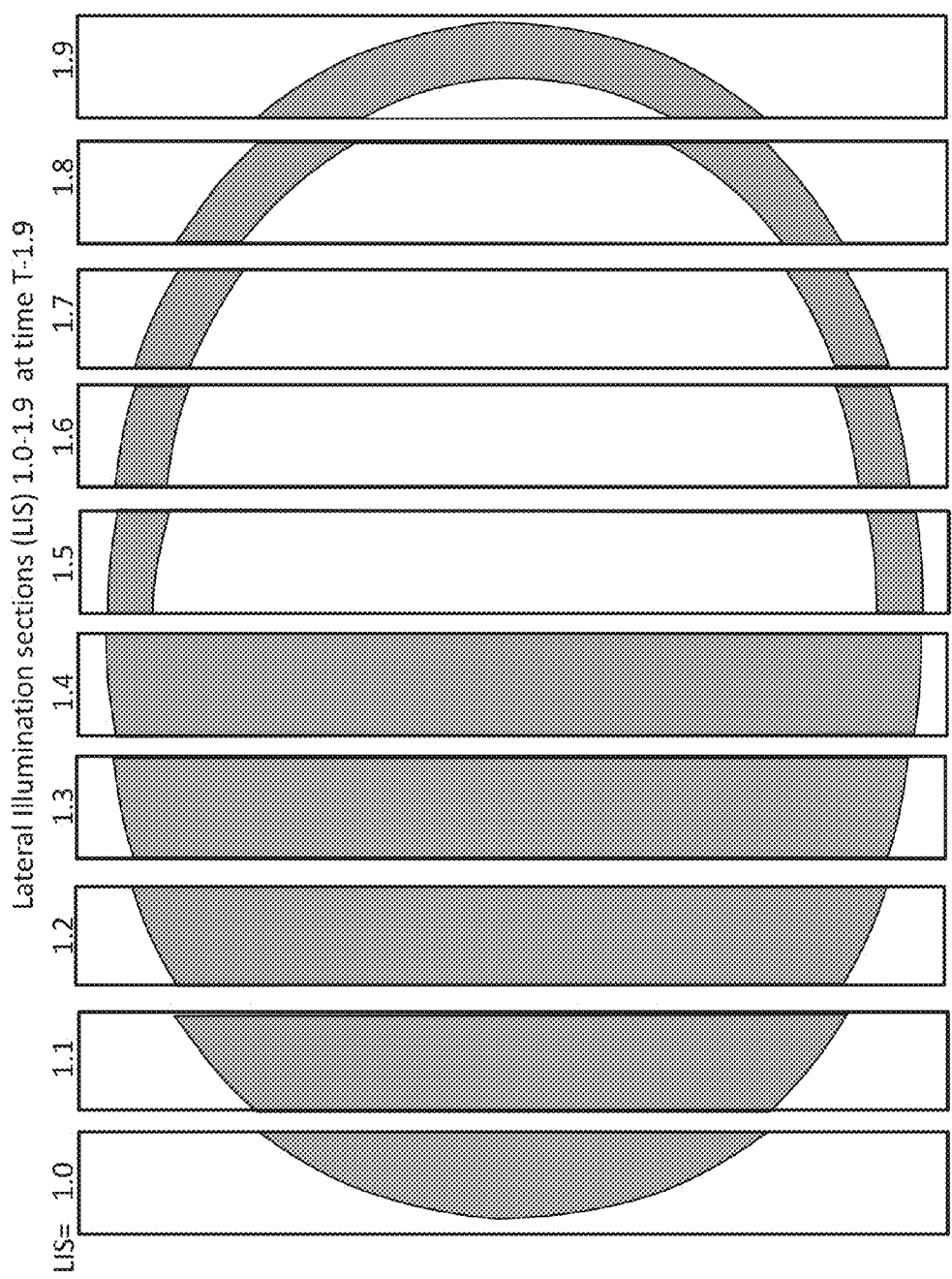

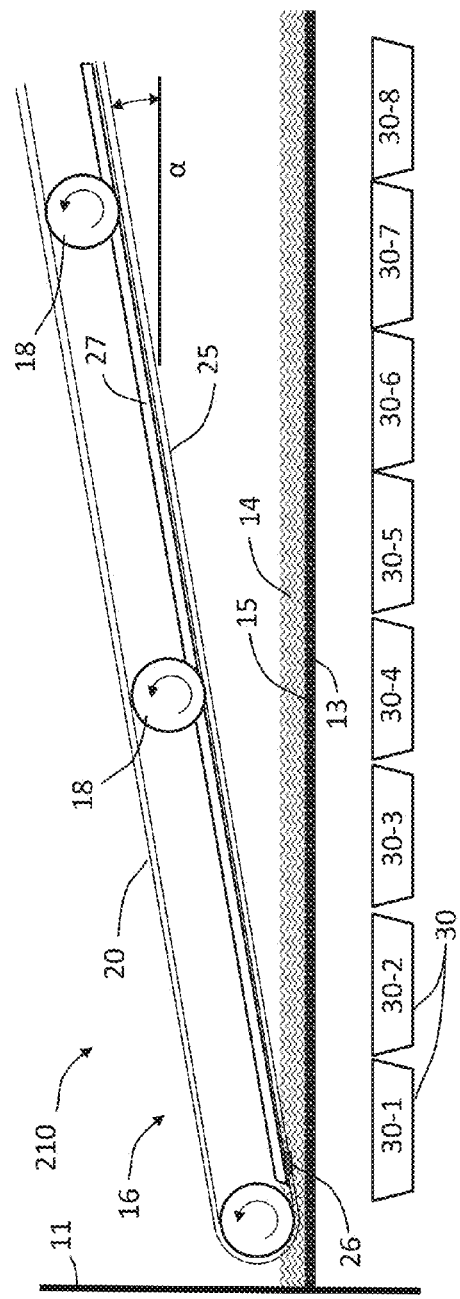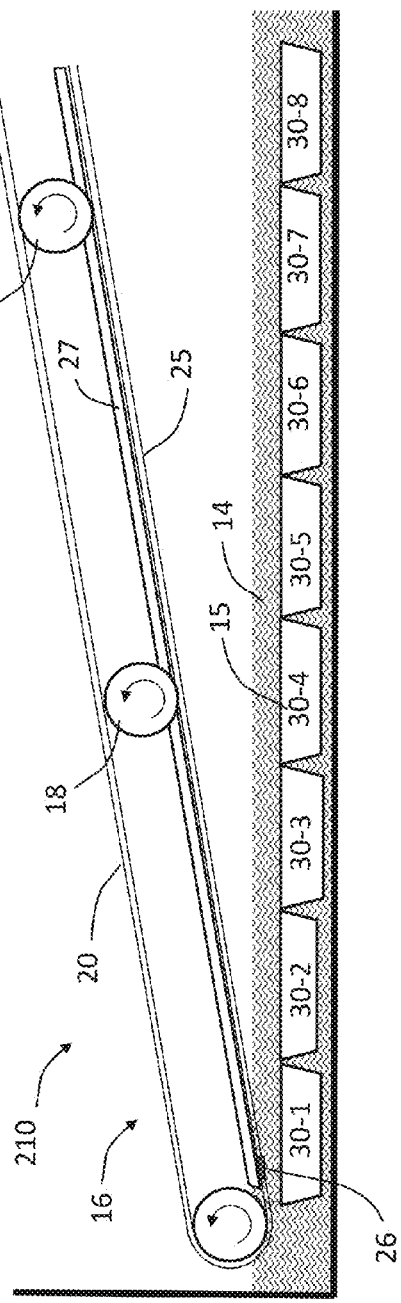

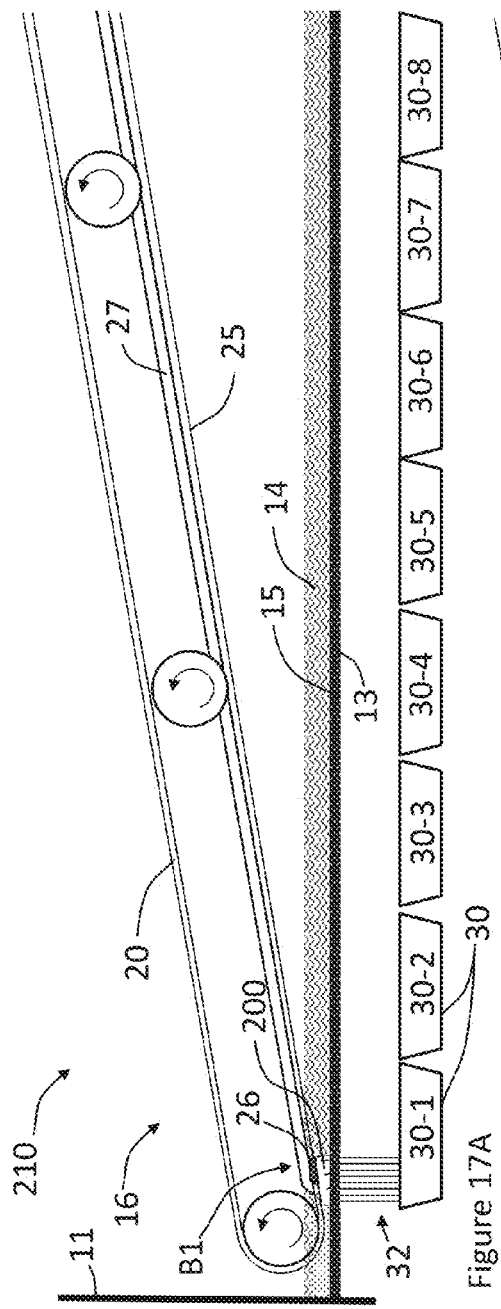
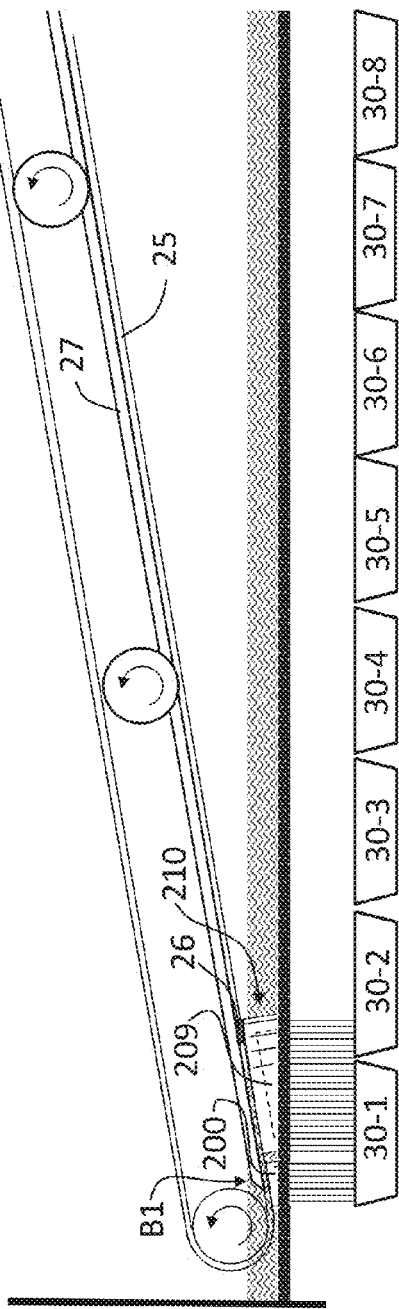
Figure 17A
Figure 17B

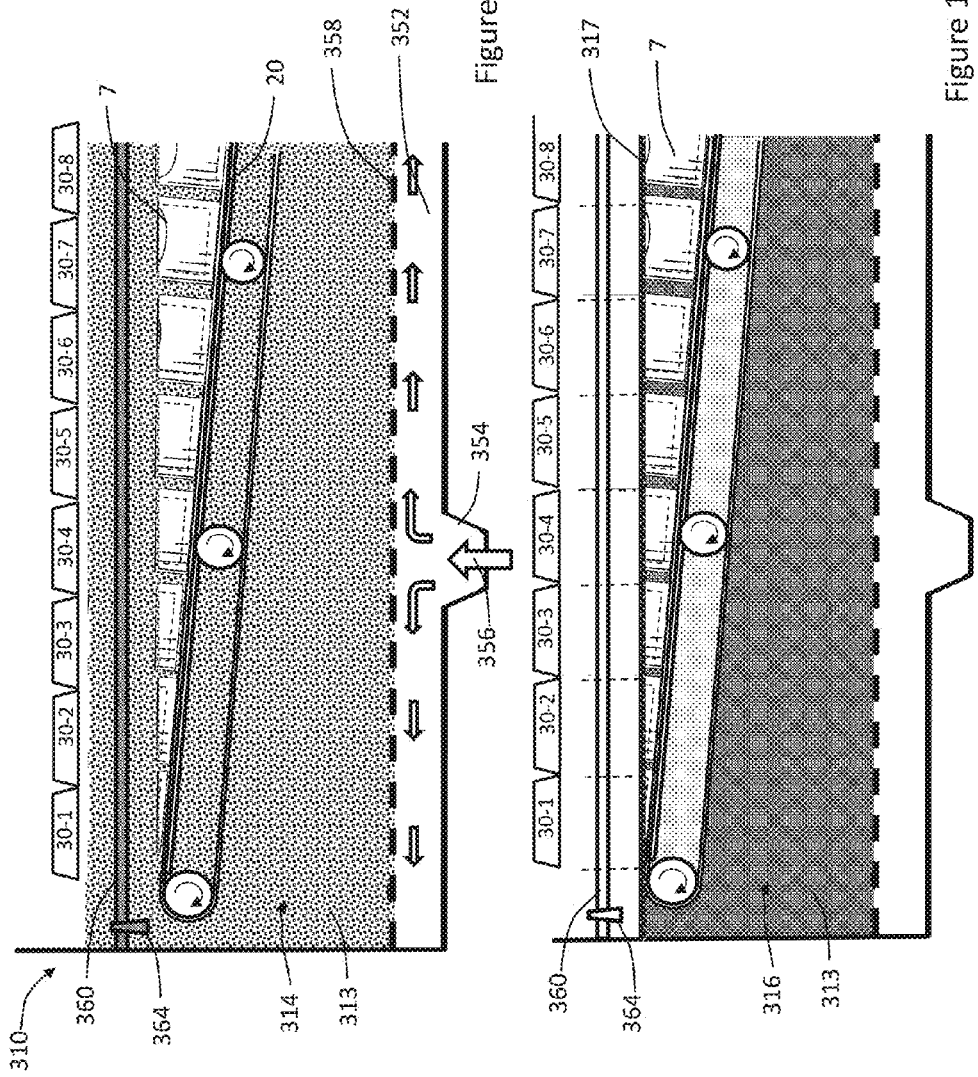

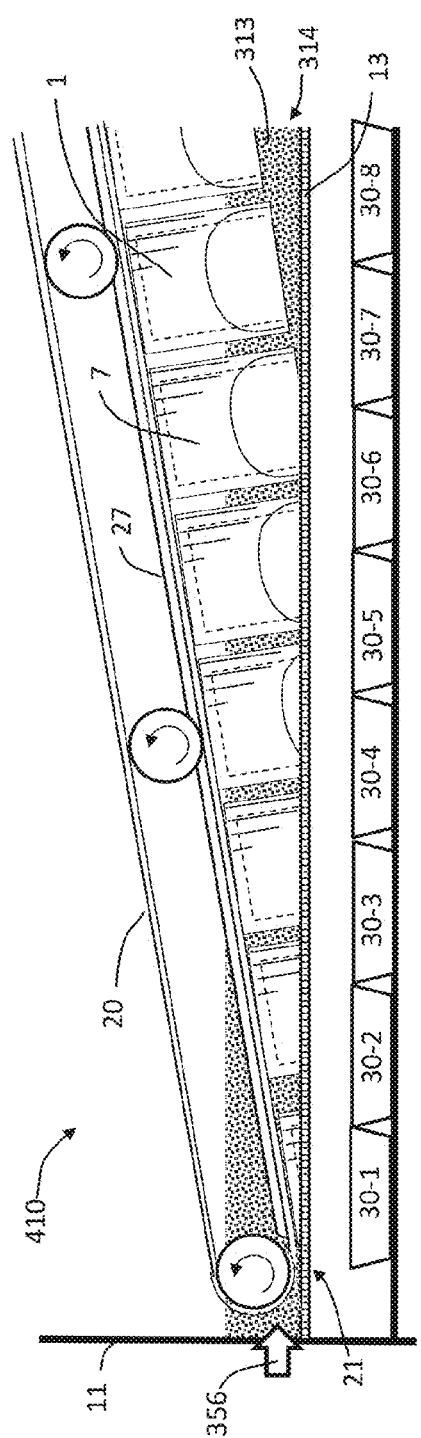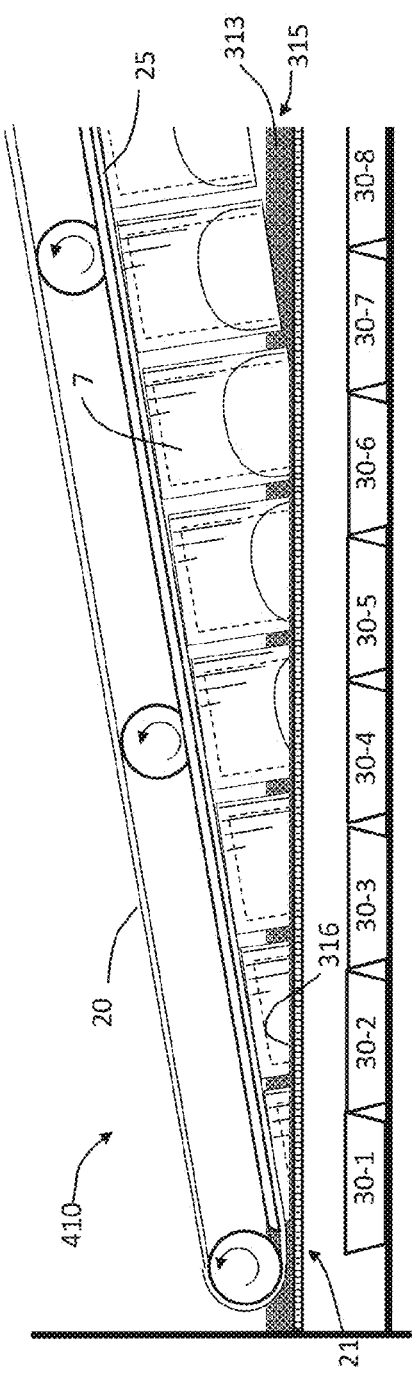
Figure 19A
Figure 19B

APPARATUS AND METHOD FOR FORMING 3D OBJECTS

CROSS-REFERENCE TO RELATED APPLICATIONS

This application is a continuation application of PCT International Application PCT/US2016/059687, filed Oct. 31, 2016, which claims the benefit of U.S. Provisional Application 62/248,927, filed Oct. 30, 2015 and U.S. Provisional Application 62/337,440, filed May 17, 2016, the disclosures of which are incorporated herein by reference in their entirety.

FIELD OF THE INVENTION

This invention relates generally to a three-dimensional build printer or additive manufacturing apparatus and method.

BACKGROUND OF THE INVENTION

Three-dimensional (3D) printers use an additive manufacturing process consisting of laying down successive layers of a material to build a three-dimensional solid object from a digital model. Three-dimensional printers can be used for rapid prototyping, small production runs, custom fabrication, and various other uses in such applications as biotechnology, aerospace, automotive, medical, engineering, information systems, education, clothing, military, industrial, and others.

As 3D printers have developed over time, several different technologies have emerged that employ additive processing, including but not limited to extrusion of thermoplastic filaments through a heated nozzle, stereolithographic polymerization of monomeric liquids or fusable or agglomerable powders, inkjet head printing, and selective heat or laser sintering.

Stereolithography is a method for automatically building complex 3D parts by successively solidifying thin cross-sectional layers. These layers may be composed of photopolymer resin, powdered materials or the like. Some types of powder materials are converted from a fluid-like medium to a cohesive cross-section by melting and solidification. The layers are solidified on top of each other consecutively until all of the thin layers are joined together to form a completed object. This method of fabrication is extremely powerful for quickly reducing design ideas to physical form for making prototypes. A stereolithography apparatus generally includes a radiation or light source, a scanner, a container of polymerizable build material, a build surface, an elevator, and a controlling computer. Other apparatuses and methods for forming 3D objects using stereolithography are shown and described in U.S. Pat. Nos. 4,575,330; 4,752,498; 4,801,477; 5,122,441; 5,182,055; 5,609,813; 5,779,967; 5,885,511; 6,036,911; 6,492,651; 8,182,882; 8,318,055; 9,205,601; 9,211,678; and 9,216,546; as well as U.S. Patent Publication 2016/0046075, the disclosures of which are incorporated by reference in their entireties.

The common theme among all of the cited patents and publications and across all of the 3D printing applications is that the build surface upon which the 3D objects are formed is horizontal. A horizontal build surface is convenient to engineer and simplifies some printing designs and applications, but it also creates several issues that have yet to be overcome.

To facilitate an additive process that utilizes a horizontal build surface, several components, often including the build surface itself, must necessarily include a means for adjusting their vertical positions along the z-axis as the printing method progresses from layer to layer. Requiring vertical adjustability dramatically increases the complexity, precision, and care that must be undertaken in the design and use of the 3D printer. It also increases the time to form each 3D object, especially with printing applications where the building material must settle after each height adjustment in order to print the next layer.

Similarly, horizontal build surfaces which are stationary in the x- or y-axis relative to the plane of the build surface severely limit for high-throughput applications because they require a high degree of user supervision or intervention. For some uses, such as modeling, prototyping, or printing biological objects, a high-throughput device is not necessary. However, present 3D printers are generally not up to the task for large-scale production runs that require a multiplicity of 3D objects to be built with high fidelity in a short period of time. Even where a particular printer can build a set of objects at once, all of the objects must be completely formed and processed before production of a new set can begin. Present 3D printing systems that attempt to address this problem are inadequate, unfeasible on a large scale, or both.

PCT Patent Publication WO2015/056230 attempts to solve the high-throughput problem by creating a carousel system. However, the carousel system requires a plurality of trays with horizontal build surfaces, printing heads, and processing stations through which newly-formed objects must pass hundreds or thousands of times before they are completed. Furthermore, the entire carousel must shift vertically along the z-axis in order to build the next layer on each object, but only after the same layer has been formed for every object on the carousel. Thus, every object being built at any given time must be at the same (layer-by-layer) stage in the production process, and the entire set of objects must be completely printed before a new set can begin. Consequently, building 3D objects using a carousel is not a true high-throughput system that allows objects to be printed successively, one object after another.

U.S. Pat. Nos. 8,226,395; 8,282,380; and 8,287,794 utilize a conveyor belt to provide a continuous buildable surface upon which to produce 3D objects. However, because the build surface on the conveyor belt is nonetheless horizontal, it is still subject to the same pitfalls as all other horizontal build surfaces discussed above. Furthermore, by demonstrating by example only a single build method, extrusion of a thermoplastic filament, the disclosures do not adequately address how to utilize a horizontal conveyor belt system in stereolithographic applications where the vertical position of the 3D object must change in order to position the layer being built at the surface of a polymerizable liquid or fusable or agglomerable powder.

Consequently, there is a need for machines that can successfully and accurately accommodate high-throughput applications for all types of additive processing techniques to continually produce 3D objects with minimal user supervision and intervention.

SUMMARY OF THE INVENTION

<Generalized Apparatus and Method>

The invention provides a three-dimensional (3D) printer configured to continuously build 3D objects, and a continuous process for making 3D objects. The apparatus and the method using the apparatus facilitates building objects with a high-throughput by moving an object being built upward or downward along an angled pathway, continuously and/or incrementally, and adding or building an additional layer of build material onto the object at a plurality of incremental positions or stages along the angled pathway.

The invention also provides a printer apparatus for printing a three-dimensional (3D) object, and a method employing the apparatus, the apparatus including an elongated container for containing build fluid having an upper surface; a build platform having a top-side build surface, a means for continuous conveying the build platform along the elongated container and descending down into the build fluid; and a matrix of light emitting elements disposed above the elongated container, for emitting a predetermined pattern of a reactive light toward the continuously conveyed build surface and at the upper surface of the build fluid, the reactive light being effective for polymerizing or agglomerating a portion of the upper surface of the build fluid into a build material, and the predetermined pattern of the reactive light forming a build layer having a build pattern comprising the build material. The apparatus can also include a computer with programming to selectively control the movement of the build platform and the pattern of light emitted from the matrix of light emitters at and along the upper surface of the build fluid.

The invention also provides an apparatus including an elongated container for containing a build fluid, a build platform having an underside build surface, a means for continuous conveying the build platform along the elongated container and ascending up through the build fluid; and a matrix of light emitting elements for emitting a predetermined pattern of a reactive light at the lower build surface, the reactive light being effective for polymerizing or agglomerating a portion of the build fluid adjacent the lower build surface and the build surface of the object into a build material, and the predetermined pattern of the reactive light forming a build layer having a build pattern comprising the build material. The apparatus can also include a computer with programming to control selectively the movement of the build platform and the pattern of light emitted from the matrix of light emitters.

In an embodiment of the invention, the build fluid can include a solution comprising a monomer that can be polymerized by a reactant, including energy from light waves. In a further embodiment, the monomer that can be polymerized with ultraviolet (UV) light waves.

The build fluid can also include a fusable or agglomerable powder comprising a compound or element that can be fused or agglomerated into solid, stable structure. In a further embodiment, the fusable or agglomerable compound or element comprises a metal element or metal alloy. In an even further embodiment, the agglomerable compound or element can be sintered or melted and/or agglomerated with laser light waves.

<Descending-Solution Apparatus and Method>

In an embodiment of the invention, an upper or upward-facing surface of a build platform moves continuously along a path entering and descending through a build fluid that comprises a monomer solution. A 3D object is formed upon the upper surface of the build platform, and is built vertically up by depositing a surface layer of the monomer solution onto an upper surface of the 3D object as it descends along the path, followed by exposing the surface layer of the monomer solution to a curing agent or reaction agent, resulting in polymerizing or agglomerating the monomer into the build material. In one embodiment of the invention, the degree of polymerization of the monomer is at least sufficient to form a resilient, three-dimensional structure that that has dimensional stability and rigidity sufficient to maintain the orientation and dimensions of the built object during ordinary and customary build conditions, As the build platform continuously descends into and along the monomer solution, successive layers of monomer solution are deposited and polymerized over the previously built layers, until the 3D object is completed. The completed 3D object then can release from build platform and be collected.

<Ascending-Solution Apparatus and Method>

In another embodiment of the invention, a lower or downward-facing surface of a build platform moves continuously along a path from within and ascending upward (and out of) a build fluid that comprises a monomer solution. A 3D object is formed upon the lower surface of the build platform, and is built vertically downward by exposing an underside layer of the monomer solution adjacent the build surface of the object to a curing agent or reaction agent, resulting in polymerizing or agglomerating the monomer into the build material. As the build platform continuously ascends up through the monomer solution and along the container, successive layers of monomer solution are polymerized to the undersurface of the previously built layers, until the 3D object is completed. The completed 3D object then can release from build platform and be collected. The curing agent or reaction agent can include a reactive light, emitted in a predetermined pattern upwardly toward the undersurface of the build layers. The reactive light emitters can be positioned beneath a light-transmissive bottom of the elongated container. Alternatively, the reactive light emitters can be positioned within the monomer solution.

<Common Conditions and Elements>

In another embodiment of the invention, the build platform is a continuous flat belt that that is drawn through the build materials, such as by a belt conveyor assembly.

In further embodiment of the invention, a series of identical or different parts can be formed along the belt, each exposed to a pattern of the curing agent specific to each 3D object.

In an alternative embodiment of the invention, the build platform is a horizontal surface associated with a segment or sled that is positioned on an angled track which is configured to permit the build platform to either descend into or ascend out of the build material during printing. In a further embodiment, the 3D printer can include two or more sleds, each of which is associated with its own build platform.

In another embodiment of the invention, the 3D printer can be configured to facilitate high-throughput printing of 3D objects, in which multiple objects can be successively and continuously printed one after another. High-throughput printing can be facilitated by printing at multiple positions along a continuous flat belt or along two or more sleds positioned on an angled track.

In a further embodiment of the invention, the printer can be configured so that when multiple 3D objects are printed simultaneously, each 3D object is at a different (layer-by-layer) stage in the printing process at successive positions along the build platform or on adjacent sleds.

In another embodiment of the invention, the build material is a thermoplastic monomer, and the curing agent or reaction agent is a light wave, and can include UV light, for effecting polymerization of the thermoplastic monomer.

In another embodiment of the invention, a partially polymerized built object formed after the completion of the build process can be more fully or completely cured to fully polymerize the partially polymerized resin and any remaining monomer in the built object.

In another embodiment of the invention, the UV light emitters can include UV light emitting diodes (LEDs), UV laser light, or elements of a high-resolution digital light projector (DLP).

In an alternative embodiment of the invention, the light emitter units can include a plurality or matrix of light emitting elements, and can include a lateral rows of UV light emitting elements, including groups of rows of UV light emitting elements, emitting independently a varying lateral pattern of UV light over a period or term of time, to form a build layer of the 3D object.

In another embodiment of the invention, the build platform comprises a continuous conveying belt. The conveying belt can be moved at a constant velocity, descending (and ascending) along a slope or slanted pathway within the build fluid, or can be moved in steps or stages, stopping at a predetermined position for a period of time before moving to the next step or stage.

In another embodiment of the invention, the 3D object can be made using a build software program and a data file comprising a series of planar layers created by a 3D object slicing program. In one embodiment of the invention, the planar layers or slices can be taken through the 3D object in planes that are parallel with a horizontal base of the 3D object; for example, on a flat base surface on which the 3D object can stand. In another embodiment of the invention, the planar layers or slices through the 3D object can be taken through horizontal planes through the 3D object in a tilted pose, as it will be built on the slant of the a conveyor belt conveyor.

In another embodiment of the invention, oxidation by the atmosphere of an oxidation-sensitive monomer at the surface of the monitor solution can be inhibited or prevented by placing an oxidation barrier onto or above the surface of the monomer solution or material. In one embodiment, a salt water solution can be disposed or floated above a monomer solution to suppress oxidation. The salt water solution can also stabilize the upper meniscus of the monomer solution to improve the contrast and quality of the formed material. In another embodiment of the invention, an air space above the surface of the monomer solution can be a blanket of an inert gas, such as argon or nitrogen, or a gas space absent oxygen.

In another embodiment of the invention, the monomer solution includes a thermoplastic monomer, a catalyst or activator for polymerizing the monomer into a polymerized build material to form the 3D object, and an inhibiting agent that prevents the polymerization. The matrix of light emitters includes a matrix of UV light emitters positioned above a length of the surface of the monomer solution. The emission of the UV light at the surface of the monomer solution degrades the inhibiting agent, thus allowing the polymerization of the monomer by the activator to proceed. The intensity and duration of the UV light emission at portions of the surface of the monomer solution can be selected and controlled to polymerize the monomers in the solution to a predefined depth.

In a first embodiment, a conveyor belt moves along a slanted path under a matrix of a plurality of UV light emitters, the conveyor belt moving through a series of stops or stages. At each stage, a layer of the 3D object is built parallel to the surface of the monomer solution, and therefore angled relative to the slope angle of the conveyor belt. In this embodiment, the planar layers or slices through the 3D object have been taken through horizontal planes through the 3D object as it will be built on the slope of the belt conveyor, as shown in FIGS. 4 and 5. At each stop or stage, a horizontal layer of the monomer solution is deposited and polymerized to build the corresponding build layer of the 3D object. Upon arriving at a stop or stage of the conveyor belt along the slanted path, the upper surface of the most-recently built layer of the 3D object is submerged below the surface of the monomer liquid by a predetermined depth. The plurality of UV light emitters above the "under-construction" 3D object are instructed by programming to emit independently in a light pattern onto the solution surface to result in polymerizing the monomer through the depth of the monomer solution along each pathway of the light emissions in a pattern corresponding to the build layer of the 3D object. The intensity and duration of the UV light emission is sufficient to polymerize the monomer within the deposited depth of the monomer solution. Each layer or slice of the 3D object is built as the belt continuously descends along the slanted pathway and stops at each stop or stage for curing by the UV light. After the last layer is built, the 3D object can fall off the end of the belt and be collected from the bottom of the solution container.

In an alternative embodiment, the planar layers or slices through the 3D object have been taken through the 3D object tilted at the angle on which it will be built, shown in FIGS. 5 and 6B. A pattern of UV light for polymerizing the monomer corresponds directly to a horizontal slice through the tilted 3D object.

<Slicing of the Object>

In an embodiment of the invention, the planar layers or slices through the 3D object have been taken through horizontal planes through the 3D object parallel with a horizontal base of the 3D object in a natural resting position, as shown in FIGS. 2 and 3. A first group of UV light emitters polymerizes a first layer of build material directly onto the surface of the belt conveyor. A second group of UV light emitters disposed adjacent and parallel to, and just downstream (in the first of conveyor belt movement) from, the first row of UV light emitters, polymerizes a second layer of build material directly onto the first layer of build material formed by the first row. A third group of UV light emitters disposed adjacent and parallel to, and just downstream from, the second row of UV light emitters, polymerizes a third layer of build material directly onto the second layer of build material formed by the second row. And so forth. An apparatus and method having Z rows of UV light emitters along the length of the conveying belt can build a 3D object having Z build layers or slices.

In an embodiment of the invention, the apparatus includes a means for depositing the monomer solution in a uniform plane having predefined depth on top of the last build layer of the 3D object. Such means can include a roller, a level blade or wire, or a controlled meniscus of the monomer solution.

In another embodiment, the slicing software can calculate transitions between one vertical sections of a layer to the next vertical section, and can program the lateral rows of UV emitting elements to match the transition, thereby improving the smoothing of the object and its resolution.

BRIEF DESCRIPTION OF THE DRAWINGS

FIG. 3A shows an elevation view of the object of FIG. 2 with grid lines showing horizontal build layers and vertical sections.

FIG. 3B shows a plan section view of the object of FIG. 2 taken through line 3B-3B, with lateral build sections.

FIG. 6A shows an elevation view of the object of FIG. 3 with grid lines showing horizontal build layers and vertical sections.

FIGS. 9A through 9G show the incremental building of initial layers of lateral sections of a first 3D object below a first group of illuminating elements.

FIGS. 10A through 10J show a pattern of light emitted by a first group illuminating elements for the respective lateral illumination sections of the first 3D object, at each of the time intervals of movement of the continuous build surface under the first group of illuminating elements.

FIGS. 12A through 12E show the incremental building of successive layers of lateral sections of the first 3D object, and the initial layers of lateral sections of a second 3D object, below first and second groups of illuminating elements.

FIG. 16A shows an elevation view of an alternative apparatus for building a 3D object on a continuous build surface that ascends along and up from a pool of polymerizable monomer solution within a container, with illuminating elements that emit light up through a transparent bottom of the apparatus.

FIG. 16B shows an elevation view of an alternative apparatus for building a 3D object on a continuous build surface that ascends along and up from a pool of polymerizable monomer solution within a container, with illuminating elements disposed within the monomer solution.

FIGS. 17A through 17D show the apparatus of FIG. 16A in use for building 3D objects.

FIG. 18A shows an elevation view of an apparatus for building a 3D object on a continuous build surface that descends along and down into a container filled with a fluidizable powder, in the state of fluidization with a fluidizing gas.

FIG. 18B shows the elevation view of the apparatus of FIG. 18A with a layer of the powder deposited over the 3D objects during building.

FIG. 19A an elevation view of an apparatus for building a 3D object on a continuous build surface that ascends along and up through a fluidizable powder, in the state of fluidization with a fluidizing gas.

FIG. 19B shows the elevation view of the apparatus of FIG. 19A with a layer of the powder disposed between the 3D object during building and a transparent bottom of the apparatus through which a fusing or agglomerating light is emitted.

DETAILED DESCRIPTION OF THE INVENTION

Figure 2:
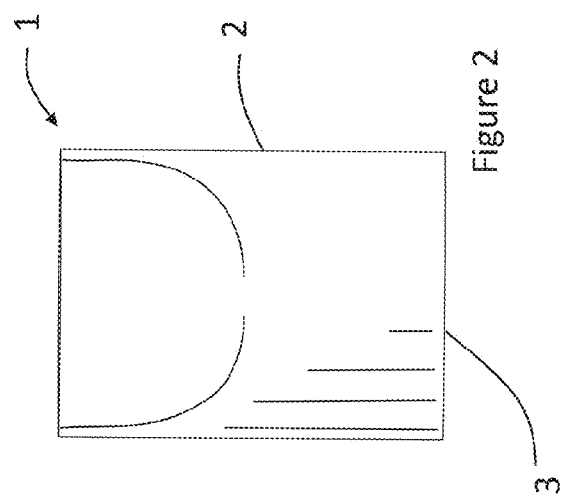
FIGS. 1 and 2 show a perspective view and an elevation view of a 3D object for building on a 3D printer apparatus.

The present disclosure includes printer apparatuses for printing a three-dimensional (3D) object, particularly by continuously conveying a build platform along the length of an elongated container and either descending down into or ascending up from a contained build fluid. The printing apparatuses described herein have several advantages over conventional printing apparatuses to print 3D objects. Other present 3D-printing methods require a substantially horizontal build platform upon which to build the 3D object through an additive manufacturing process. While horizontal build platforms are convenient to manufacture and incorporate into the design of printing apparatuses, the trade-off is that several other components, including the build platform itself, require the capability to adjust their vertical positions along the z-axis in order to successively print a new layer onto the emerging 3D object. This situation increases the amount of time required to print a desired 3D object and thus limits the amount of 3D objects that can be printed at a time to the number of objects that can fit on a build platform.

In typical 3D printing applications in which a resin, powder, or particulate is utilized as the build material, the build platform is adjustable vertically along the z-axis, but does not or cannot translate laterally in the x- or y-axis as the printing method progresses. Consequently, these horizontal build platforms are inadequate for continuous, high-throughput assembly of 3D objects because every object on the build platform must necessarily be at the same stage in the building process. Thus, each object in a batch must be completely printed and processed before printing of a new batch can begin.

In contrast, the build platforms in the printing apparatuses described in the present invention permit the forming 3D object to descend down into or ascend out of a build fluid without requiring additional components to have z-axis adjustability. This can be accomplished by conveying the build platform along an angled conveyor system so that the forming 3D object is adjusted vertically along the z-axis and is translated horizontally in the x- or y-axis after each layer is printed. In some embodiments of the invention, the conveyor system is a continuous flat belt that operates as a build platform upon which one or more 3D objects can be built directly.

In another embodiment of the invention, the conveyor system can comprise a series of planar segments that are linked in series to form a continuous build conveyor. Each planar segment includes a build surface, and a means for connecting the planar segments to each of a leading planar segment and a trailing planar segment. The build surface comprises an elongated length and width. Each of the planar segments can include one or more pivot elements along the leading and trailing edges of the planar segments, for connecting the plurality of planar segments with pivot joints.

In another embodiment of the invention, the conveyor system can comprise a series of platforms or segments that are connected in series along and to a continuous conveyor to form a continuous build conveyor. Each platform or segment provides a separate build surface for a 3D object, and comprises a body having a planar build surface of elongated length and width, and one or more fasteners to connect the body to a continuous conveyor. The conveyor can include a series of chassis segments to which the fasteners connect the build platforms. The fastener can comprise a fixed and rigid fastening of the platform to the body, or a flexible or movable fastening, such as a pivot and/or sliding fastener. A requirement of the fastener is that the build surface of the platform remain in the same orientation and angle during the many build stages of the 3D object. In one embodiment, the chassis can comprise wheels or rollers for rolling the chassis along one or a pair of conveyor tracks or rails. In another embodiment, the chassis can comprise a series of links that are conveyed along a path by rollers or sprockets.

In another embodiment of the invention, the series of platforms or segments comprise a series of selectively removable segments or sleds that provide separate build surfaces for 3D objects, each sled comprising a body having a planar build surface of elongated length and width, and one or more means for selectively and removably connecting the sled to a continuous conveyor. The sled and conveyor also provide a positioning means for consistently positioning the sled onto the continuous conveyor in a preselected orientation and angle. In one embodiment, the removable sled is configured to attach to the conveyor with the plane of the planar build surface oriented in the plane of movement of sled. In another embodiment, the removable sled is configured to attach to the conveyor with the plane of the planar build surface oriented in a first plane, with the movement of the sled along the conveyor in an angle to the first plane. The first plane can include a horizontal plane.

As a result, continuously conveying the build platform (and the forming 3D objects) at an angle can facilitate continuous high-throughput manufacturing applications. The 3D printing apparatuses of the present invention can be configured so that 3D objects can be built successively, one after another, so multiple objects can be at different stages of the build process on the same build platform, without affecting the formation of any other object being printed at the same time. In contrast, present 3D printing processes require that the same layer must be printed on all objects in a production batch before moving to the next layer, and that all objects in the batch are finished printing before moving on to a new batch. Consequently, the present invention greatly reduces the level of user supervision or intervention, as well as the time required, to produce large batches of 3D-printed objects.

In the broadest sense, additive manufacturing processes, also colloquially known as 3D printing processes, involve laying down successive layers of a material in thin, fused cross-sectional layer until the 3D object is built. The present invention departs from this traditional practice by instead laying down cross-sectional layers that are defined by the angle between the build platform and the surface of the build fluid. The finished 3D objects can comprise nearly any shape or geometry that the user desires, including negative spaces, support structures, or internally-hollowed out regions, defined by a 3D-printable model. 3D printable models are most commonly created with computer-aided design (CAD) or computer aided manufacturing (CAM) techniques, but can also encompass other methods such as 3D scanners or photogrammetry software, or any other method known to those having skill in the art.

The printing apparatuses according to the present invention can include features to implement process controls, including feedback and feed-forward control to, for example, enhance the speed and/or reliability of printing methods carried out by the apparatuses. A controller for use in carrying out the present invention may be implemented as hardware circuitry, software, or any combination thereof.

In some embodiments, the controller is a general purpose computer that runs software that is operatively associated with monitors, drives, pumps, and other components through suitable interface hardware and/or software. The general purpose computer may additionally be used to implement and execute parameters associated with the printing process, including defining a radiation pattern to fit the 3D-printable model, as projected by a pattern generator such as a digital light projector (DLP) system, as discussed below. Suitable software for the control of the apparatuses according to the present invention includes, but is not limited to, the ReplicatorG open source 3D printing program; 3DPrint™ collector software from 3D systems; Slic3r; Skeinforge; KISSlicer; Repetier-Host; PrintRub; Cura; etc., including combinations thereof.

Parameters that can be directly or indirectly monitored by the computer during printing include, but are not related to, radiation intensity, temperature, pressure, volume of the build fluid, conveyance speed of the object along the build platform, and force exerted on the build plate. Parameters that can be used by the computer for feedback control include, but are not limited to, the expected consumption of build fluid in relation to the known geometry and volume of the object being built, and the degradation temperature of the polymer being formed on the build fluid. The computer may similarly control indirectly or directly continuously or stepwise, in a response to a known or observed parameter, conditions including but not limited to, rate of supply of the build fluid, temperature, pressure, rate of speed of advance of the build platform, and the intensity and duration of radiation.

In applications that utilize a radiation source to polymerize or harden the build fluid on any given layer, the intensity of the radiation source may be monitored with a photodetector to detect a decrease of intensity. If detected, the computer can adjust other parameters to account for the loss of intensity, including but not limited to: increasing the temperature, decreasing the speed of advance of the build platform, increasing power to the light source, etc.

<Stereolithography>

Described first in the 1980's, stereolithography is an additive manufacturing process for making solid objects by successively printing thin layers of a curable material, one on top of the other. Traditionally, a programmed movable spot beam of ultraviolet (UV) light shining on a surface or layer of a polymerizable liquid is used to form a solid cross-section of the 3D object at the surface of the liquid. However, curable liquid may also be excited by other methods known in the art, including particle bombardment with an electron beam, chemical reactions with materials sprayed through a mask or inkjet, or impinging radiation at a wavelength other than UV. The object is then moved, in a programmed manner, away from the liquid surface by the thickness of one later, and the next cross-section is then formed and adhered to the immediately preceding layer defining the object. The process is continued until the object is formed.

Any suitable polymerizable liquid can be used to enable the present invention. The polymerizable liquid can include a monomer, particularly photo-polymerizable and/or free radical polymerizable monomers, and suitable initiators such as free radical initiators, and combinations thereof. Ideally, a polymerizable liquid should possess several properties to be viable option for polymerizing under UV light. The liquid must: (A) cure fast enough with the available UV light source to allow practical object formation times; (B) adhere to successive layers as they are formed; (C) have a low enough viscosity so fresh liquid material quickly flows across the surface once the object is moved to accommodate a new layer; (D) absorb UV light so the layer formed will be reasonably thin; (E) be reasonably soluble in a solvent in the liquid state, yet reasonably insoluble in the solid state to permit washing of uncured material from the formed object; and (F) be as non-toxic and non-irritating as possible. Polymerizable liquids may also be selected for their desirable features in the solid state, including but not limited to: color, texture, strength, conductive or insulating electrical properties, flammability, and flexibility. Examples of compounds that are suitable polymerizable liquids include but are not limited to: acrylics; methacrylics; acrylamides; styrenes; styrenic block copolymers; olefins; halogenated olefins; cyclic alkenes; maleic anhydride; alkenes; alkynes; carbon monoxide; functionalized oligomers; multifunctional cute site monomers; and functionalized polyethylene glycols, separately or in combinations thereof. Examples of polymerizable liquids, resins, monomers, and initiators are discussed in U.S. Pat. Nos. 7,649,029; 7,767,728; 7,935,476; 8,119,214; 8,232,043, the disclosures of which are incorporated by reference in their entireties, as well as published applications WO 2012129968; CN 102715751; and JP 20122100408.

In some embodiments, the polymerizable liquid contains an acid-catalyzed or cationically-catalyzed polymerizable liquid. In such embodiments, the polymerizable liquid comprises monomers that contain groups suitable for acid catalysis, such as epoxide groups and vinyl ether groups. Non-limiting examples of suitable monomers include: olefins such as methoxyethene, 4-methoxystyrene, styrene, 2-methylprop-1-ene, 1,3-butadiene, and heterocyclic monomers (including lactones, lactams, and cyclic amines) such as oxirane, thietane, tetrahydrofuran, oxazoline, 1,3-dioxepane, oxetan-2-one, etc., including combinations thereof. A suitable (generally ionic or non-ionic) photoacid generator may additionally be included in the acid-catalyzed polymerizable liquid, examples of which include, but are not limited to: onium salts, sulfonium and iodium salts, etc., such as diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, etc., including mixtures thereof. Photoacid generators are discussed in U.S. Pat. Nos. 5,017,461; 5,374,500; 6,692,891; 7,534,844; 7,550,246; and 7,824,839, the disclosures of which are incorporated by reference in their entireties.

In other embodiments, suitable polymerizable liquids can include photocurable hydrogels like polyethylene glycols (PEG) and gelatins. PEG hydrogels have been used to deliver a variety of biological compounds and structures. Conditions to maximize release of biological compounds from photopolymerized PEG diacrylate hydrogels can be enhanced by inclusion of affinity binding peptide sequences in the monomer resin solutions prior to photopolymerization, allowing for sustained delivery. Gelatin is a biopolymer frequently used in the food, cosmetic, pharmaceutical and photographic industries. It is obtained by thermal denaturation or chemical and physical degradation of collagen. There are three kinds of gelatin—including those found in animals, fish, and humans—and gelatin from the skin of cold water fish is considered safe for use in pharmaceutical applications. UV or visible light can be used to cross-link appropriately modified gelatins. Methods for cross-linking gelatins can include cure derivatives from dyes such as Rose Bengal.

Photocurable silicone elastomers are an additional class of polymerizable liquids that can be used in applications including, but not limited to: optical instrumentation, medical and surgical equipment, exterior lighting and enclosures, electrical connectors and sensors, fiber optics and gaskets. Silicone rubbers that cure under UV light, such as Silopren™ UV LSR 2030 and 2060, or UV curing adhesives such as LOCTITE® 5056 Silicone Light Cure Adhesive Sealant, are also suitable photopolymerizable liquids.

Similarly, photocurable polyurethanes can also be used as polymerizable liquids with the present invention. U.S. Pat. No. 4,337,130, the disclosure of which is incorporated by reference in its entirety, discusses a photopolymerizable polyurethane composition comprising (1) a polyurethane based on an aliphatic diisocyanate, poly(hexamethylene isophthalate glycol) and, optionally, 1,4-butanediol; (2) a polyfunctional acrylic ester; (3) a photoinitiator; and (4) an anti-oxidant, which can be formulated so that it provides a hard, abrasion-resistant and stain resistant material.

The polymerizable liquid can also include a biodegradable resin. Biodegradable resins are useful for implantable devices for delivering drugs, or for temporary performance applications such as biodegradable screws and stents. The use of biodegradable polymerizable materials for use with production of stents is discussed in U.S. Pat. Nos. 6,932,930 and 7,919,162, the disclosures of which are incorporated by reference in their entireties. Biodegradable copolymers of lactic acid and glycolic acid (PLGA) can be dissolved in PEG dimethacrylate to yield a transparent polymerizable liquid suitable for stereolithographic applications. Polycaprolactone and PLGA oligomers can be functionalized with acrylic or methacrylic groups to be effective polymerizable compounds.

In other embodiments, high performance polymerizable materials can be used which may sometimes require additional heating to melt or reduce the viscosity of the compound in order to be functional for stereolithographic applications. Examples of such materials include, but are not limited to liquid crystalline polymers of esters, ester-imide, and ester-amide oligomers. High performance polymerizable compounds are discussed in U.S. Pat. Nos. 6,939,940 and 7,507,784, the disclosures of which are incorporated by reference in their entireties. Since such polymerizable materials are sometimes utilized as high-temperature thermosets, they may also further comprise suitable photoinitiators such as benzophenone, anthraquinone, and fluoroenone initiators (including derivatives thereof), that can initiate cross-linking up being irradiated.

Polymerizable liquids and materials can additionally have solid particles suspended or dispersed within. Any suitable solid particle can be used, depending upon the end product being fabricated. The particles can be metallic, organic polymers, inorganic, or composites and mixtures thereof. The particles can be non-conductive, semi-conductive, or conductive (including metallic and non-metallic or polymer conductors). The particles can be magnetic, ferromagnetic, paramagnetic, or non-magnetic. The particles can be of any suitable shape, including spherical, elliptical, cylindrical, irregular, etc.

In other embodiments, the polymerizable liquid can include live cells that behave as "particles." Such polymerizable liquids are generally aqueous, can be oxygenated, and can be considered to be emulsion-like where the live cells are the discrete phase. Suitable live cells can include plant cells (e.g., monocots or dicots), animal cells (e.g., mammalian, avian, amphibian, reptilian), or microbial cells (prokaryotic, eukaryotic, protozoan, etc.), etc. The cells can be differentiated from or correspond to any type of tissue (e.g., blood, cartilage, bone, muscle, endocrine, exocrine, epithelial, endothelial, etc.), or they can be undifferentiated cells such as stem cells or progenitor cells. In such embodiments, the polymerizable liquid can form a hydrogel, including, but not limited to those described in U.S. Pat. Nos. 5,836,313; 6,602,975; 7,556,290; 7,651,682; and 7,651,683, the disclosures of which are incorporated by reference in their entireties.

Such "particles" can comprise an active agent or other detectable compound, though these compounds can also be dissolved and solubilized in the polymerizable liquid directly. Additional components can also be solubilized within the polymerizable liquid, including pigments, dyes, active compounds or pharmaceutical compounds, compounds for detection (e.g. fluorescent, phosphorescent or radioactive compounds), etc., depending on the particular purpose of the product being fabricated. Examples of such components include, but are not limited to: proteins, peptides, nucleic acids, sugars, and small organic compounds, such as drugs and drug-like compounds, including combinations thereof.

Additionally, other components can be added to the polymerizable liquid in order to inhibit polymerization. Inhibitors may be in the form of a liquid or a gas. The specific inhibitor will depend upon the monomer being polymerized and the polymerization reaction. For free radical polymerization polymers, the inhibitor can be oxygen, which can be provided as ambient air, a gas enriched in oxygen, or pure oxygen gas. In embodiments where the monomer is polymerized by a photoacid generator, the inhibitor can be a base such as ammonia, trace amines (for example, methyl amine, ethyl amine, di- and trialkyl amines such as dimethyl amine, diethyl amine, trimethyl amine, triethyl amine, etc.), or carbon dioxide, including mixtures or combinations thereof.

In most stereolithographic applications, the UV-curable liquid is maintained at a constant level in a container as the 3D object is formed. A programmable source of UV radiation produces light in the plane of the surface of the UV-curable liquid. The UV source can illuminate the surface in defined spots; in a pattern defined by a 3D model; or generally, over all locations on the surface of the UV-curable liquid. A spot of UV light may be movable across the surface of the UV-curable liquid by motion of mirrors or other mechanical elements associated with the light source, and the position of the spot on the surface is controlled by a computer or other programming device.

In common stereolithographic applications in the art, an elevator platform provides the surface upon which the 3D object can be formed, and is capable of selective upward and downward movement as controlled by the computer. Upon illuminating the surface in a programmed manner with UV light of a sufficient intensity to cure the liquid and convert it into a solid material, the elevator platform that was initially just below the surface is moved down from the surface in a programmed manner by any suitable actuator. Any solid material that was initially formed is taken below the surface and new liquid flows across the surface so a new layer can be built in the next step. Typically, the elevator platform must be moved twice in preparation for the next layer: a first movement that places the build platform beyond the level defined by the thickness of the next layer to allow liquid to flow into the momentary void left at the surface where solid was formed, and a second movement to return the elevator back to the correct level in order to form the next layer. The movement of the elevator platform must be programmable, precise, and capable of moving and stopping at an appropriate speed in order to be reliable over hundreds or thousands of build layers for a single 3D object.

Historical approaches took a "top-down" approach to stereolithographic 3D printing, where new layers are formed at the top surface of a growing object, and after each radiation step, the forming 3D object is lowered into a deep pool of uncured material. Then, a new layer of curable material is coated on top of the most recently solidified layer, and a new radiation step takes place. More recently, "bottom-up" approaches to stereolithographic 3D printing have been developed, where new layers are formed at the bottom of a growing object, then after each radiation step, the forming 3D object is raised out of a shallow reservoir of uncured material to facilitate building a new layer. However, while bottom-up approaches reduce the amount of UV-curable material necessary to build a 3D object, they nonetheless require the same precise, reliable, and highly-controlled elevator platform upon which to build the object. Similarly, the elevator platform must also move twice in a bottom-up approach—a first movement of more than a layer thickness to allow more uncured material to flow in, and a second movement to return the platform to the correct position to cure the next layer.

The printer apparatus according to the present invention can be configured for both top-down and bottom-up approaches to building 3D objects using a stereolithographic printing method. To facilitate a top-down approach, the apparatus can include a build platform adapted to have a top-side build surface that continuously descends down into a pool of polymerizable build fluid. Once polymerized, each layer of the forming 3D object can be submerged into the build fluid while a new layer is formed at the surface. Conversely, the same apparatus can be configured for a bottom-up approach by adapting the build platform with an underside build surface that continuously ascends out of the pool of polymerizable build fluid. In this approach, formed layers can be exposed to the ambient environment inside the apparatus and above the top surface of the polymerizable build fluid, while a new build layer is formed at an underside surface of the previously-built material of the object, which is below the upper surface of the polymerizable build fluid. Further details of embodiments employing both bottom-up and top-down stereolithographic approaches are discussed below.

<Powder Bed Additive Manufacturing>

In some embodiments, the printing apparatus according to the present invention can be configured to accommodate 3D printing applications that utilize fusable or agglomerable powders. In these types of applications, instead of using a polymerizable liquid as the build material, powders or solid particles are generally used as a build material. The powders or solid particles can be selectively cured according to a 3D model or program to form successive layers of an object by several processes, including but not limited to: chemical or mechanical binding, laser sintering, bombardment with radiation, and any other suitable method known to those of ordinary skill in the art. The powders themselves may be any mixture of solid particles, including granules. Non-limiting examples of combinations of materials that may comprise the powders include sand and calcium carbonate, acrylic powder and cyanoacrylates, ceramic powder and liquid binders, sugar and water, etc. Further, powders can assume any shape, and can have various particle sizes and compositions consisting of a single, pure material or mixtures of two or more materials. Powder compositions can also include one or more particulated metal compounds in combination with the powder. Metal particles can be used instead of powder to produce metallic 3D-printed objects. The particular powder or metal used can be selected based on the properties desired such as color, strength, conductivity, etc., as well as the process used to fuse them together. 3D printing utilizing fluidizable or agglomerable powders is further discussed in U.S. Pat. Nos. 5,204,055; 9,321,934; 9,346,127; and 9,358,701, the disclosures of which are incorporated by reference in their entireties.

Generally, methods for building models in layers which use particulate material are a much more economical alternative, in particular with regard to time intensity. When employing these methods, each layer of powdered material is selectively bonded, cured, sintered, fused, or otherwise fixed together in a pattern or design defined by a computer model of the object, similar to stereolithography. In powder bed applications according to the present invention, one or more print heads can be utilized to selectively apply binding material, heat, radiation, or other means as described above to harden each layer. Optionally, particles in a particular layer can be partially bound or sintered together by any of the above methods as each layer is formed, before one or more final processing steps fully solidify the 3D object. As with stereolithography, after one layer has been completed, the process is repeated hundreds or thousands of times (or more) until the 3D object is finished and must be removed from the unbound particulate material.

Powder-based building materials can include metal, metal alloys, ceramics, or allotropes of elemental carbon. An allotrope of elemental carbon can comprise amorphous carbon, graphite, graphene, diamond, or fullerene. Fullerenes can be selected from the group consisting of a spherical, elliptical, linear, and tubular fullerene. Optionally, fullerenes can comprise buckyballs or carbon nanotubes. In some embodiments, the building material can additionally comprise an organic material, for example, a polymer or a resin. Powder materials can additionally be coated by a coating (e.g., organic coating such as the organic material (e.g., plastic coating)). Powder materials can include granules, including sand. Also, powder materials can comprise mixtures of two or more materials, at least one of which can be a reinforcing material (e.g., that forms a fiber). Such reinforcing materials can include carbon fibers, Kevlar®, Twaron®, ultra-high-molecular-weight polyethylenes, or glass fibers.

Further, powder materials can be comprised of individual particles that can be spherical, oval, prismatic, cubic, or irregularly shaped. The powder-based building material can be comprised of homogenously-shaped particle mixtures such that all of the particles have substantially the same physical properties, including but not limited to shape, length, and weight. In other embodiments, the powder-based building material can be comprised of a heterogeneous mixture in which certain particles have different physical properties from one another. Furthermore, the material composition of at least one layer may differ from the material composition of at least one other layer within the powder bed, or each layer can be constructed so that different particle materials can exist within the same layer of the object. For example, a layer can comprise two or more metals, two or more metal alloys, two or more ceramics, etc., or it can comprise two or more types of material, such as a metal and a metal alloy.

Metallic building materials can include small amounts of non-metallic materials, such as, for example, oxygen, sulfur, or nitrogen. In some cases, the metallic material can comprise the non-metallic materials in trace amounts. Trace amounts of non-metallic material can be defined in each individual instance, and can range from 100,000 parts per million to 0.001 parts per million, depending on the desired properties and characteristics required for the finished product.

In accordance with an embodiment of the present invention, the printing apparatus can include a build platform adapted to have a top-side build surface that continuously descends down into a powder bed. After fusing a uniform layer of a fusable or agglomerable powder into a single layer of the object according to a programmed 3D model, the bed of powder within which the object and the printing apparatus reside is fluidized using a gas, using well-known and familiar fluidization techniques. The gas can comprise atmospheric air, an inert compound, or any other gas compatible with the build material and desired by the user, and can include mixtures of one or more gasses. The fluidization mobilizes and reduces the bulk density of the bed of powder to permit the movement of the 3D objects along the descending conveying surface with little or no resistance. Excess powder material is added to the bed using any means known to those skilled in the art to maintain a sufficient quantity of powder inside the printing apparatus.

Once the conveying build surface with the 3D objects has been positioned in the proper position form forming the next layer of the 3D object, the fluidization is slowed and halted, slowing the powder to settle and pack into a stable bed of powder. The excess powder ensures that there is sufficient powder covering the 3D objects for building the subsequent layer. The thickness and uniformity of a new layer of powder can be formed over the previous build layer by well-known means, such as by running a blade at a fixed distance above the build surface to form the layer of powder with a uniform thickness. The uniform layer of powder is then fused or agglomerated selectively to add a new layer onto the 3D object. One or a plurality of binding or light-emitting units including a plurality of light-emitting elements, positioned along the length of the conveying belt over the container, emits light in a predetermined pattern for fusing together predetermined portions of the uniform powder layer.

The cycle of adding excess powder, fluidizing, positioning the conveyor, stabilizing and packing the powder bed, forming the uniform thickness of powder, and fusing or agglomerating the powder layer is repeated until a completed 3D object is formed. After the printing is completed, the finished 3D object is removed from the remaining powder material within which the object is embedded, manually or by any mechanical extraction means as known to those skilled in the art.

In accordance with another embodiment of the present invention, the printing apparatus can include a build platform adapted to have a bottom-side build surface that continuously ascends up through a powder bed. As in the above-described ascending lithographic process, a first layer of fused or agglomerated powder material is formed onto the build surface from a thin layer of powder material disposed between the build surface and the transparent surface through which the reactive light is emitted, which fuses or agglomerates the powder material to the object. After fusing the first layer, the bed of powder within which the object and the conveyor reside is fluidized to mobilize and reduce the bulk density of the bed of powder to permit the movement of the 3D objects along the ascending conveying surface with little or no resistance. The quantity of powder material within the apparatus need only be sufficient to maintain a layer along and between the last build layer of the 3D object and the light-emitting transparent surface, and to account for the build powder fused in the last build layer. In one embodiment, the apparatus container has a bottom surface that is transparent to the reactive light, and the light emitters are disposed outside the container, beneath the transparent bottom. In an alternative embodiment, the light emitters are disposed inside the fluidized powder, within the container and below the conveyor, to direct the light upwardly through a transparent cover or lens, toward the underside of the conveyor.

Methods to print 3D objects using powder beds as the build material may require extra amounts of powder, a majority of which is not incorporated into the final object and much of which may not be reclaimed to print successive objects. Invariably, build surfaces when employing powder or metal particle applications are horizontal, even where the particulated building material or binder compound is applied at an angle, as described by U.S. Patent Publication 2015/0042018, the disclosure of which is incorporated by reference in its entirety. Furthermore, the addition of the binder compound and other materials to facilitate the above method prevents the unused building material from being reused in successive applications to print additional objects. Although the embodiments of the present invention utilizing powder or metal particulates discussed above similarly requires an excess amount of build material relative to the amount used to form the final 3D object, unused building material can be reused because it is not necessary to add binder material to force the powder bed to maintain its shape during printing.

To reduce waste, other approaches have been recently developed where each layer of build material is selectively dispersed according to a program or a 3D model. As with the traditional powder bed approach, each layer is cured either partially or completely prior to applying the next layer. However, because the build material is selectively applied, curing can be accomplished by heating or radiating the entire printing field rather than according to a pattern. The printing apparatus according to the present invention can be configured to form 3D objects by any process known to those of skill in the art that selectively deposits powder or particulate build material layer-by-layer onto the build platform.

<Common Additive Manufacturing Elements>

Ideally, after each layer has been formed and solidified, the layer is completely flat and all edges are perfectly sharp. However, several situations often arise where the most recently formed layer or layers are not flat, or one or more edges are not completely sharp. These imperfections can occur because the surface of the resin or fluidizable powder was not flat at the time the layer was formed, or the layer was disturbed during the hardening or curing process. Left unchecked, rough layer surfaces and rounded edges have the potential to seriously affect the structural integrity of the object or render it useless for its intended function, especially for objects where high resolution between layers is necessary. To combat this issue, the printing apparatus according to the present invention can also include one or more leveling apparatuses to flatten the most recently printed layer of the 3D object and/or sharpen one of its edges, as well as to ensure that the top surface of the powder bed or resin is flat and unperturbed before printing any subsequent layers.

Leveling apparatuses are often referred to in the 3D-printing field as "rollers," "leveling rollers," or "scrapers." A leveling apparatus that smoothens a newly formed layer of a 3D object can either operate while the layer is being printed or after processing of the layer has completed. Such leveling apparatuses typically peel off between 5% and 30% of material from the height of the most recently printed layer once the material is at least partially dry and solid. "Solid" can either mean fully sintered particles or cured resin, or resin or particles that are loosely adhered to each other by a binder or partial curing or sintering. Leveling rollers can utilize any mechanism known in the art, including grinding rollers that are metal cylinders with an abrasive surface (for example, coated with tungsten carbide); cutting rollers that include a milling cutting tool with sharp blades; smooth rollers that are used to level liquid layers of material; or knurled rollers that consist of a multitude of relatively small knurls or particles adapted to level wax surfaces. Smooth rollers are discussed by U.S. Pat. No. 8,038,427 and knurled rollers are discussed by U.S. Pat. No. 6,660,209, the disclosures of which are incorporated in their entireties.

In conventional 3D printing implementations, vertical milling or smoothing tools, including multiple cutting blades or a grinding disk, are mounted to a vertical beam that is perpendicular to the plane of the upper surface of the object, and rotates about the beam. These vertical milling tools are used to level the most recently printed and at least partially solidified layer. The cutting or grinding surface of the vertical tools is parallel to upper surface of the object, but the rotation vector points vertically upwards. Similarly, a leveling roller may be mounted on and rotate about a horizontal axis to provide a horizontal roller. The grinding surface of a horizontal roller at the point it contacts the material is generally also parallel to the plane of the upper surface of the object, but its rotation vector is horizontal, in contrast to vertical milling and smoothing tools. Rotation around the beam axis for either a vertical or horizontal leveling apparatus can be clockwise or counterclockwise, and can be determined by one skilled in the art based on the directionality of the blades, attributes of the printed material, and other considerations.

As a result of leveling or shaving the object using a leveling apparatus, particle waste can be generated. The particle waste can include shaved particles and/or dust of the solid particles from the printing ink. Techniques to prevent the particle waste from being scattered over the printing surface, and to remove the waste from the roller blades, can and should be applied to both provide the best surface upon which to print subsequent layers and result in the highest quality final 3D object.

Embodiments of the Invention

Figure 1:
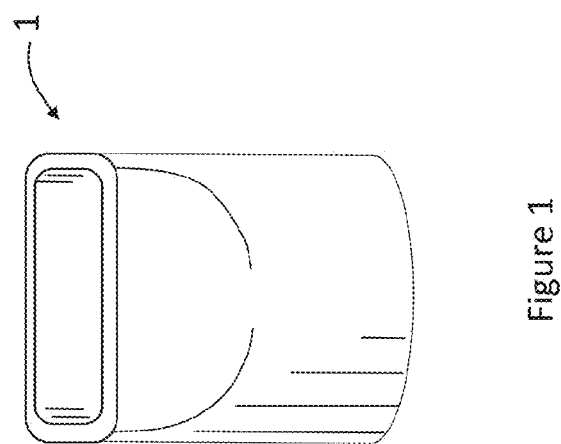

FIG. 1 shows a perspective view of a conventional 3D object 1, namely a hollow container with an open top, having a sidewall having a lower cylindrical portion and an upper square portion. FIG. 2 shows the object in elevation view, having a base surface 3. Any 3D object 1 can be sliced into multiplicity of horizontal slices or layers, stacked one upon another, as shown in FIG. 3. FIG. 3 shows the 3D object 1 sliced into 14 horizontal slices. The object 1 can also be sliced vertically into a multiplicity of vertical sections (slices), adjacent one to another, starting from one side 2 of the object to an opposite side, as shown in FIG. 3, which shows the 3D object 1 sliced into 10 vertical sections.

Figure 5:
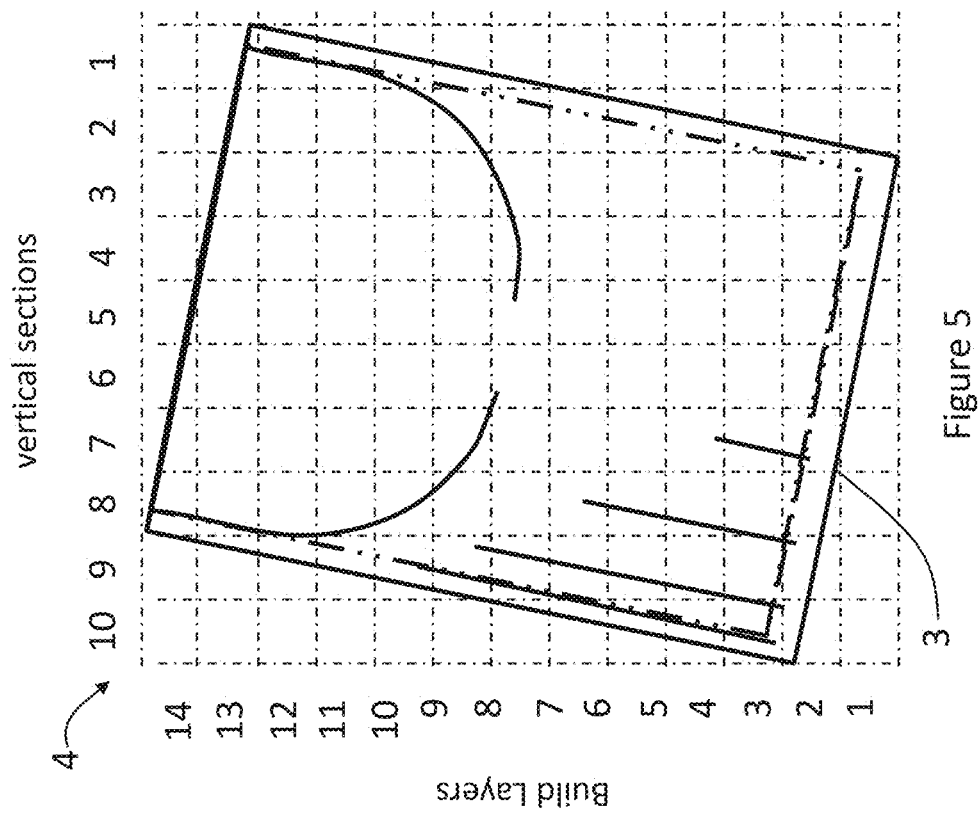
FIG. 5 shows an elevation view of the tilted object of FIG. 4 with grid lines showing horizontal build layers and vertical sections.
Figure 4:
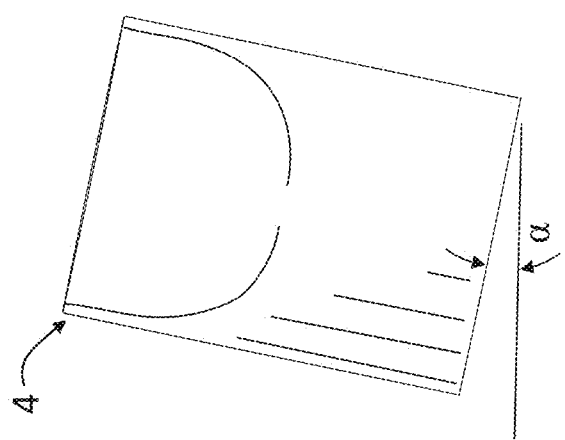
FIG. 4 shows an elevation view of a 3D object tilted at an angle from horizontal, for building on a 3D printer apparatus.

In the practice of an apparatus and method of the present invention, the 3D object may be built upon a surface or platform that moves along an angled (ascending or descending) pathway. An example of a build platform is a conveyor belt that is disposed in a slanted or sloped plane, at a shallow angle α to horizontal. The angle α upward can be any acute angle. The angle α can be at least 2 degrees, and up to about 45 degrees; more particularly at least 10 degrees, and up to about 30 degrees, and more particularly at least 15 degrees, and up to about 25 degrees. The tilted 3D object 4 disposed in an angled position, as shown in FIG. 4, can also be sliced into multiplicity of horizontal slices or layers, stacked one upon another, and can also be sliced vertically into a multiplicity of vertical sections (slices), adjacent one to another, starting from one side 5 of the object to an opposite side, as shown in FIG. 5.

For illustration purposes, the resolution of a first layer of the 3D object 1 in FIG. 3 is coarse. A typical 3D object is sliced into hundreds or thousands of slices. FIG. 6A shows the 3D object 1 sliced with the base of the 3D object 1 at horizontal, and with the lowest build layer 1 (FIG. 3) further divided into ten sublayers or slices, labeled 1.0 through 1.9, having a finer resolution. FIG. 6A shows the 3D object 1 can be built in horizontal and lateral sections, including first horizontal sections 101 and 201, second horizontal sections 102 and 202, and third horizontal section 103. It can be understood that even finer horizontal resolution and thinner slices or layers, and/or vertical sections, of the 3D object can be made by the slicing program, for building a higher resolution 3D object by the build program on the 3D printer.

Figure 6B:
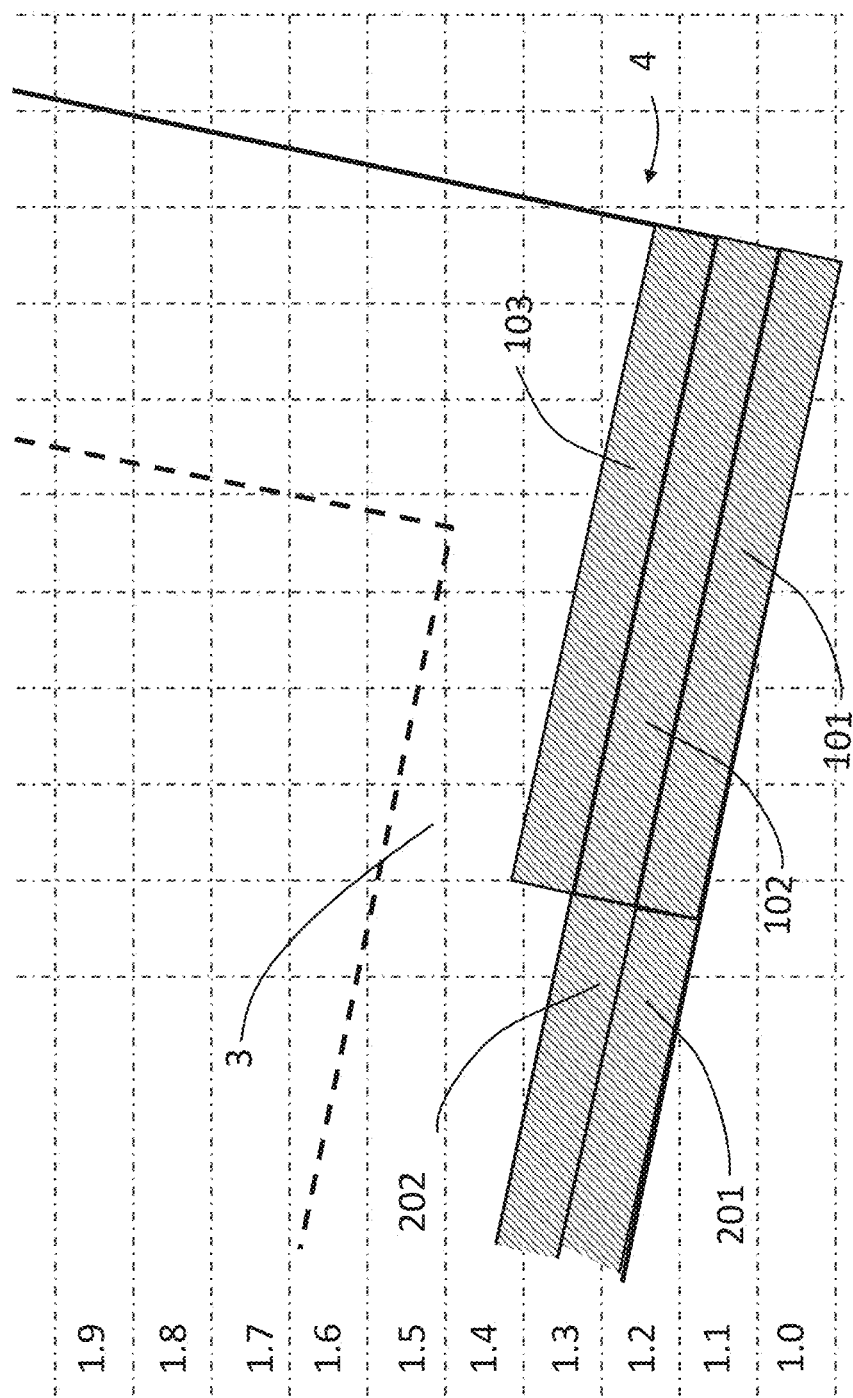
FIG. 6B shows an elevation view of the tilted object of FIG. 5 with grid lines showing horizontal build layers and vertical sections.

FIG. 6B shows the 3D object 1 oriented at the angle α from horizontal, though sliced by the slicing program into horizontal and lateral layers. The lowest build layer 1 in this embodiment is further divided into ten horizontal sublayers or slices, labeled 1.0 through 1.9, having a finer resolution.

Figure 7A:
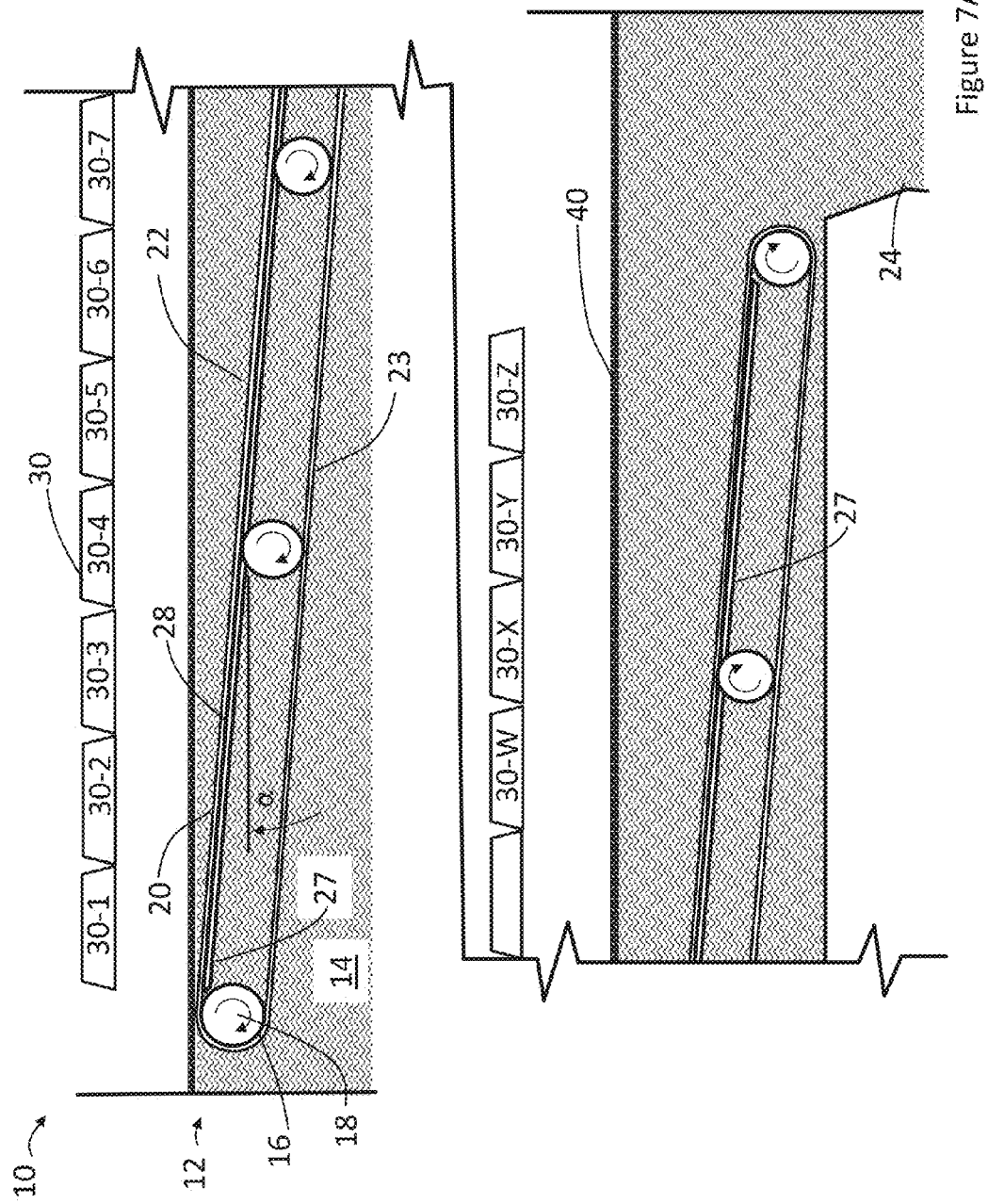
FIG. 7A shows an elevation view of an apparatus for building a 3D object on a continuous build surface that descends along and down into a container filled with a polymerizable monomer solution.

FIG. 7A shows an illustration of an apparatus 10 and process for making a 3D object on a continuous belt conveyor 16 having belt rollers 18 to drive a conveyor belt 20 that descends along and down into a container 12 filled with a monomer solution 14. The conveyor belt 20 is pitched at an angle α downwardly. The conveyor belt 20 is a sufficiently rigid to maintain a flat, planar surface 22 while being driven by the roller 18 along the length of the container 12 through the monomer solution 14. A support plate 27 is attached to the belt conveyor 56, and has a support surface 28 that is positioned in confronting orientation to the inside surface of the descending belt portion 22, extending along the length of the belt. The surface 22 of the conveyor belt can be prepared or treated to prevent a built thermoplastic material from sticking or adhering excessively to the surface, by means well known to persons skilled in the art of 3D printing, including the use of a water-solution polymer to which the thermoplastic polymer will adhere.

One or a plurality of UV light emitter units 30 are positioned along the length of the belt 20 over the container 10, each light emitter unit including a plurality of light emitting elements, typically in a matrix or arranged pattern, for emitting UV light beams 32 toward the belt 20.

An oxidation barrier 40 consisting of a salt water solution is floated in a thin layer on top of the surface of the monomer solution 14. The oxidation barrier is transparent to UV light beams that pass through and into the monomer solution 14.

Figure 7B:
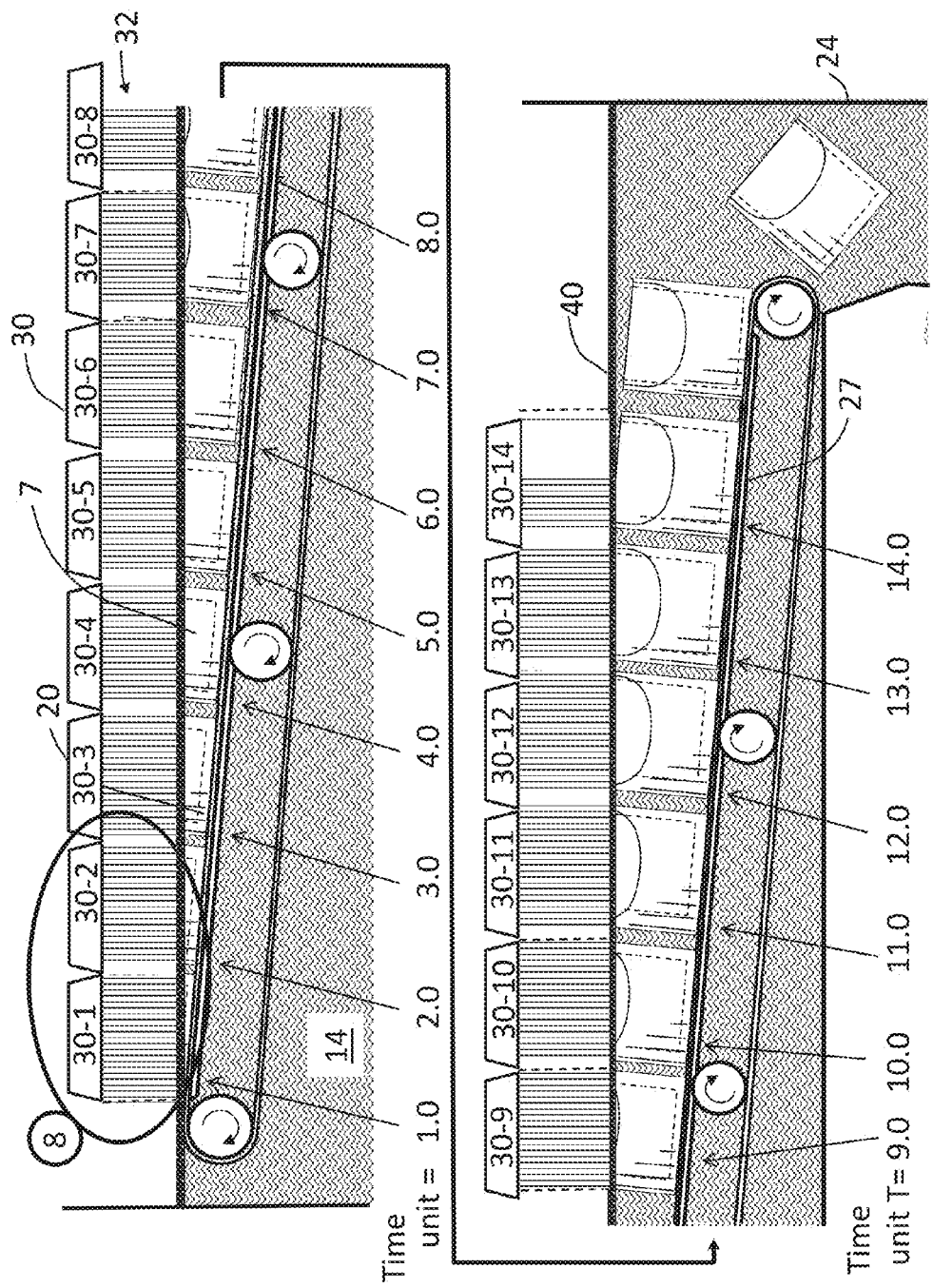
FIG. 7B shows the apparatus of FIG. 7A in use for building 3D objects.
Figure 8:
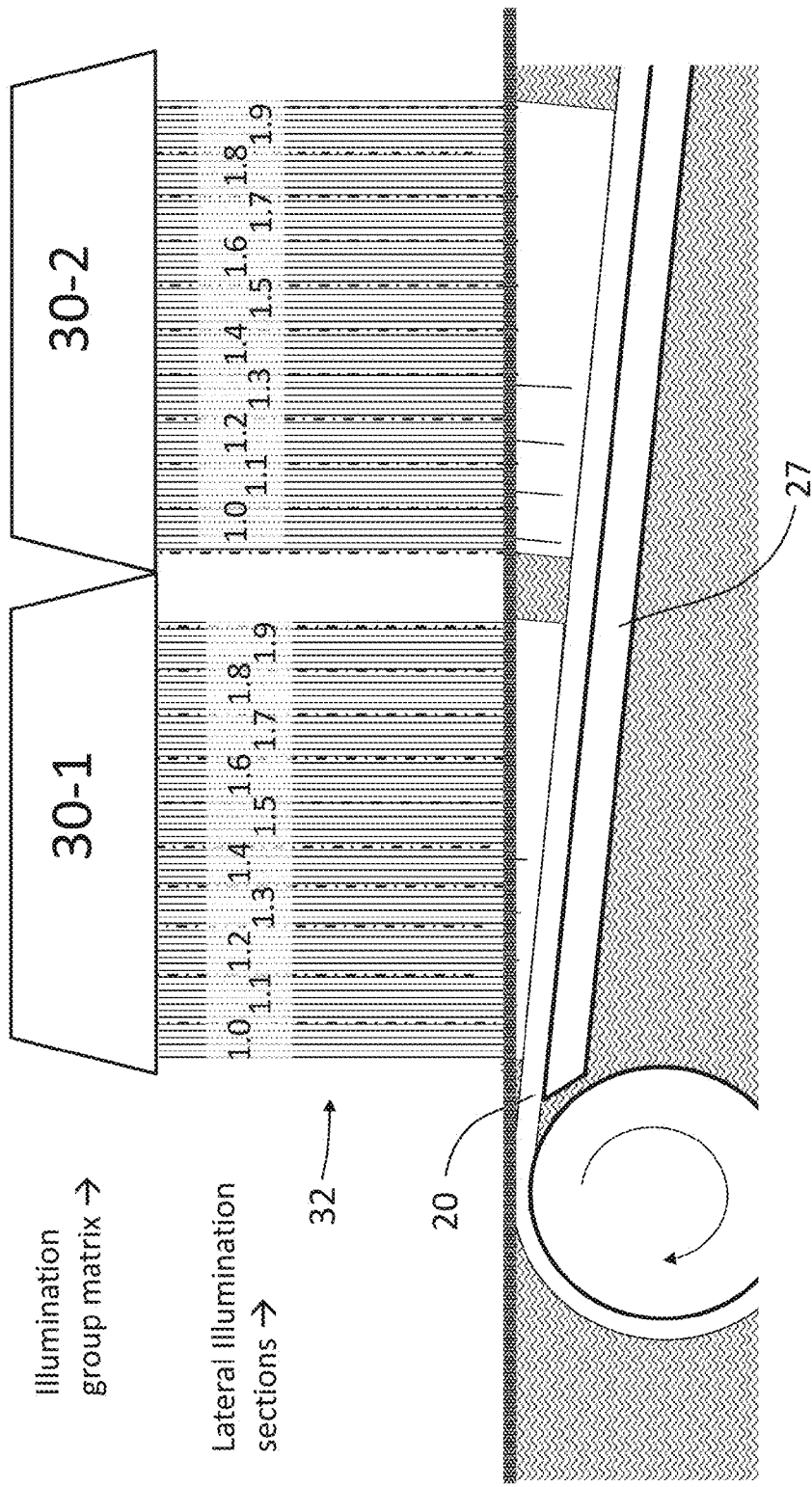
FIG. 8 shows a detailed section of the apparatus of FIG. 7B illustrating the illumination of a polymerizable monomer solution to form a layer of the 3D object.

The conveyor belt 20 is positioned to begin the descent down through the monomer solution 14 at a position P1, shown in FIG. 7B and in the exploded illustration of FIG. 8. FIGS. 7B and 8 show a plurality of partially-build 3D objects 7 under build construction on the upper surface and along the length of the conveyor belt 20. The conveyor belt 20 descends into the monomer solution 14 to a depth sufficient to build the full height of the completed 3D object 1. The illustrated embodiment shows 14 distinct objects 7 being built along the length of the conveyor belt 20, with each 3D object being built in a time period of 14 time units. A plurality of unit 30 of UV light emitters are arranged in series along the length of the container. It can be understood that more or less than 14 units 30 can be constructed upon the conveyor belt, and that a time unit can be variable, ranging from a few minutes to several minutes, and even to an hour or more, depending, inter alia, on the size of the 3D object and the number of slice layers. It can also be understood that a single elongated UV light emitter unit can be used, and that a unit 30 can include a significant though varying number of rows of laterally-arranged UV light emitting elements.

After completion of the build, at position Pz (FIG. 7B), the completed 3D object can tumble off or be removed from the end of the conveyor belt 20. For a typical thermoplastic, the completed 3D object sinks into a sump portion 24 of the container, from where the submerged 3D object can be retrieved, by well-known means, such as an elevator, a hoist, a belt conveyor, etc.

Figure 9B:
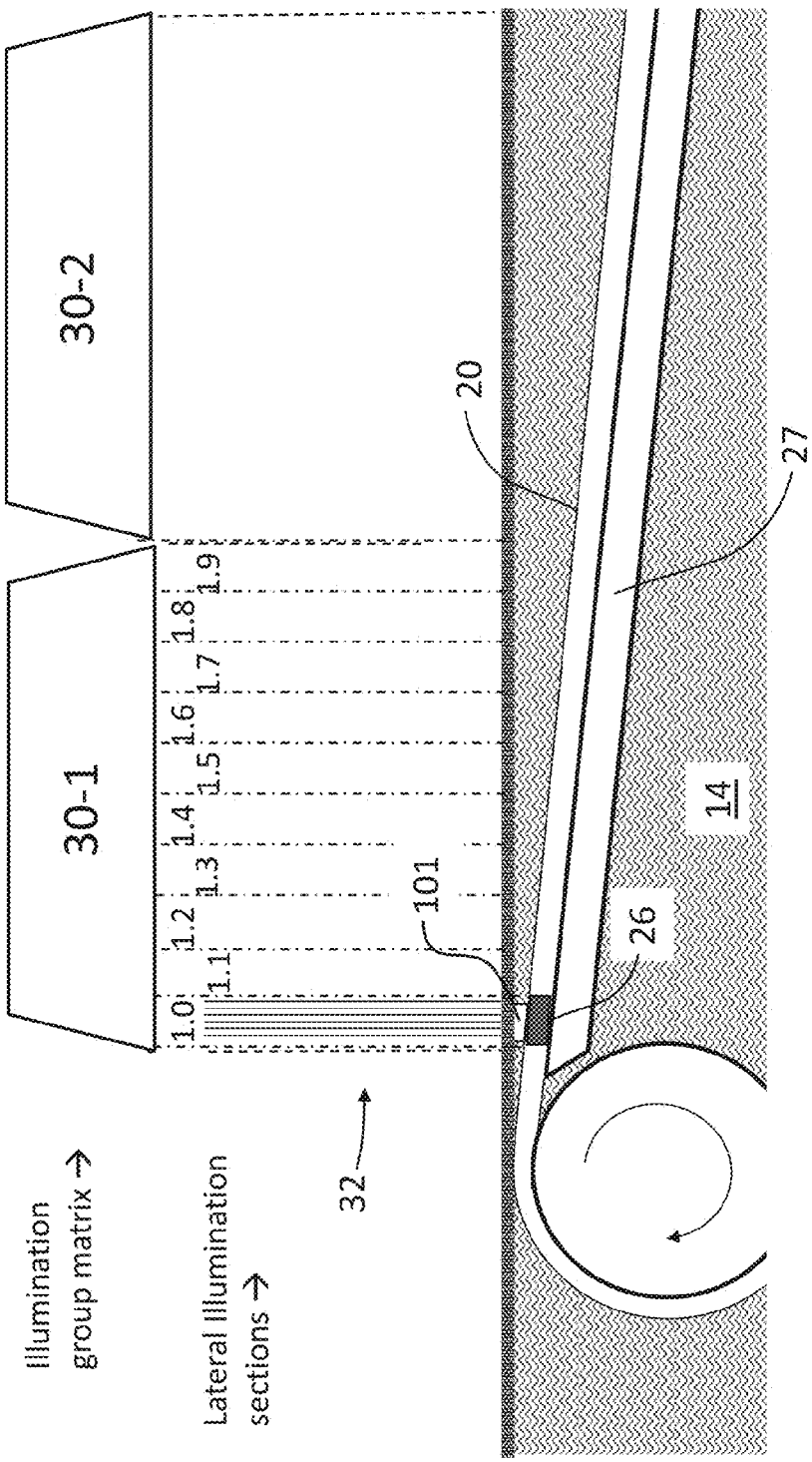

FIGS. 9A-9M illustrate the beginning of construction of a single (one only) 3D object upon the conveyor belt 20 under the UV light emitter units 30. FIG. 9A shows a conveyor belt 20 with a reference marker 26 marked in black. With the reference marker 26 positioned at the position P1, monomer solution 14 has flooded over the upper surface 22 of the belt 20. FIG. 9B shows, at time unit 1.0, the lateral illumination section 1.0 (of the first illumination group of UV emitters 30-1) emitting a lateral pattern of UV light 32 across the width of the belt 20, to form by polymerization a first lateral build portion 101, consisting of the lateral section 1 of first slice sublayer 1.0 (FIGS. 3A, 3B and 6). The lateral pattern 32 of UV light emitted by the lateral illumination section 1.0 is illustrated in FIG. 10A in the frame for time unit 1.0.

Figure 9C:
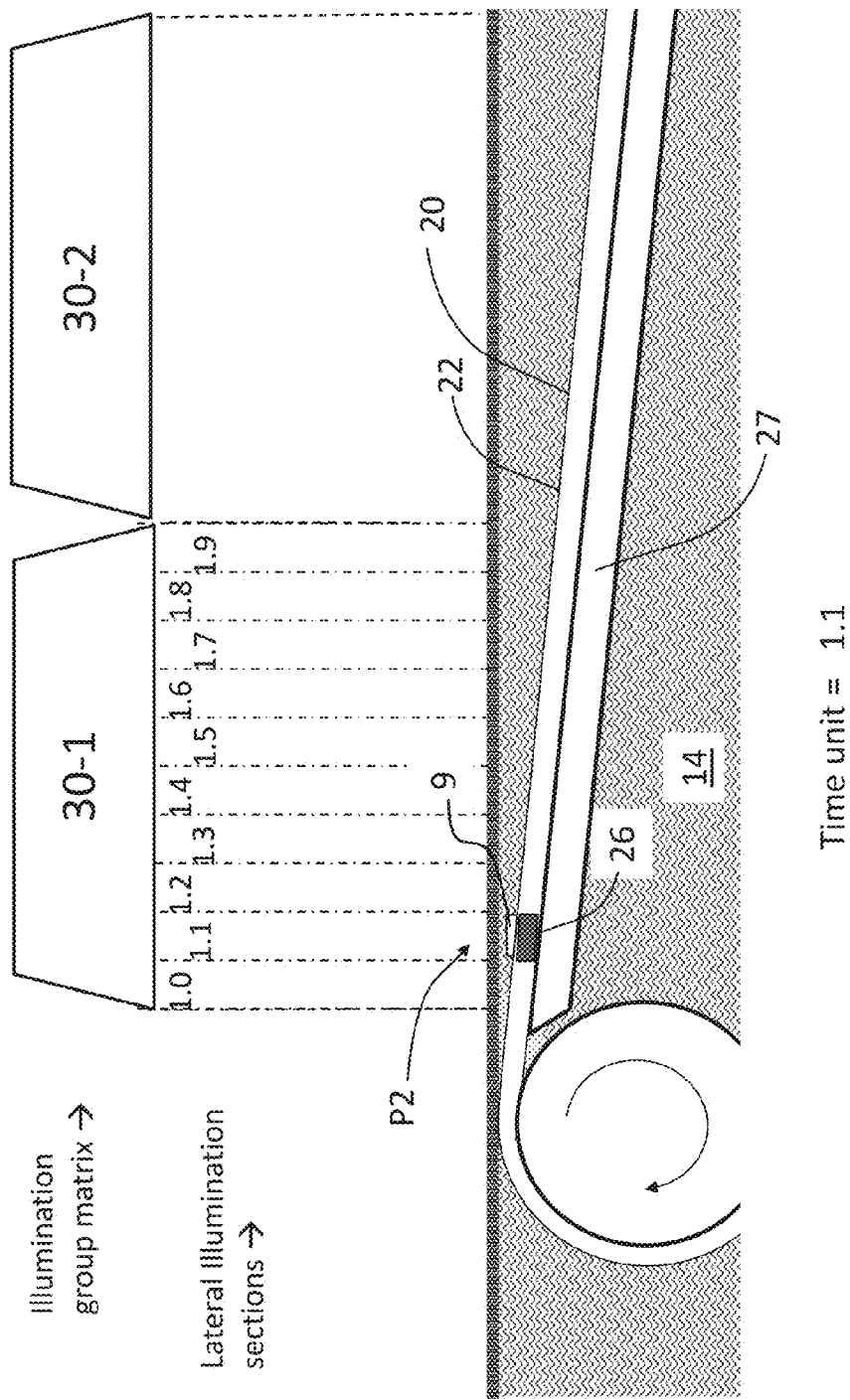

After forming the first build portion 101, the conveyor belt 20 advances with the marker 26 at second position P2, illustrated in FIG. 9C, where the monomer solution 14 floods over the first build portion 101 and the portion of the belt 20 trailing back to first position P1. FIG. 9D shows, at time unit 1.1, the lateral illumination section 1.0 and 1.1 emitting lateral patterns of UV light 32 to form by polymerization a second build portion (designated 102 in FIG. 3) and a further build layer 201 (FIG. 3) over build portion 101 consisting of the lateral section 2 of first slice sublayer 1.1 and lateral section 1 of second slice sublayer 1.1 (FIGS. 3A, 3B and 6), and collectively denoted build material 9 in FIG. 9. The lateral pattern of UV light emitted by the lateral illumination sections 1.0 and 1.1 are illustrated in FIGS. 10A and 10B, at time unit 1.1.

Figure 9E:
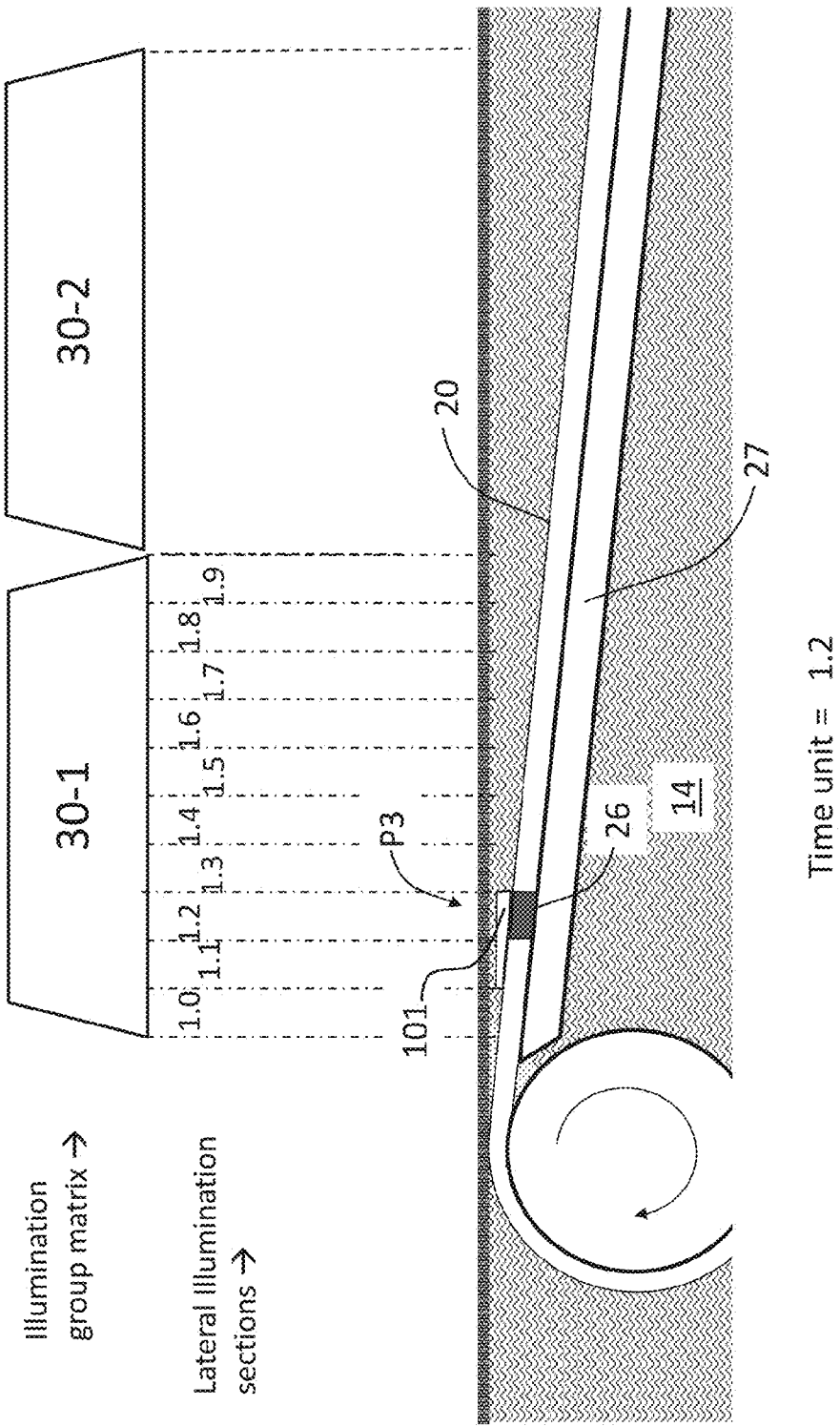
Figure 9F:
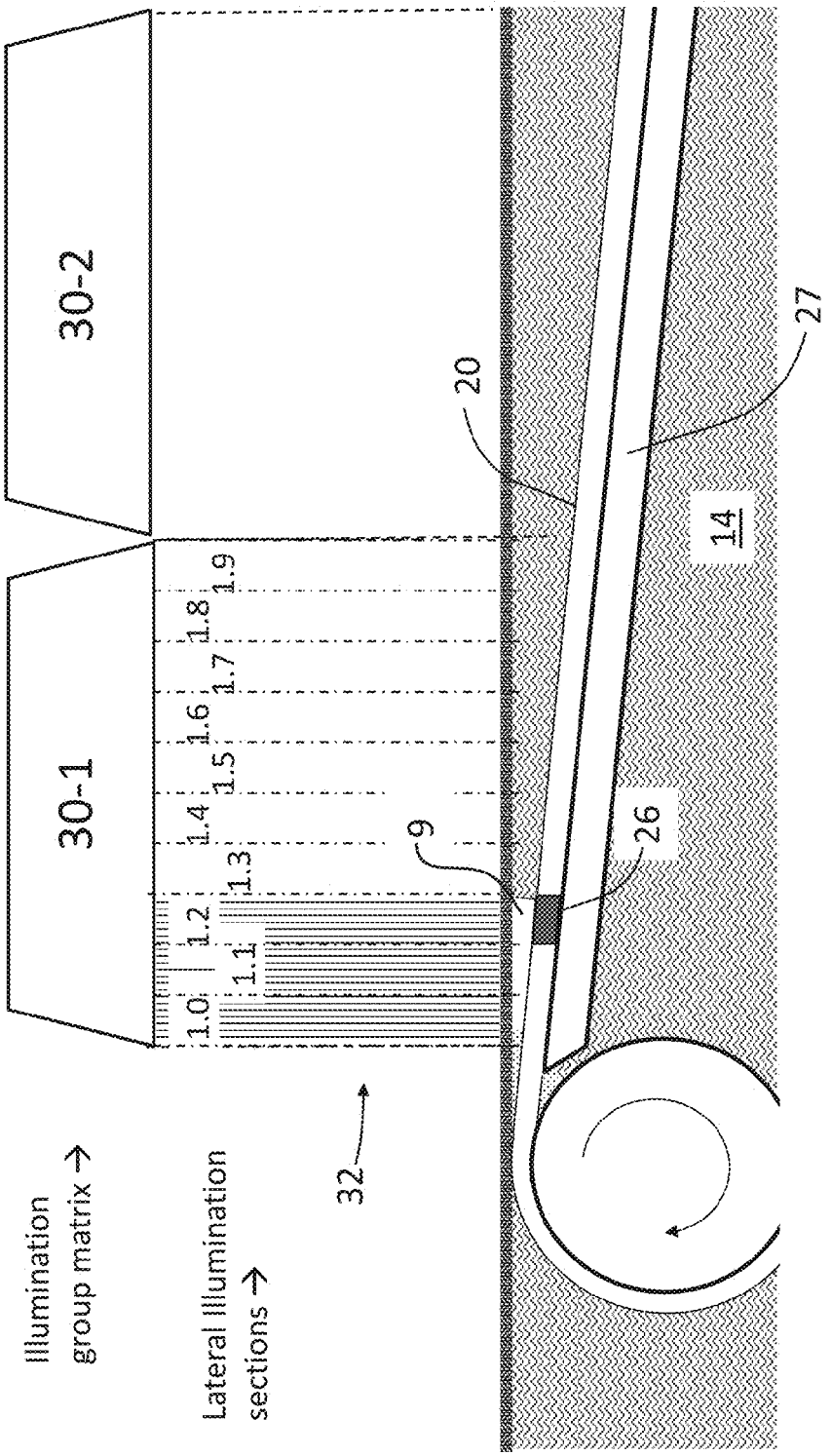
Figure 10B:
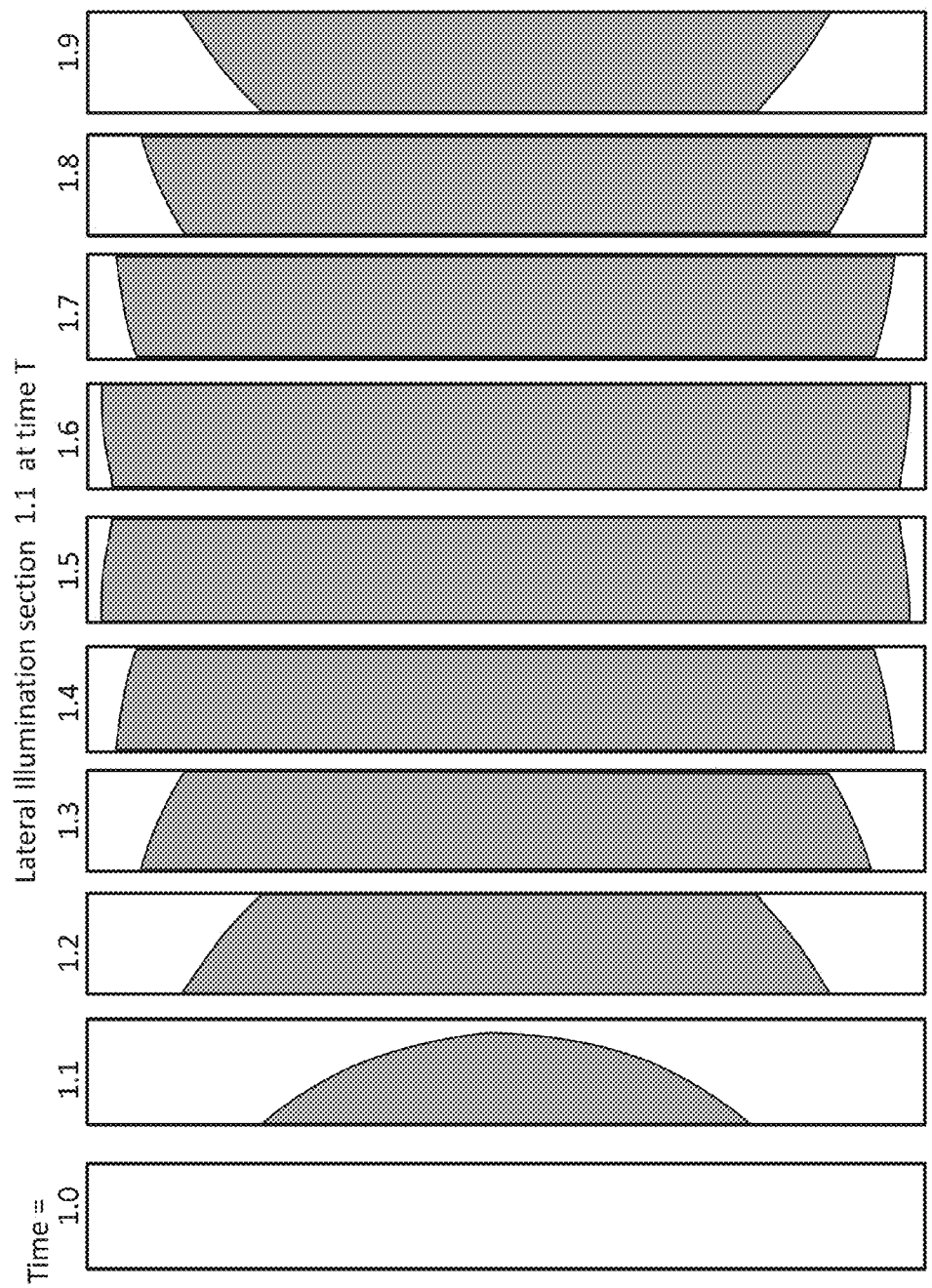
Figure 10D:
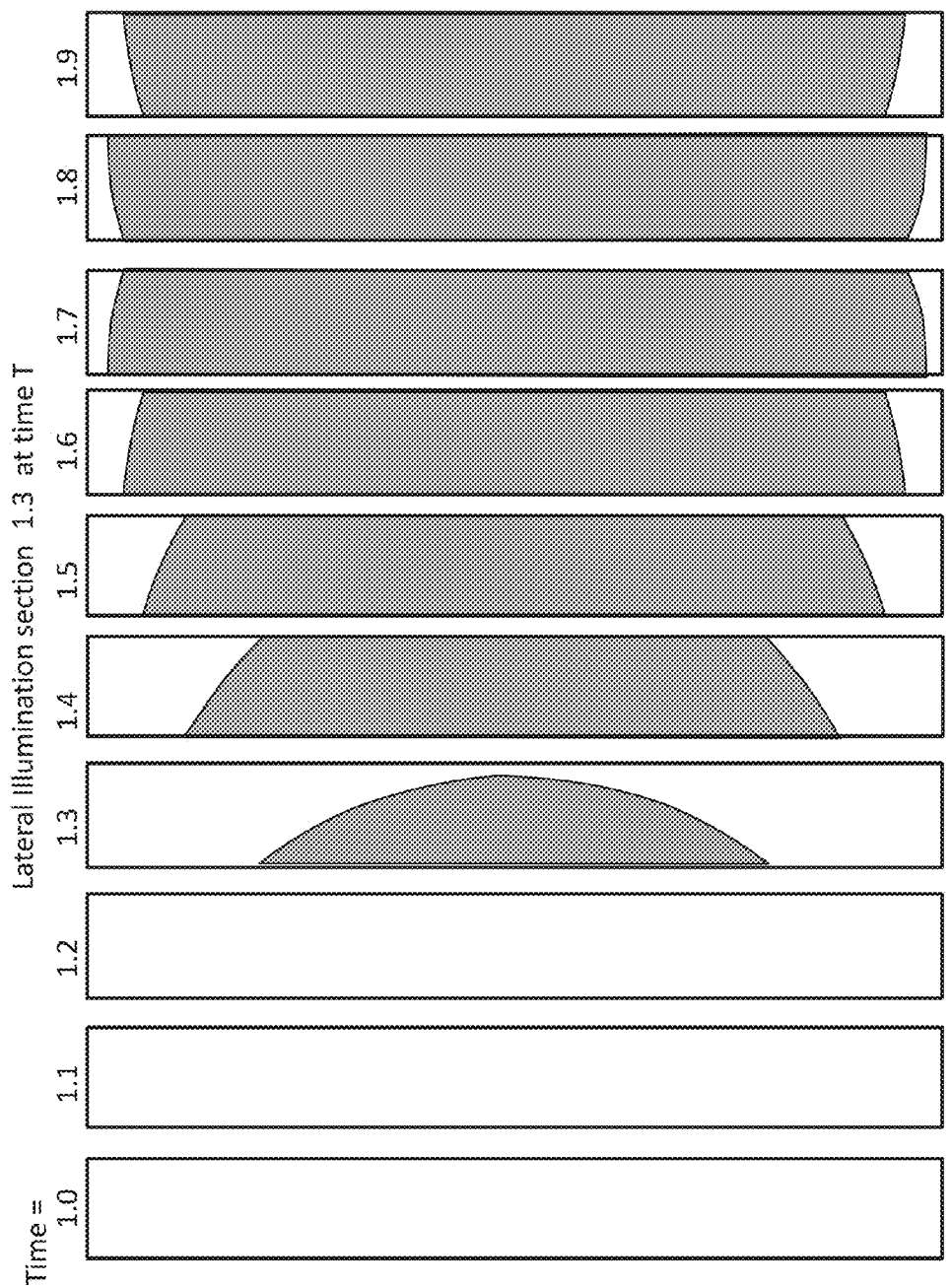
Figure 10E:
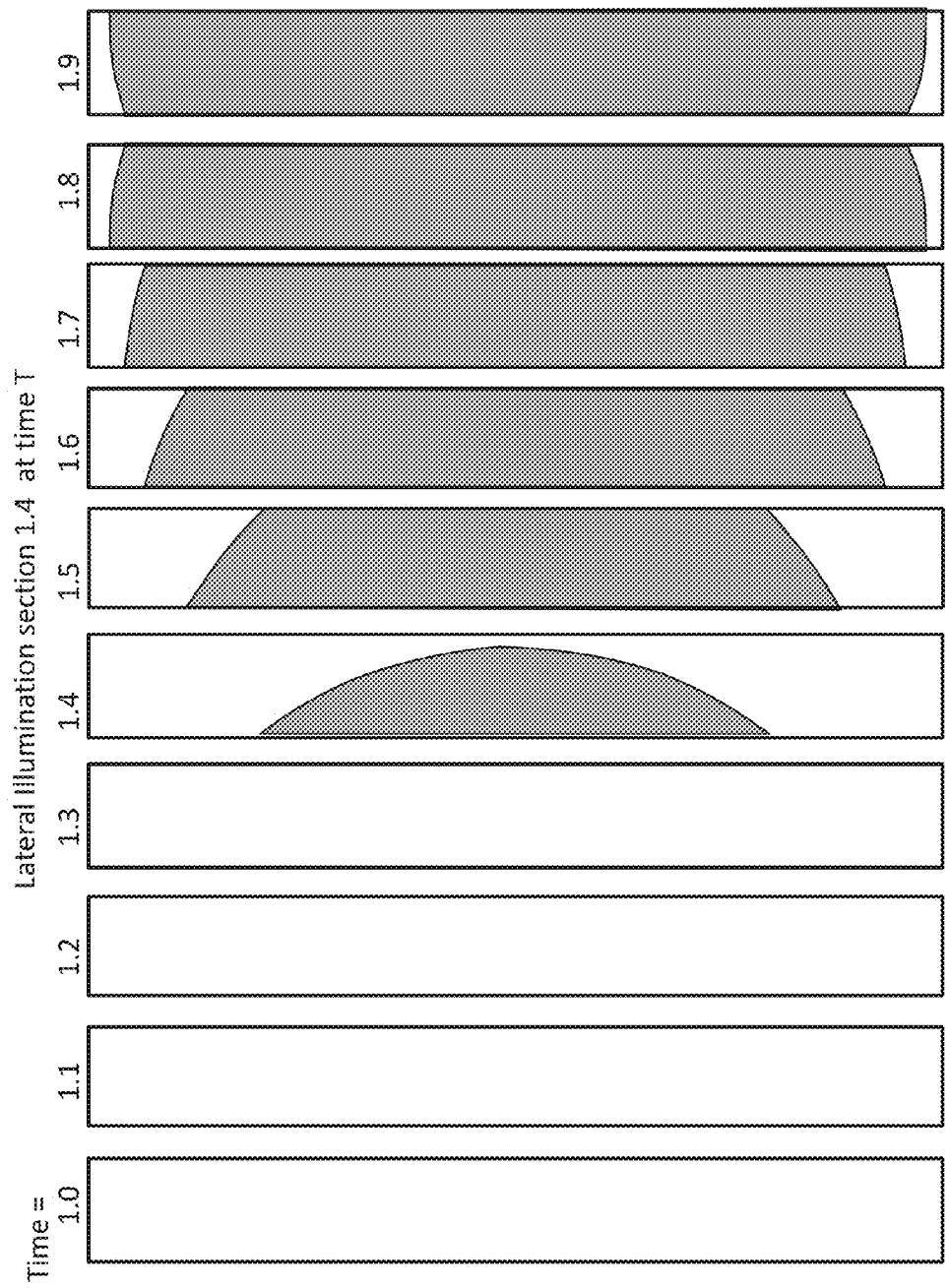
Figure 10J:
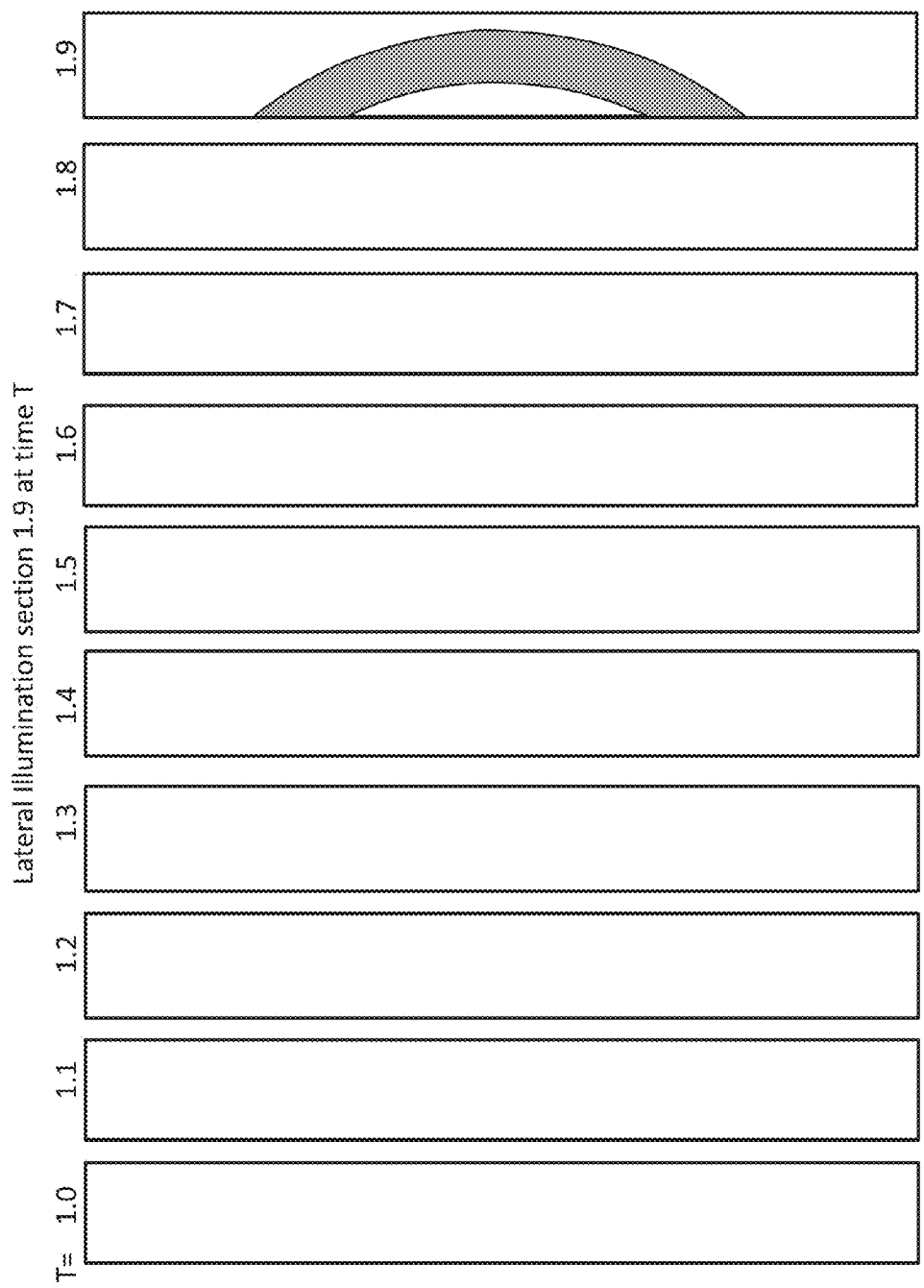

Continuing, FIG. 9E shows the advancement of the belt 20 with the marker 26 at third position P3, flooding of the monomer solution over the previously built layers 9, and FIG. 9F shows the emitting of UV light 32 and forming by polymerization of the further build layer portions 102, 201 and 300, collectively denoted as built material 9, by employing lateral patterns of UV light 32 emitted by the lateral illumination sections 1.0, 1.1 and 1.2 as illustrated in FIGS. 10A, 10B and 10C, at time unit 1.2.

Figure 9G:
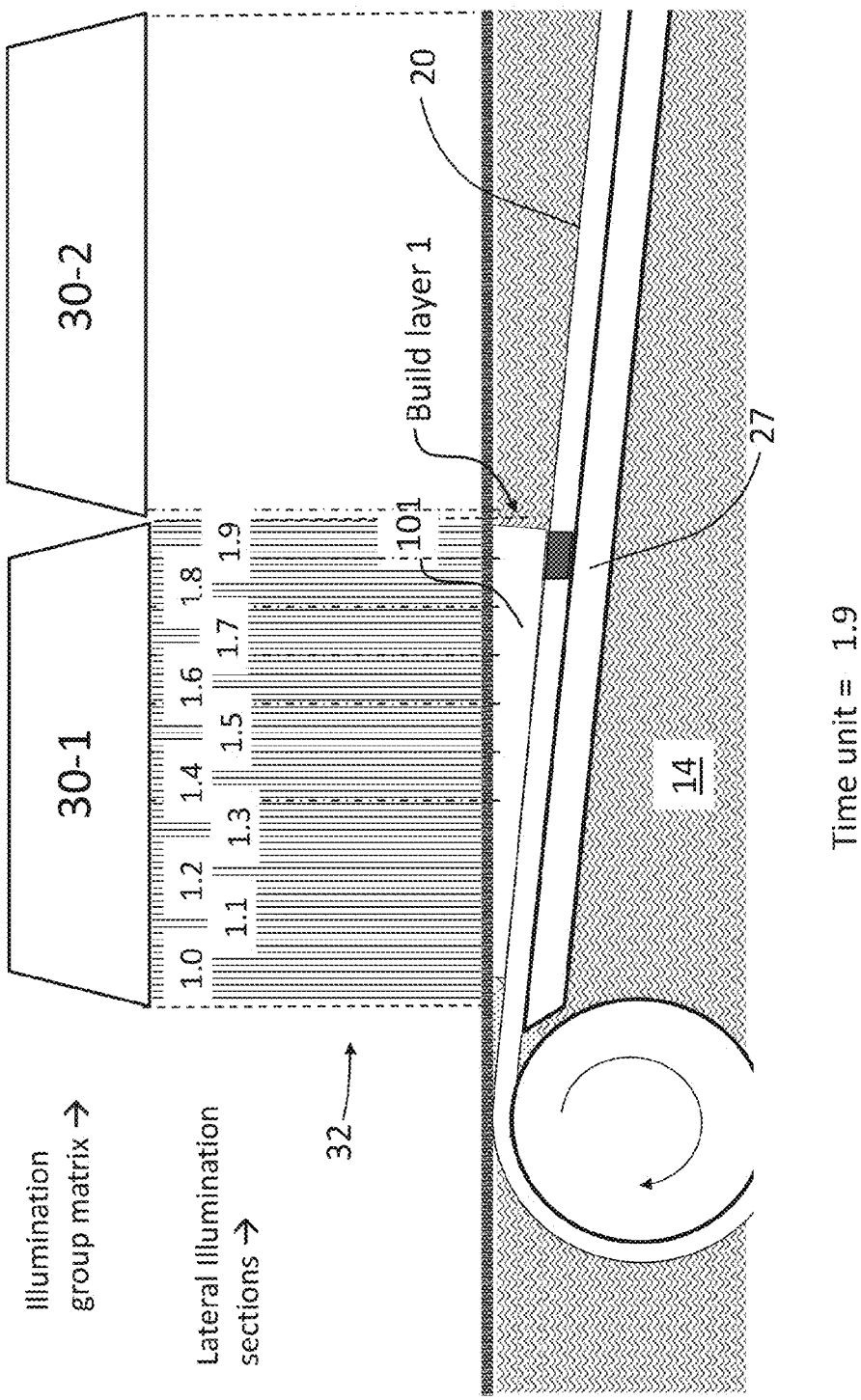

Continuing similarly further, FIGS. 9G-9M show the building of successive sub-layers of build layer 1 across the remaining vertical sections of the 3D object as the conveyor belt advances with the marker 26 progresses through positions P4 through P10, with monomer solution flooding over the previously build layers 9, and the polymerization of the further build layer portions employing lateral patterns of UV light emitted by the lateral illumination sections as illustrated in FIGS. 10D-10J at time units 1.3-1.9, respectively. FIG. 9G shows a core completed built material 9, including a completed first built layer 1 (see FIGS. 3 and 3A), employing the corresponding lateral UV light patterns of FIGS. 10A-10J at the time units 1.3 through 1.9.

Figure 11:
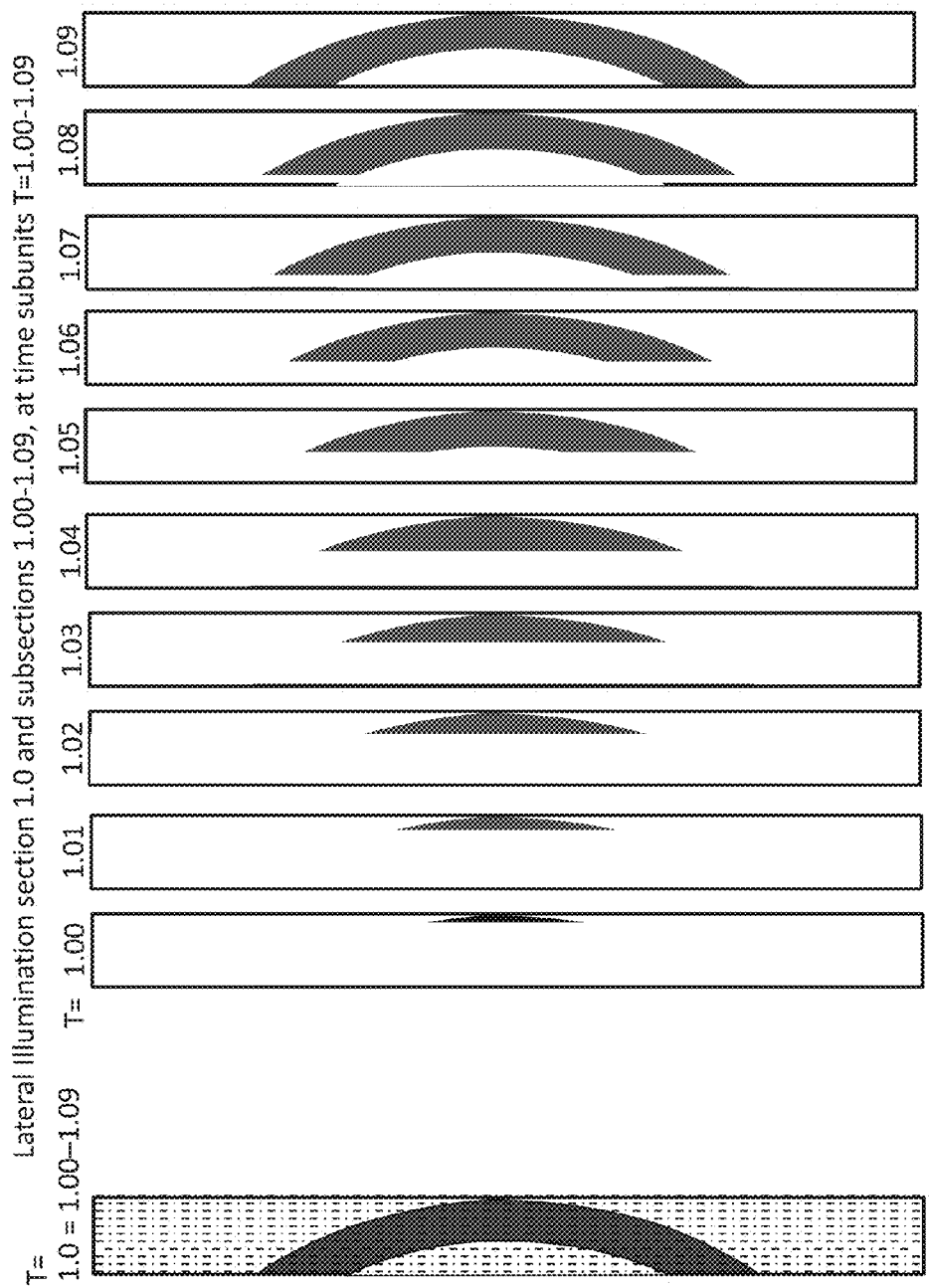
FIG. 11 is a time-dependent and detailed pattern of illumination for a plurality of subsections for one of the lateral illumination sections.
Figure 12A:
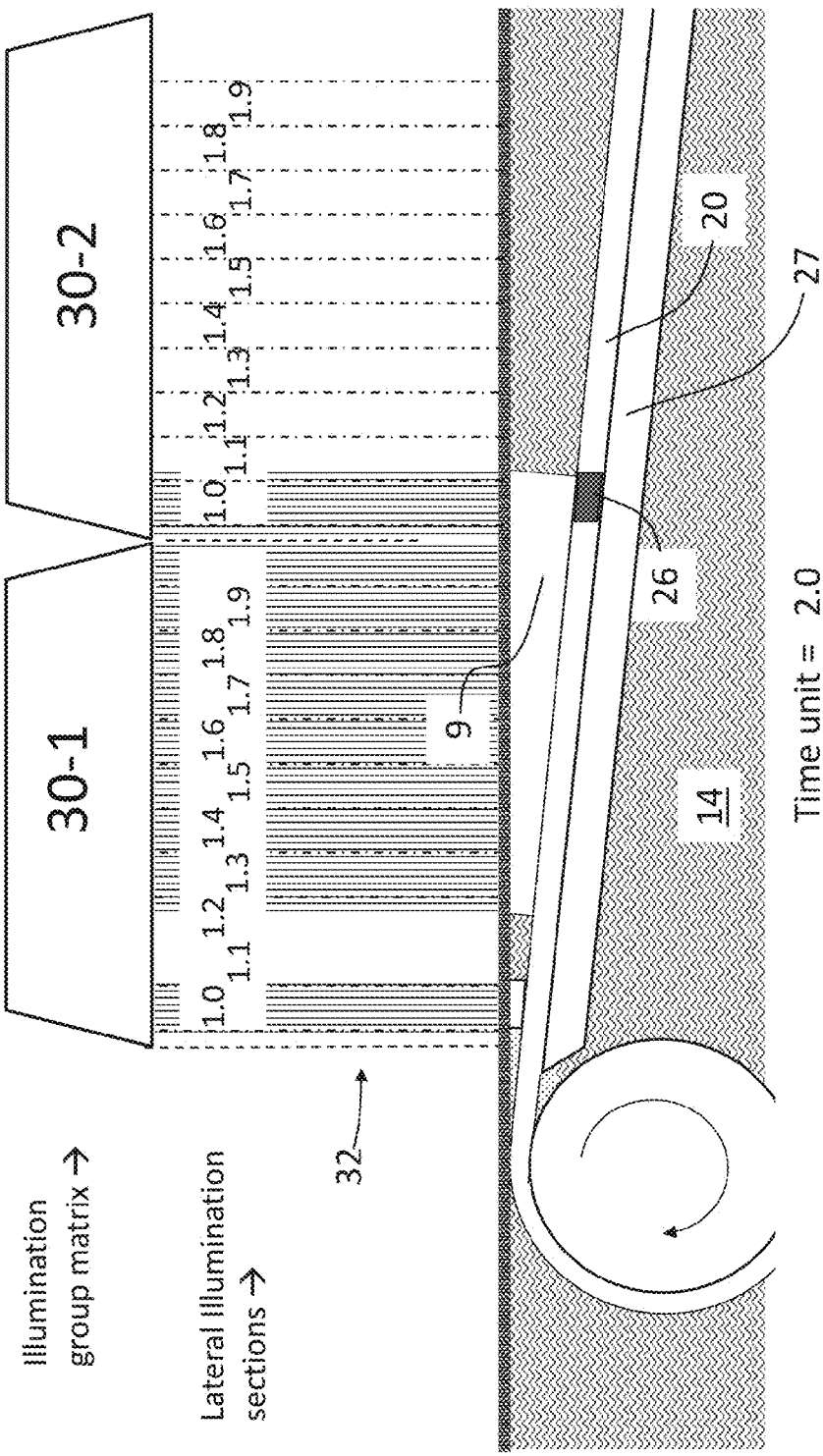
Figure 12C:
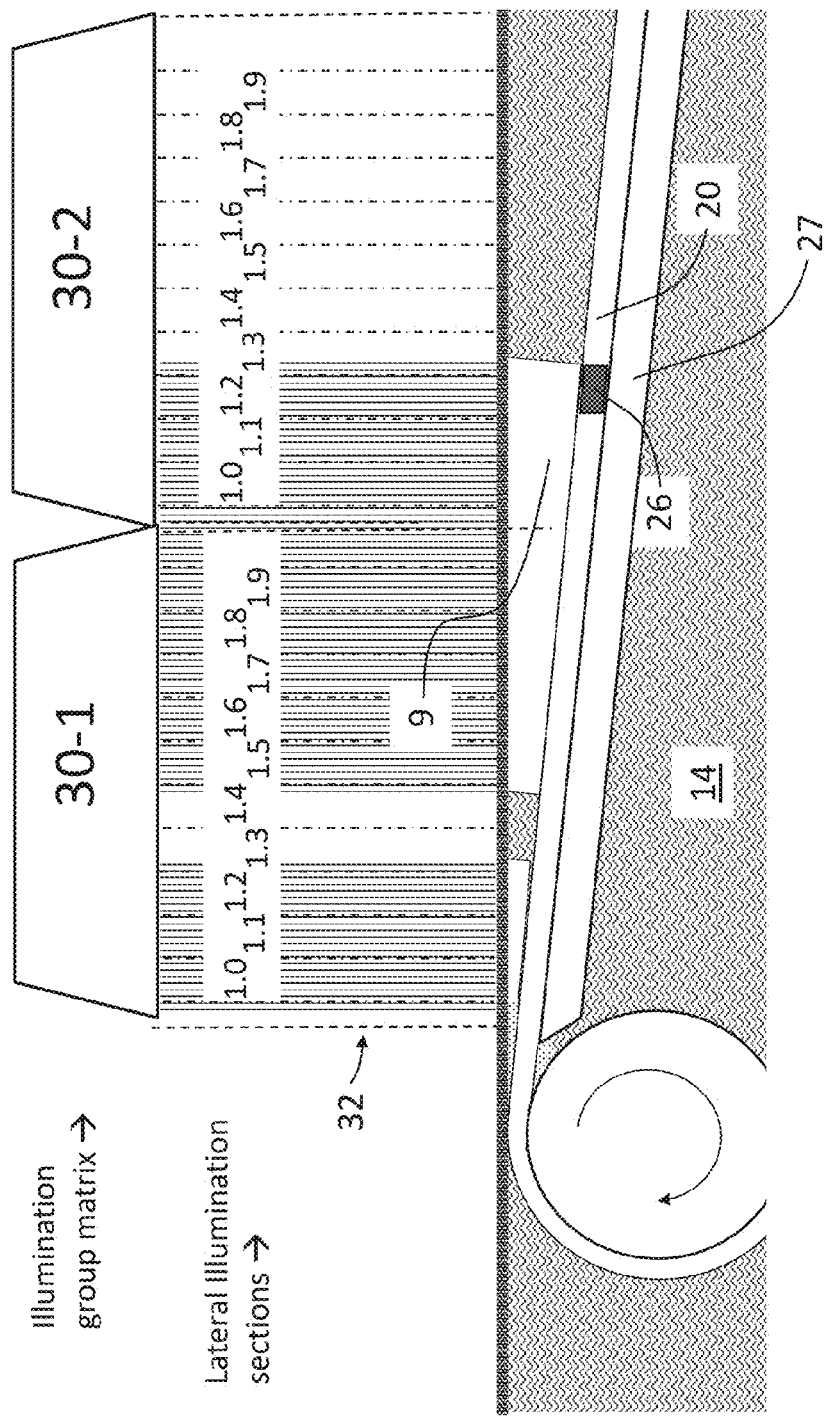
Figure 12D:
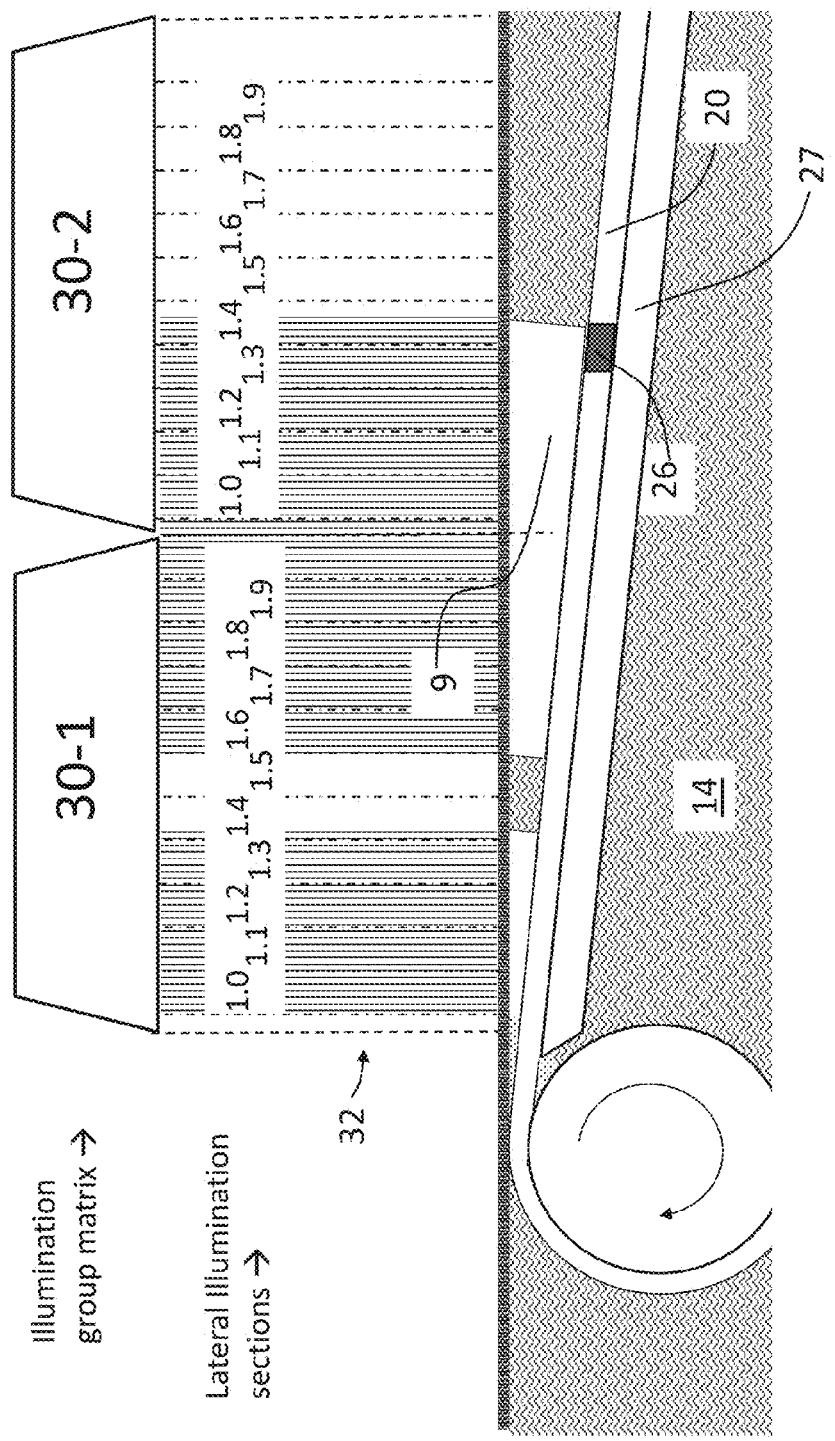
Figure 12E:
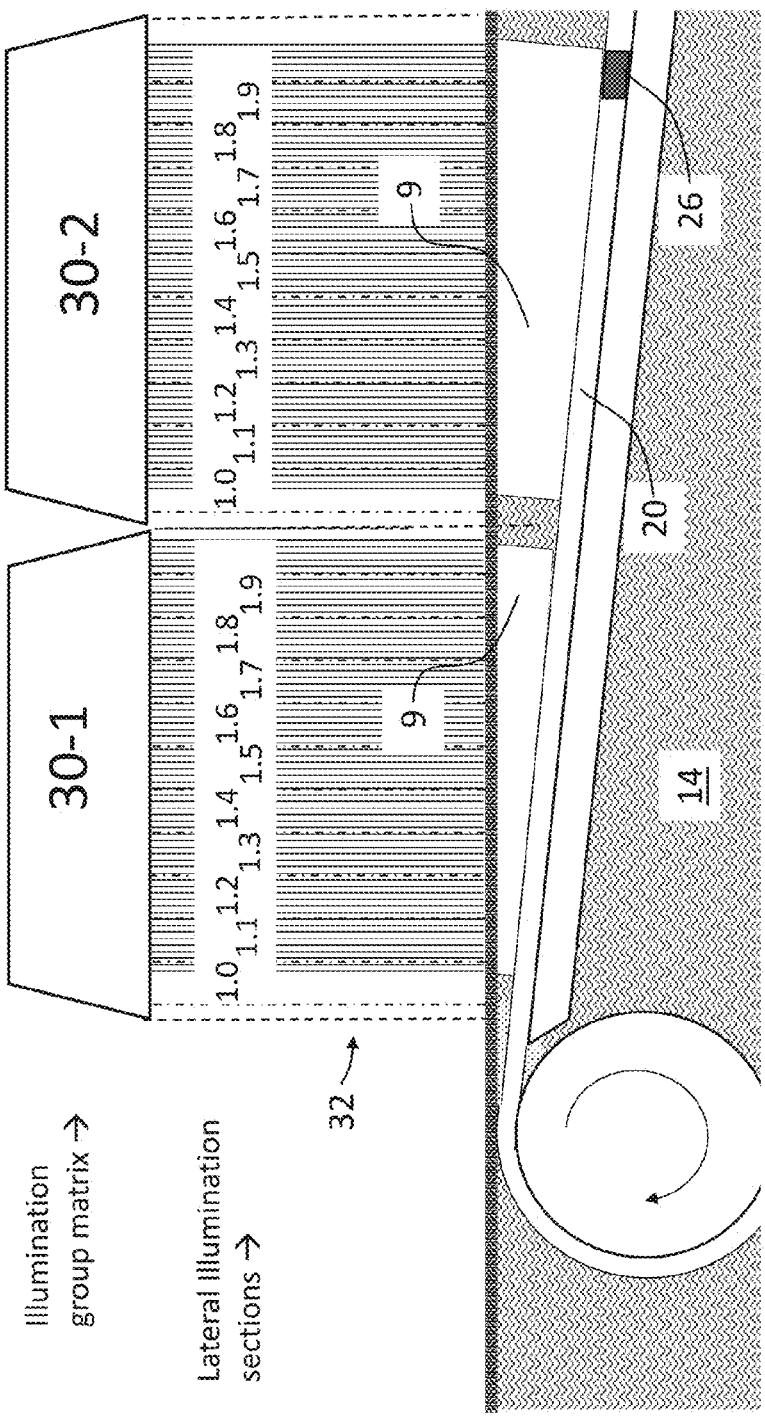

It can be understood that each of the lateral illumination zones, and the incrementing or stepping of the belt 20 and belt marker 26 from one position P to the next position, can be further sub-divided to provide improved resolution of the build 3D object and a smooth and more constant movement of the belt 20. As shown in FIG. 11, as an illustration, the UV light illumination pattern for lateral illumination section 1.0 at time unit T=1.0 (see FIG. 9B and FIG. 10A), can be further subdivided into ten sub-sections 1.00 through 1.09, to provide a finer resolution, while the conveyor belt 20 is moved in sub-steps, corresponding to subunits of time from time T=1.00 through 1.09. Each subunit of time also involves the flooding of the monomer solution over the previously build portion, before polymerizing under the UV light pattern at the next subunit of time.

Figure 13A:
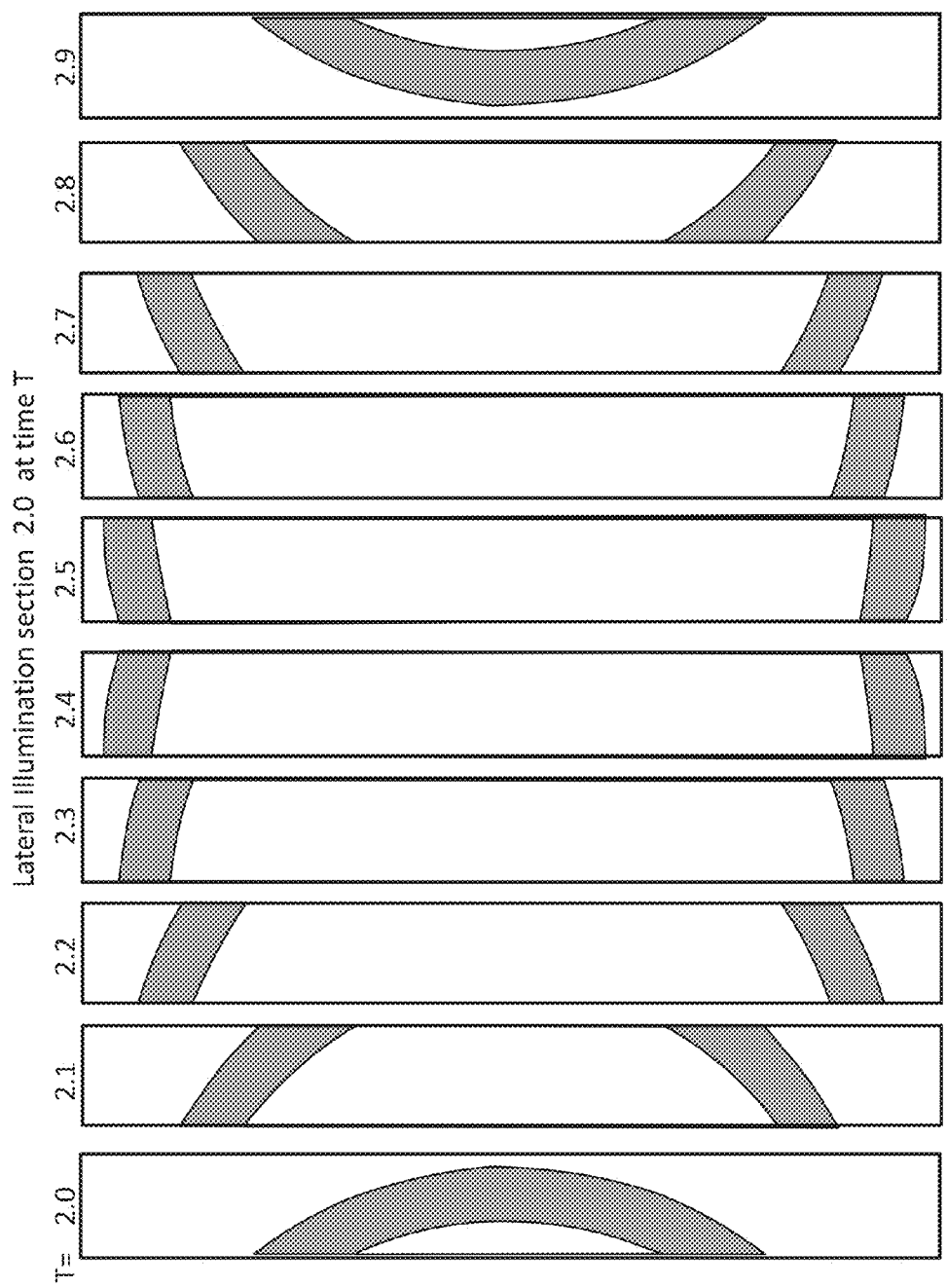
FIGS. 13A and 13B show a pattern of light emitted by the first and last lateral illumination sections of the second group of illuminating elements, at each of the time intervals of movement of the continuous build surface under the second group of illuminating elements
Figure 13B:
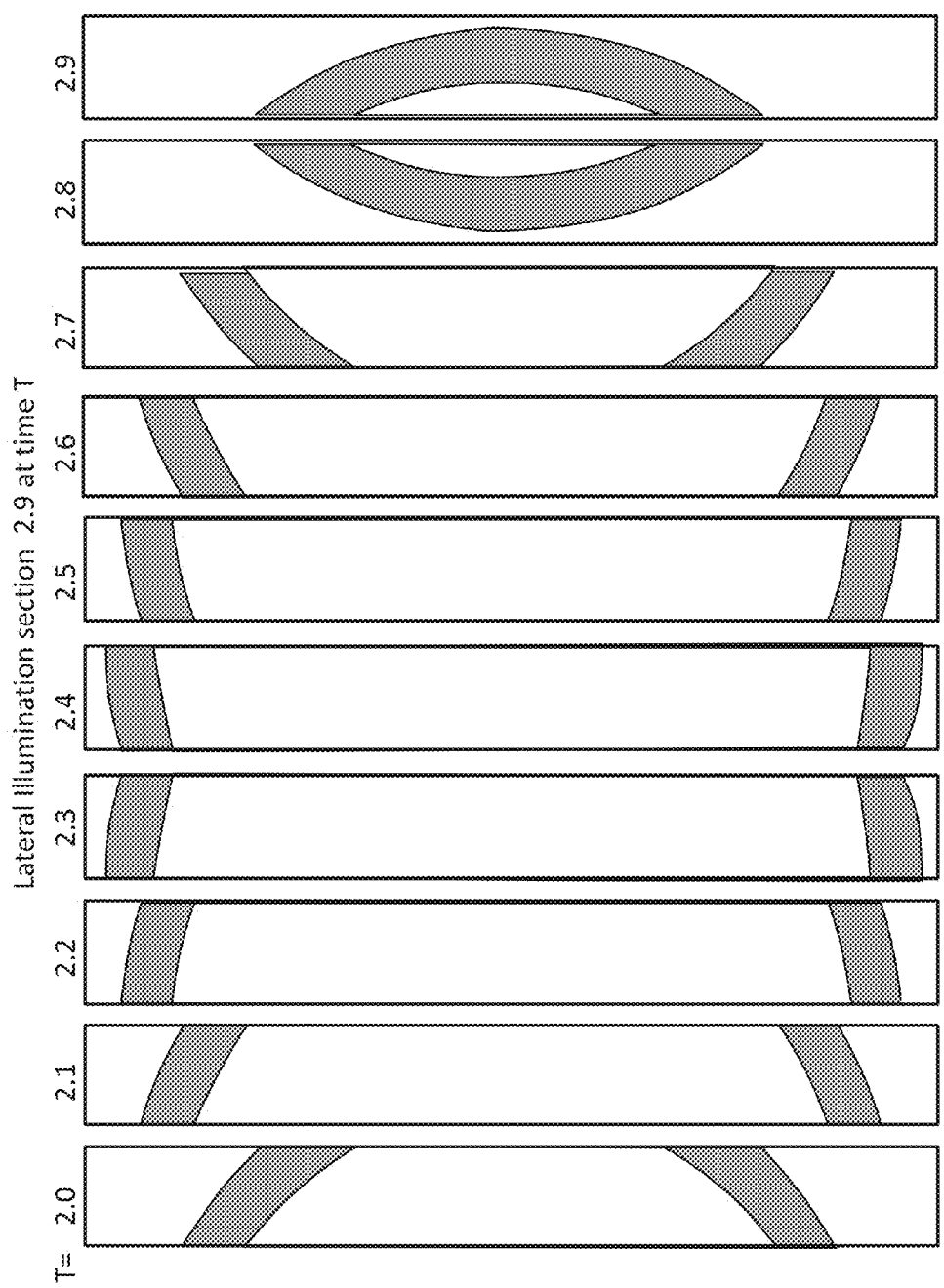

FIGS. 12A-12E illustrate the belt travel and further building of the built object 9 as it progresses under the second illumination unit 30-2 and into time unit 2.0. It is noted that, while the building of the second build layer 2 (on top of the first build layer 1) is initiated and proceeds, the remaining build portions of first build layer 1 are being completed under the first illumination unit 30-1. FIGS. 13A and 13B illustrate the UV light illumination patterns of the lateral illumination sections 2.0 and 2.9 (as examples) during each of the time units 2.0-2.9 corresponding to the belt movement through ten steps or stages.

Figure 14A:
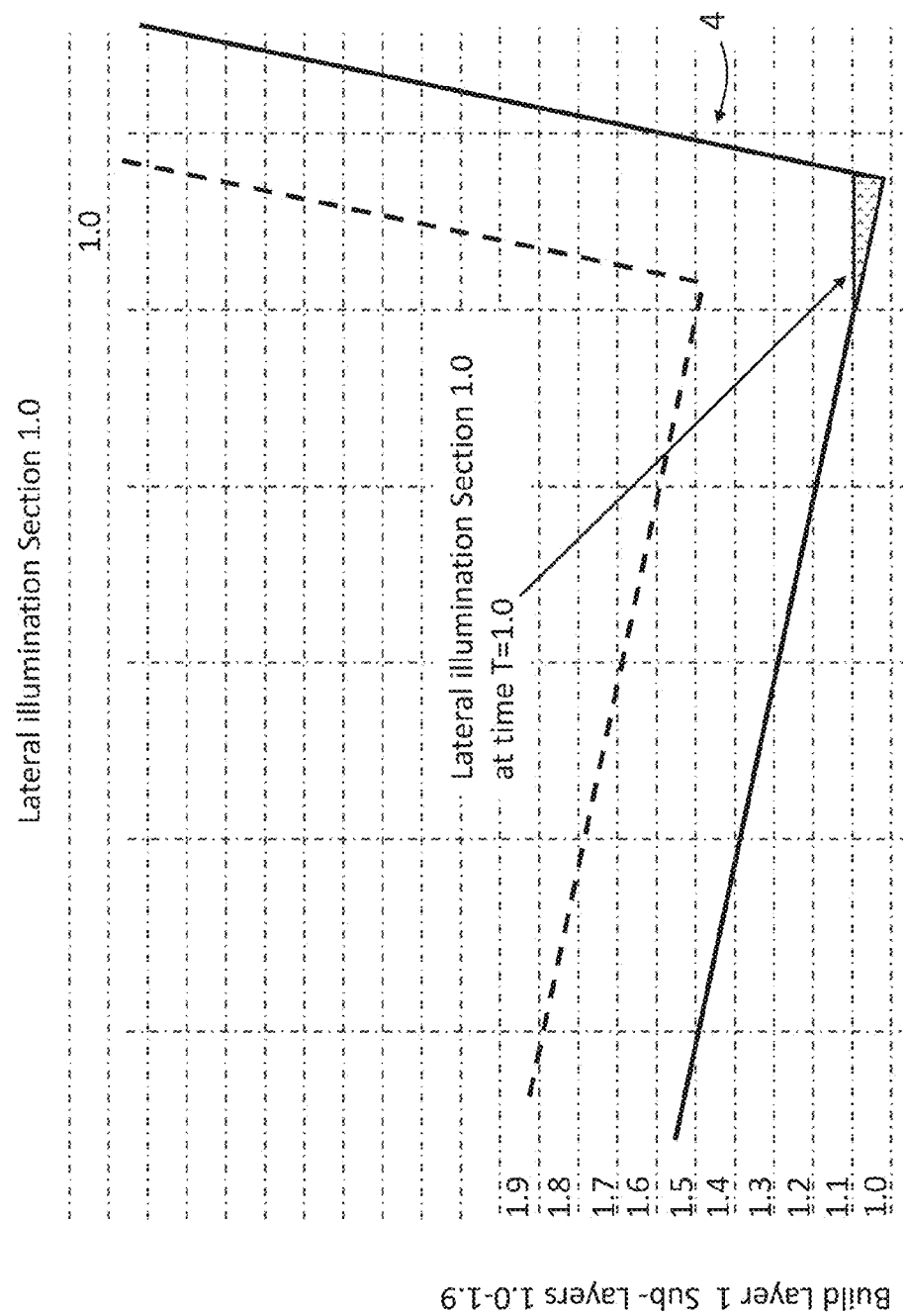
FIGS. 14A through 14J depict the building of sublayers and lateral sections of the 3D object at each time interval of the movement of the continuous build surface under the first group of illuminating elements.
Figure 14B:
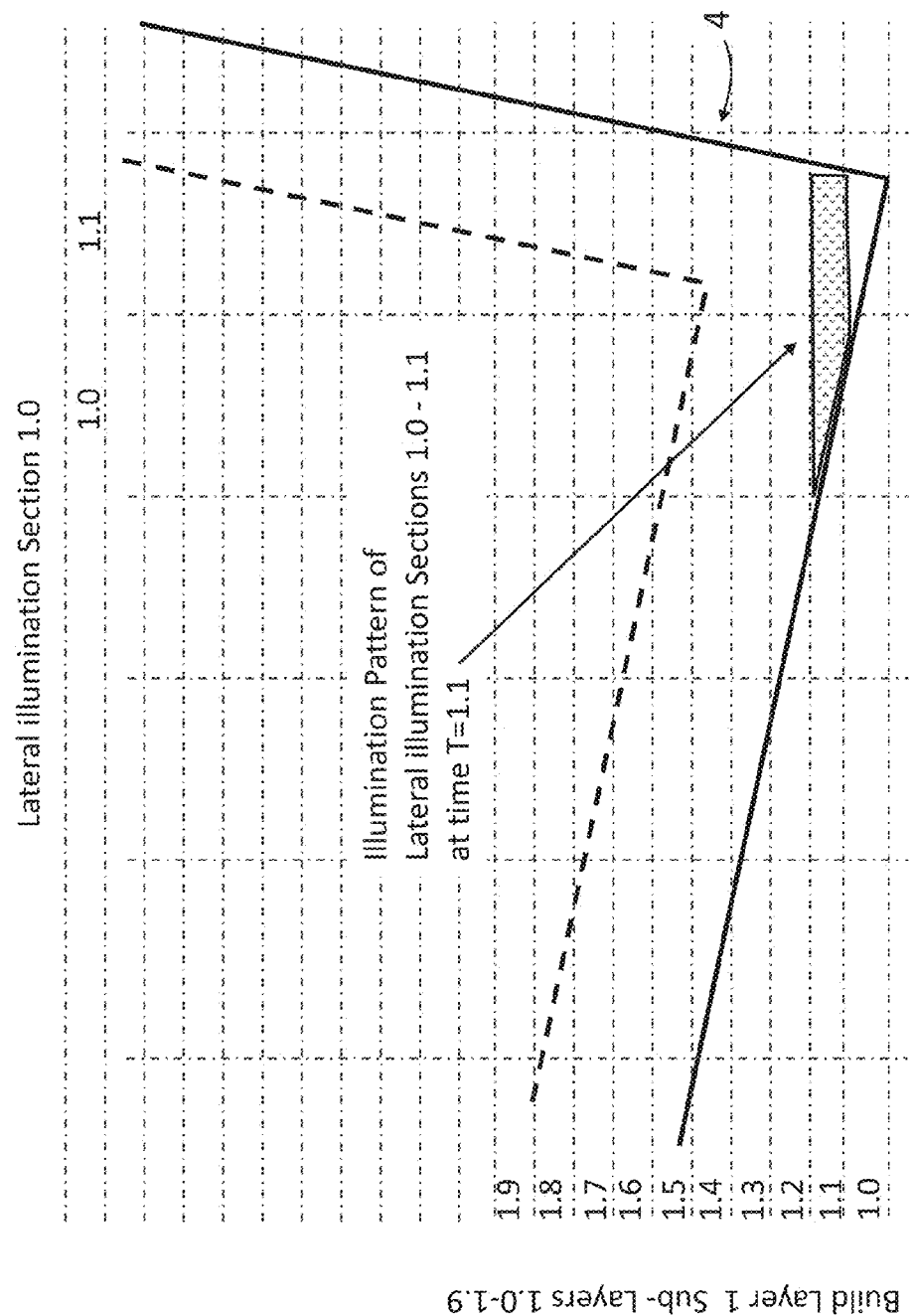
Figure 14C:
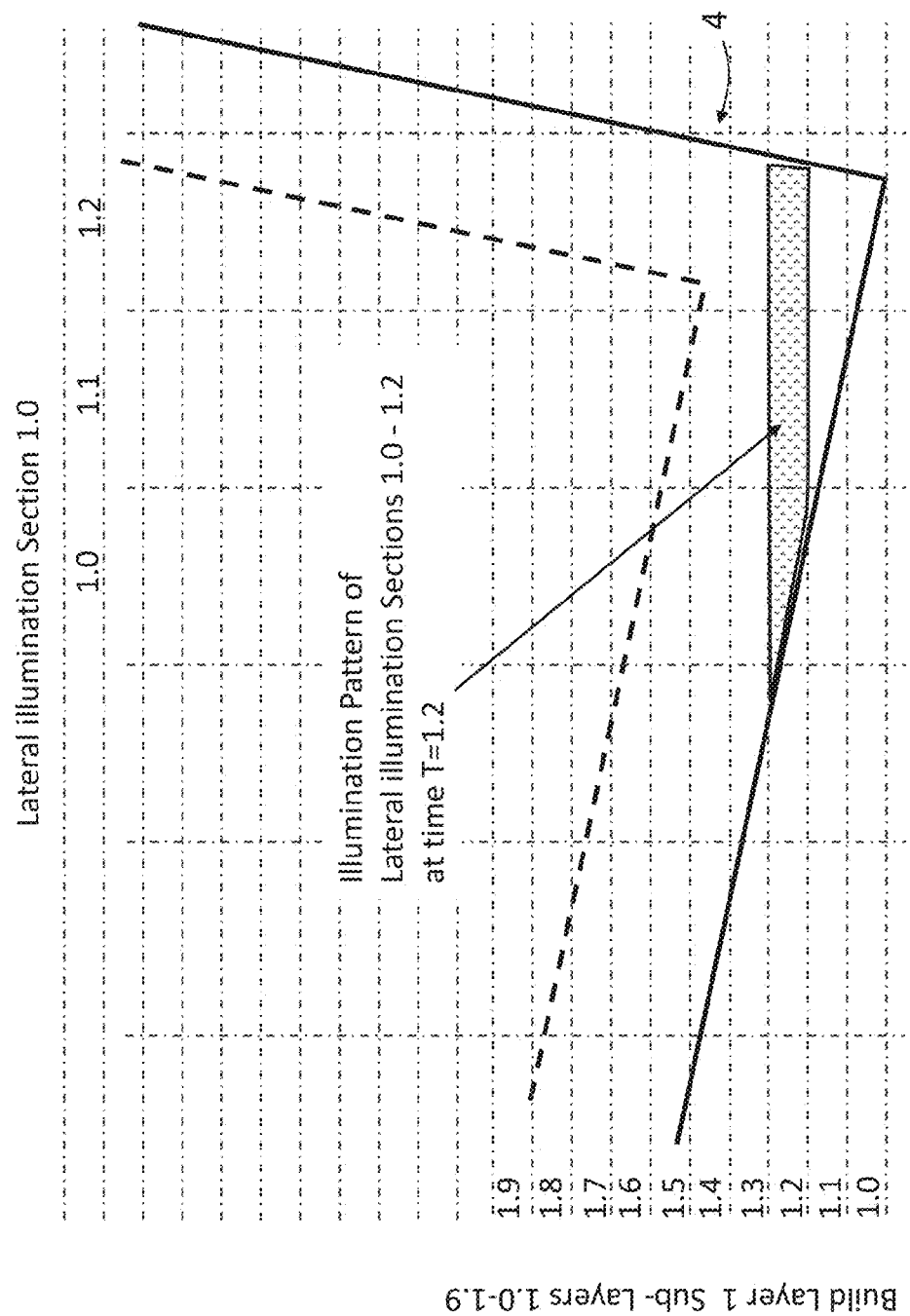
Figure 14D:
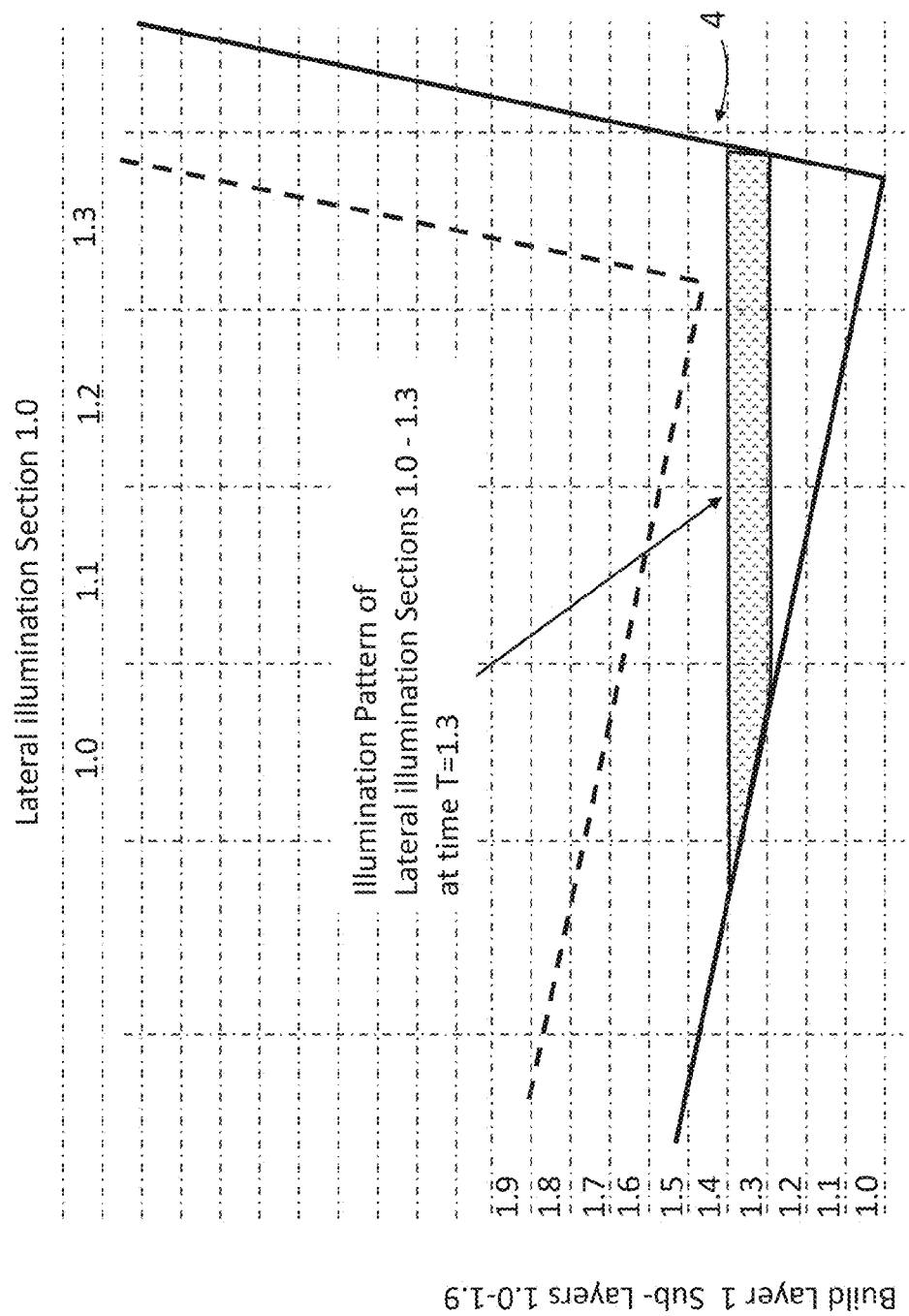
Figure 14E:
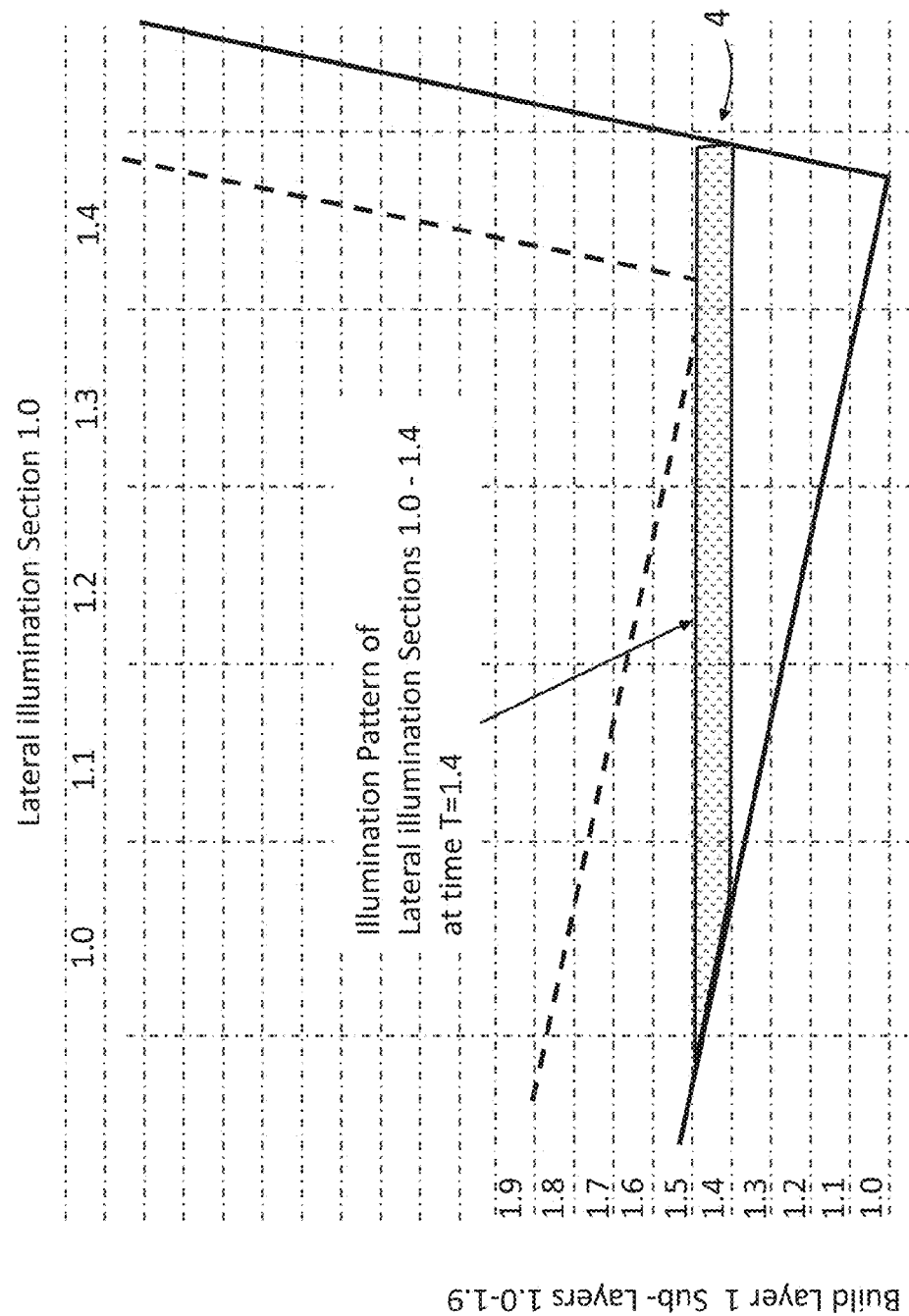
Figure 14F:
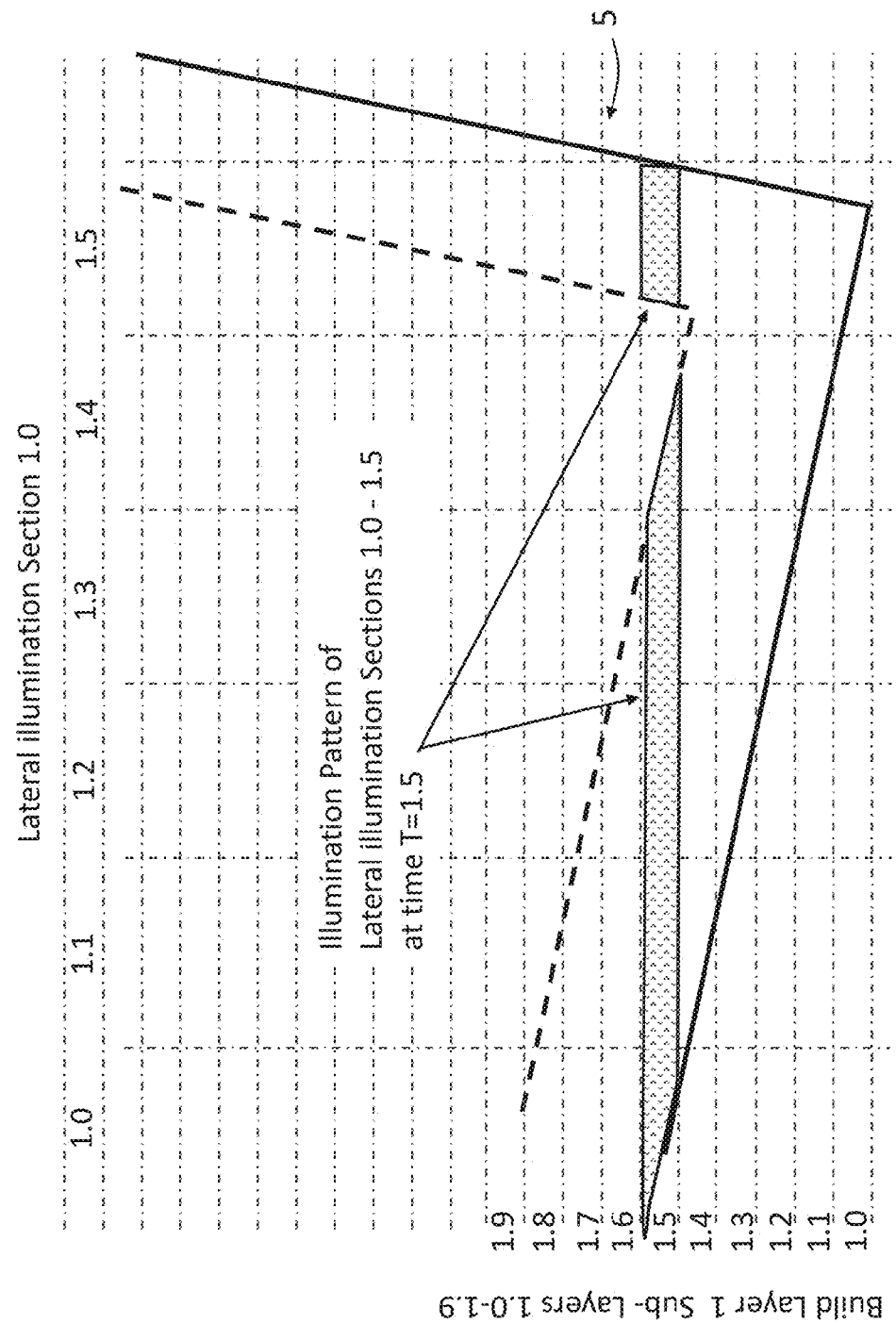
Figure 14G:
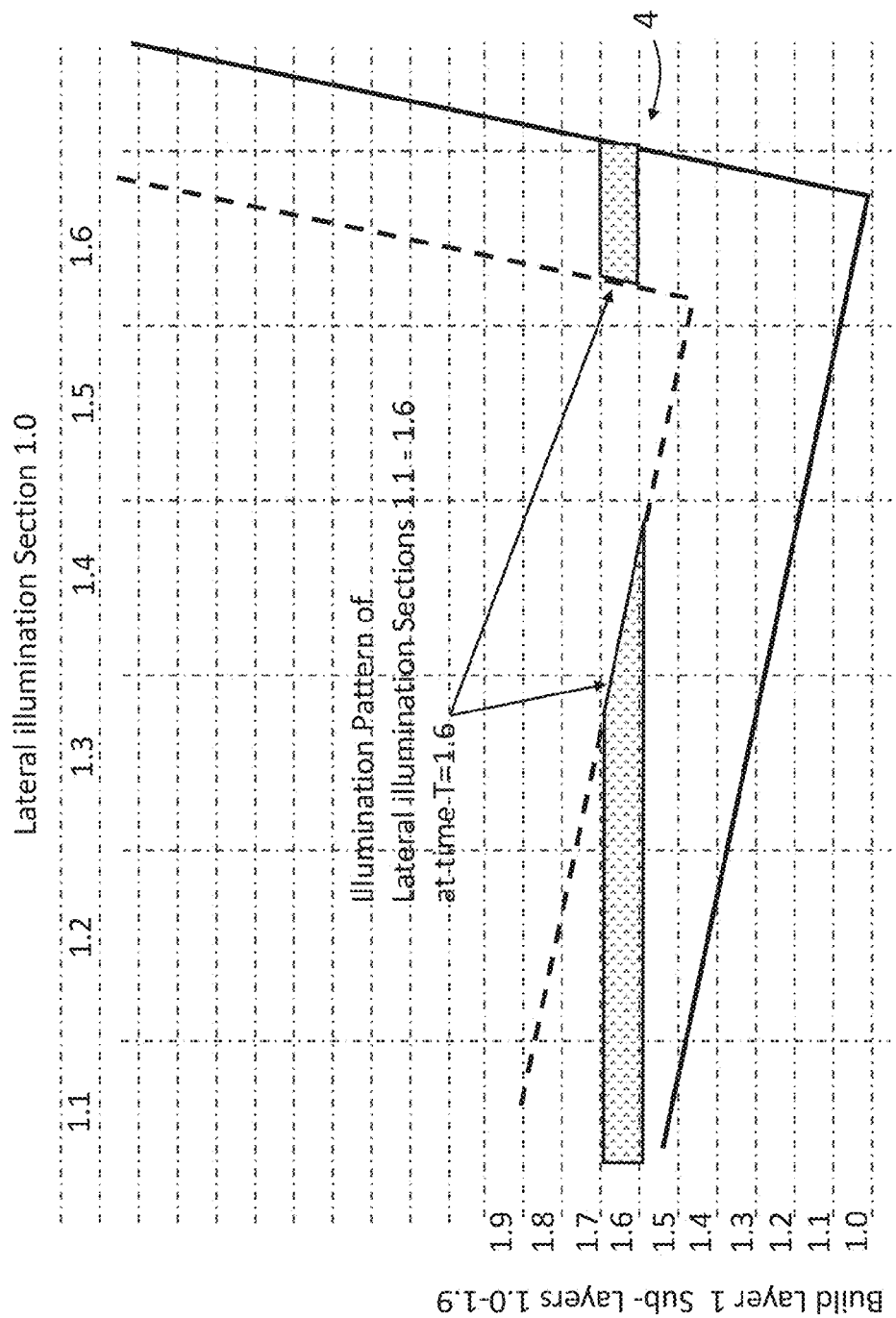
Figure 14H:
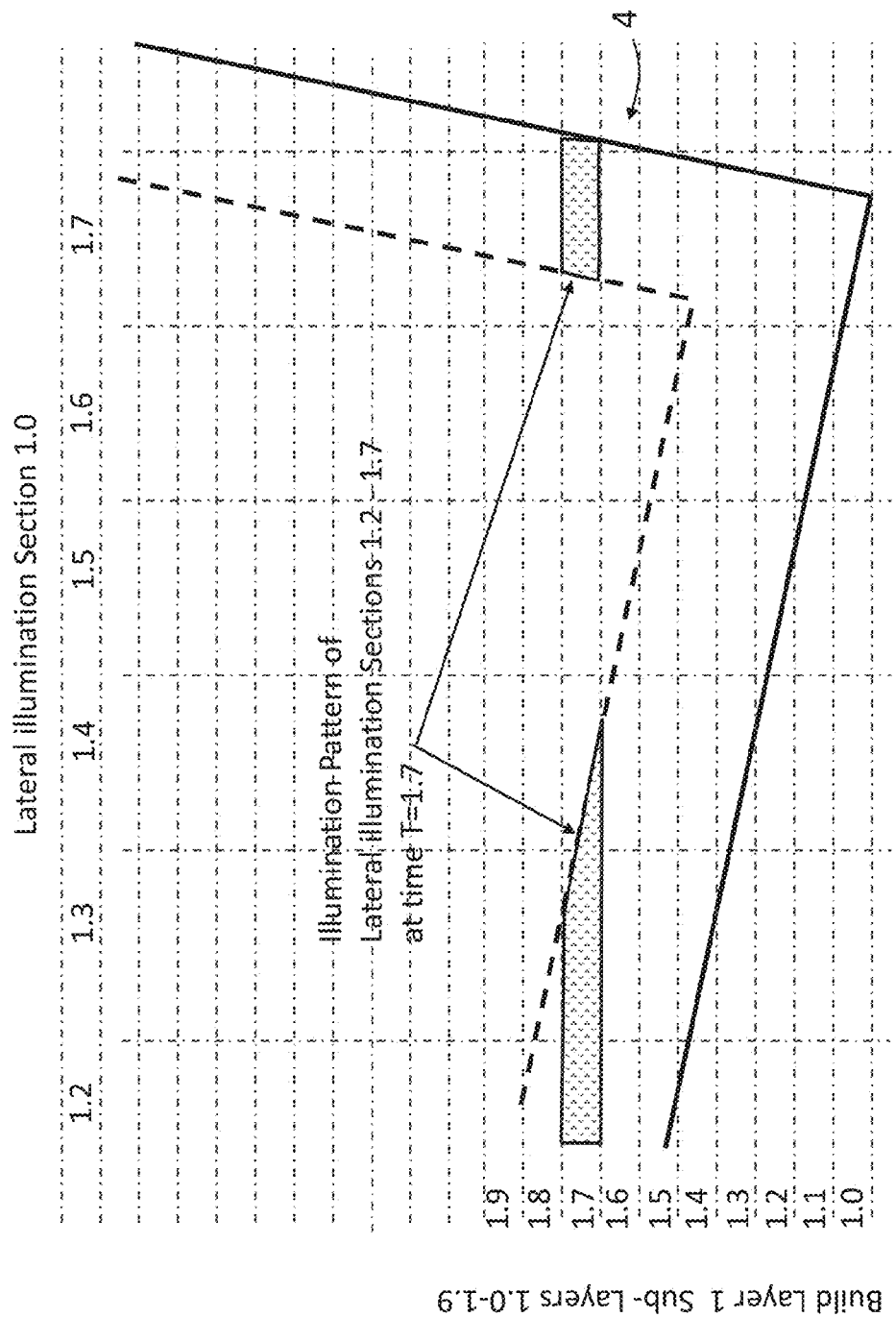
Figure 14L:
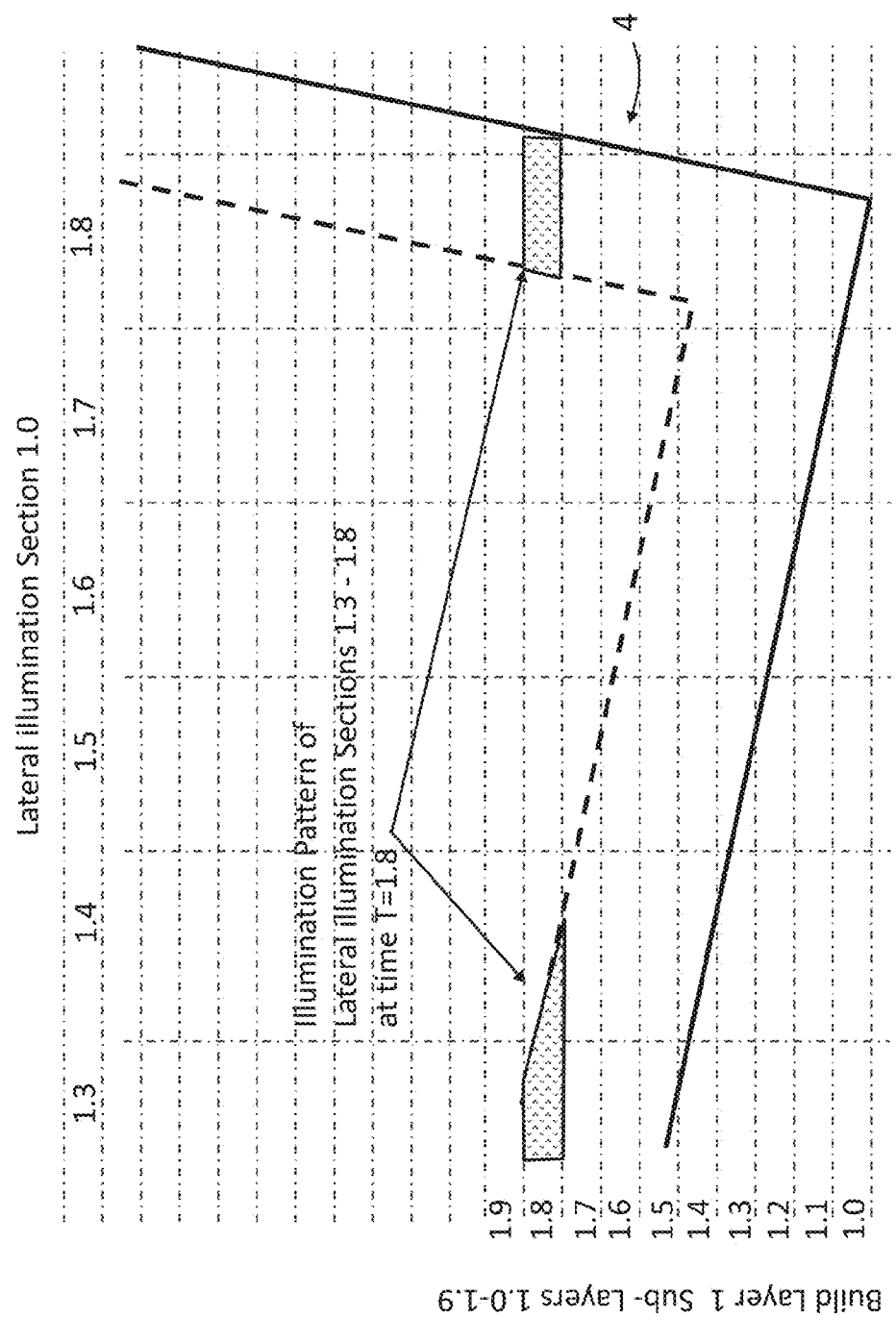
Figure 15G:
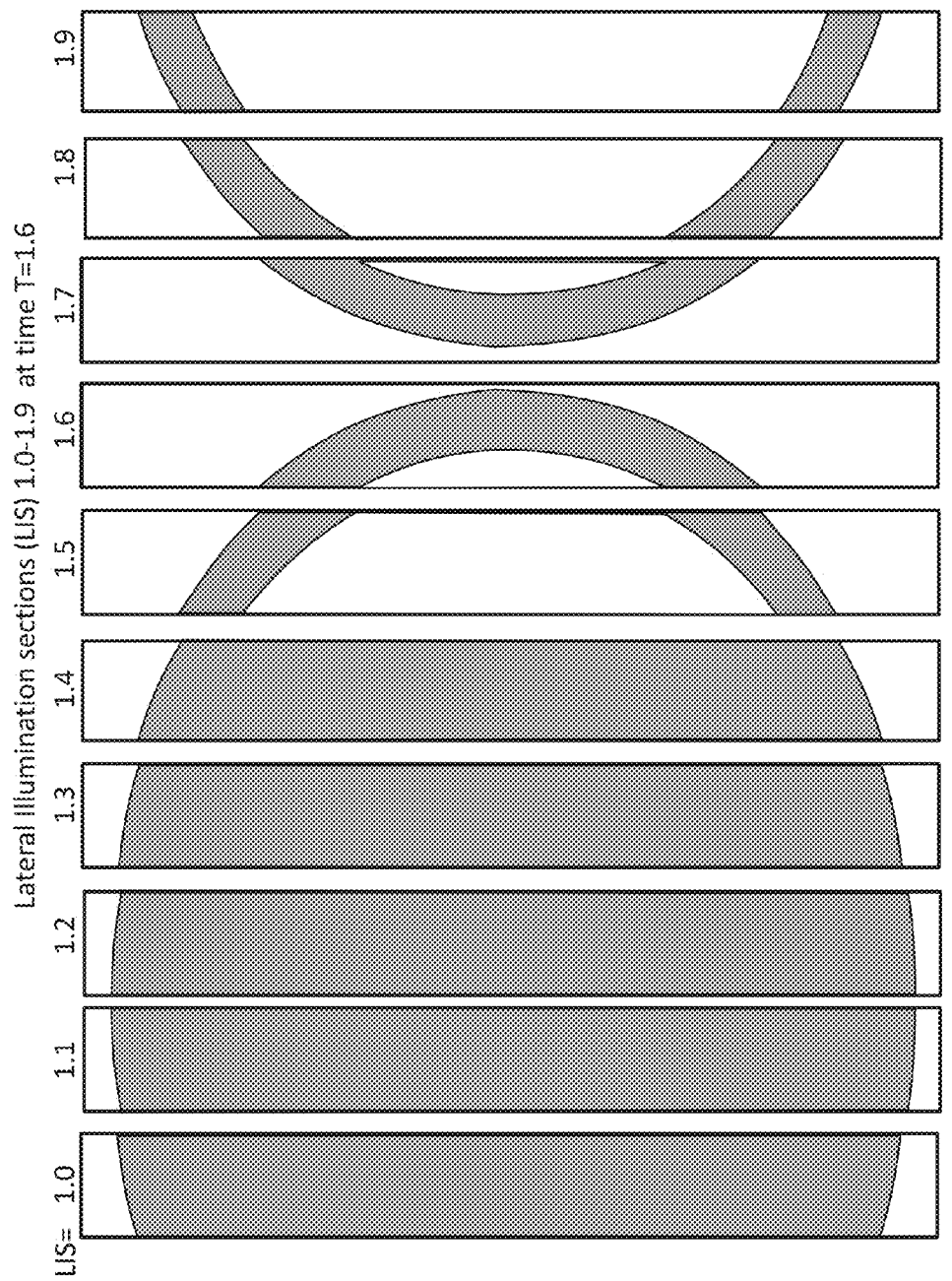
FIGS. 15A through 15J show a pattern of light emitted by the series of lateral illumination sections of the first group of illuminating elements at each time interval of the movement of the continuous build surface under the first group of illuminating elements.
Figure 15L:
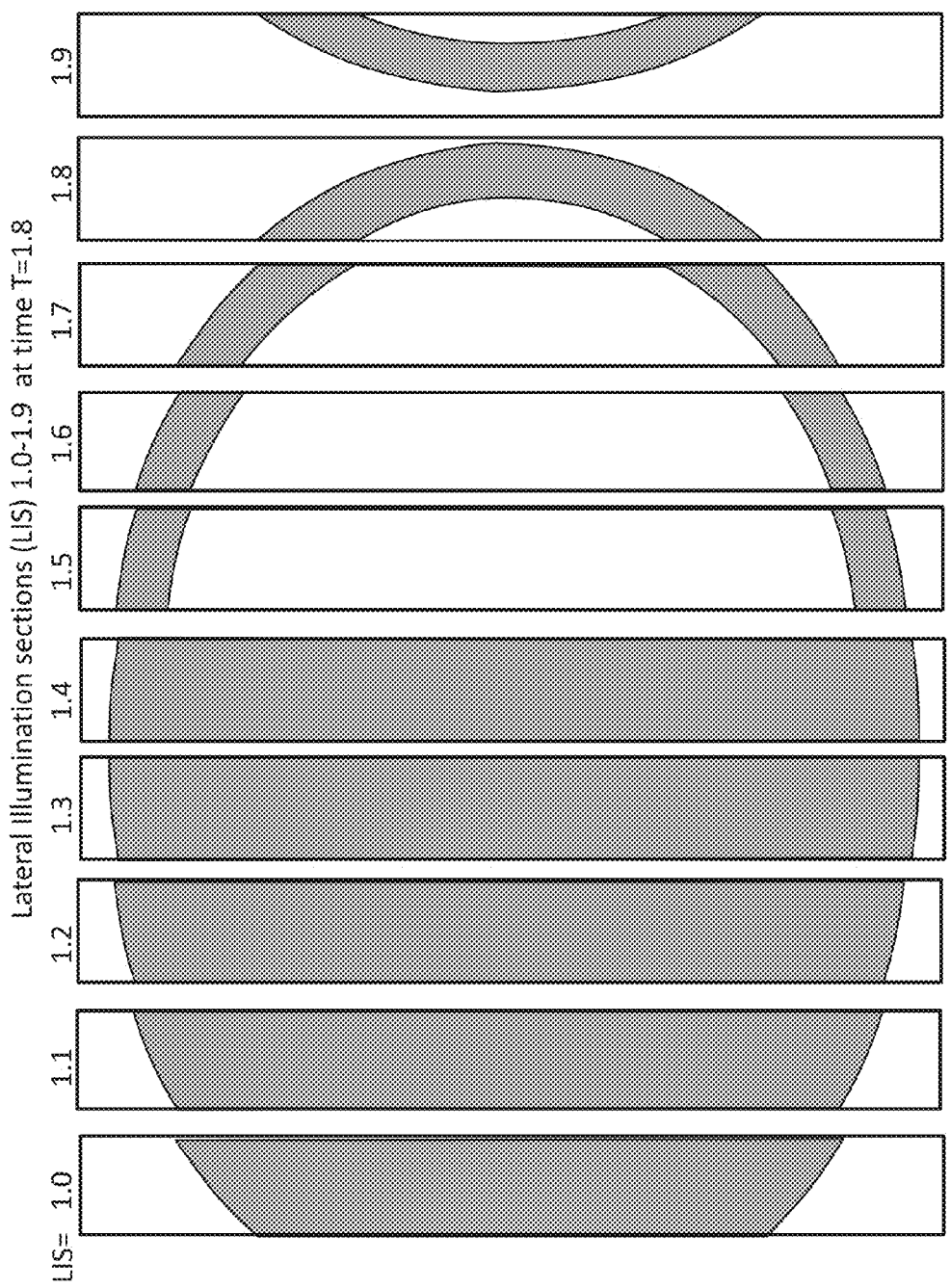

In an alternative embodiment, the conveyor and illuminators can be programmed to build layers in accordance with the slicing program on the tilted object shown in FIGS. 5 and 6B. FIG. 14A illustrates the sub-layers of the first build layer of a 3d object 4 defined by the slicing program. FIGS. 14A through 14J also illustrate the respective build sub-layers of the 3d object 4 formed as the conveyor belt progresses under the UV light emitter 30 in building a single 3D object as shown in FIGS. 9A-9M, and using the UV light patterns shown in FIGS. 15A through 15I, respectively. FIG. 14A shows the polymerization of the sublayer 1.0 of the tilted 3D object using the pattern of UV light of lateral illumination section 1.0 of emitter unit 30-1 at time unit T=1.0. FIG. 14B shows the polymerization of the sublayer 1.1 of the tilted 3D object using the pattern of UV light of lateral illumination sections 1.0 and 1.1 of emitter 30-1 at time unit T=1.1. FIG. 14C shows the polymerization of the sublayer 1.2 of the tilted 3D object using the pattern of UV light of lateral illumination sections 1.0-1.2 of emitter unit 30-1 at time unit T=1.2. And so on. (The pattern at a particular time unit for a particular subsection of the UV emitters 30-1 in FIGS. 15A-15J is identical to those of FIGS. 10A-10J for the first 3D object 1 being made.)

In another embodiment of the invention, FIGS. 16A, 16B, and 17A through 17D illustrate an apparatus 210 and process for making a 3D object on a continuous belt conveyor 16 having belt rollers 18 to drive a conveyor belt 20 that ascends along and up out of a container 11 filled with a monomer solution 14. A 3D object is formed adhered to the lower surface 25 of the build platform (belt 20), and is built vertically downward, exposing a surface layer of the monomer solution, which is adjacent to the build platform and to previously-built material, to a curing agent or reaction agent that results in polymerizing the monomer in the monomer solution into new, polymerized build material. As the build platform continuously ascends from the monomer solution, the freshly built layers of the 3D object continuously extend downward and into the monomer solution, with successive layers of monomer solution being polymerized (or agglomerated) onto the previously built layers, until the object is completed. The completed 3D object then can be released from the downward-facing surface of the build platform and be collected.

The conveyor belt 20 has a reference marker 26 marked in black, and is pitched at an angle α upwardly. The angle α upward can be any acute angle. The angle α can be at least 2 degrees, and up to about 45 degrees; more particularly at least 10 degrees, and up to about 30 degrees, and more particularly at least 15 degrees, and up to about 25 degrees. It is otherwise similar to the belt described herein above. The conveyor belt 20 is positioned to begin to ascend up through and out of the monomer solution 14. As shown in the embodiment illustrated in FIG. 16A, the bottom 13 of the container 11 can be comprised of a light transparent plate made of a light-transparent material. One or more UV light emitter units 30 are arranged in series along the length of and beneath the container, and are oriented to emit light beams 32 upward and through the transparent bottom 13 of the container 11. In an alternative embodiment, a series of mirrored surfaces and be positioned beneath the container to reflect the emitting light beams 32. A series of 3D objects can be built on and along the length of the lower surface 25 of the belt 20. The conveyor belt 20 ascends out of the monomer solution 14 to a height sufficient to build a full height of a completed 3D object 1.

In an alternative embodiment shown in FIG. 16B, the one or more UV light emitter units 30 can be disposed inside the monomer solution, in a horizontal orientation below the lower surface 25 of the belt 20. The emitter units include a transparent cover or lens through which the emitted light passes, and the units can be insulated to prevent leakage or electrical grounding within the monomer solution.

As shown in FIG. 17A, illustrating the embodiment of FIG. 16A, the lower surface 25 of the belt 20 at one end is submerged in the monomer solution 14. The belt surface 25 at the marker 26 in position B1 passes very close to the upper surface 15 of the transparent bottom 13. The build process of an object begins by emitting a UV light 32 in a predetermined pattern of emission through the transparent bottom 13 and into the monomer solution 14, directed toward the belt surface 25 at marker 26. The proximity of the belt surface 23 to the upper surface 15 of the transparent bottom 13 in the monomer solution positioned between the belt surface 23 and the upper surface 15 of the bottom 13 to polymerize (as described above) into a built material 200 that adheres to the belt surface 25. The polymerized thermoplastic material 200 may adhere to the upper surface 15 of the bottom 13, but substantially less tenaciously than to the surface 25 of the belt. The bottom 13 can be made of a material that inhibits or prevents a thermoplastic material that has been polymerized at or adjacent the upper surface 15 from adhering to such surface. The bottom 15 may also be made of an oxygen-permeable material. The presence of oxygen at the inside surface of the bottom 15 may be sufficient to inhibit polymerization of the monomer from occurring right at the interface, without interfering with the polymerization of monomer further into the depth of the monomer solution 14.

In an alternative embodiment of the invention, the degree of polymerization of the monomer in the monomer solution can be controlled to at least form a three-dimensional structure having sufficient dimensional stability and rigidity, to maintain the orientation and dimensions of the built object during ordinary and customary build conditions, but not polymerized sufficiently for the built material to adhere or stick tenaciously to the transparent bottom.

As the belt 20 moves under drive control through and upward within the monomer solution 14, the underside surface of the build material 200 is raised up and away from the bottom surface 15, and exposed to fresh monomer solution. Monomer solution 14 also floods between the belt surface 25 and the container bottom surface 15 at position B1. Emitting the UV light 32 in another predetermined pattern of emission through the transparent bottom 13 and into the monomer solution 14 results in a second built layer in registry with the first built layer 200, and second built layer (designated 201 in FIG. 3) trailing adjacently the first built material 200, collectively shown as built material 209 in FIG. 17B. A method of building a 3D object includes repeated cycles of incremental movement of the belt along the path, to separate the polymerized material from the bottom surface 15 of the container bottom; flooding of fresh monomer solution beneath the built portion 209 or belt surface 25; polymerization of monomer solution between the underside of the previously-built polymer surface (and belt surface), using pre-determined UV light patterns as described above.

Figure 17C:
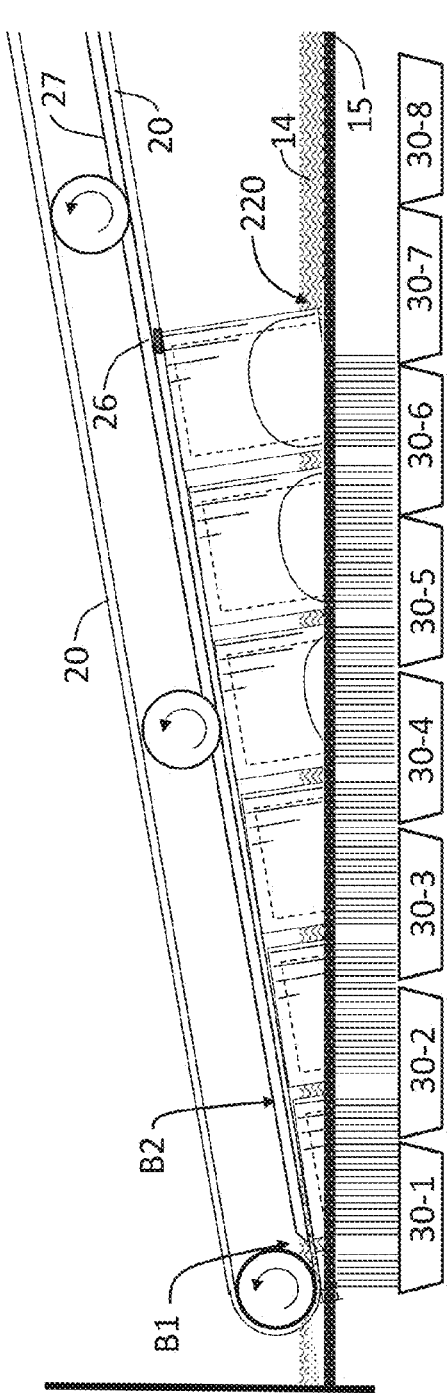

FIG. 17B illustrates the build process after completing the building of a first complete build layer 210 (the base build layer 1 in FIG. 3) of the first 3D object, at the marker 26 in position B2. The process continues to build and complete the remaining build layers of the first 3d object, as a second 3D object is initiated at position B1. The process then continues to build successive build layers of the first and second 3D objects, and to initiate and build $3^{rd}$, $4^{th}$, $5^{th}$ and $6^{th}$ objects, as shown in FIG. 17C.

In FIG. 17C, the process has completed a leading end 220 of the last complete build layer of the first 3D object (the upper-most build layer 14 in FIG. 3). As the belt proceeds forward, further building upon the leading end 220 of the last complete build layer is prevented by avoiding exposure to the UV light from UV light emitter units 30-6. Once separated from the bottom surface 15 by a sufficient depth, further building upon the leading end 220 is not possible as the belt 20 progresses.

Figure 17D:
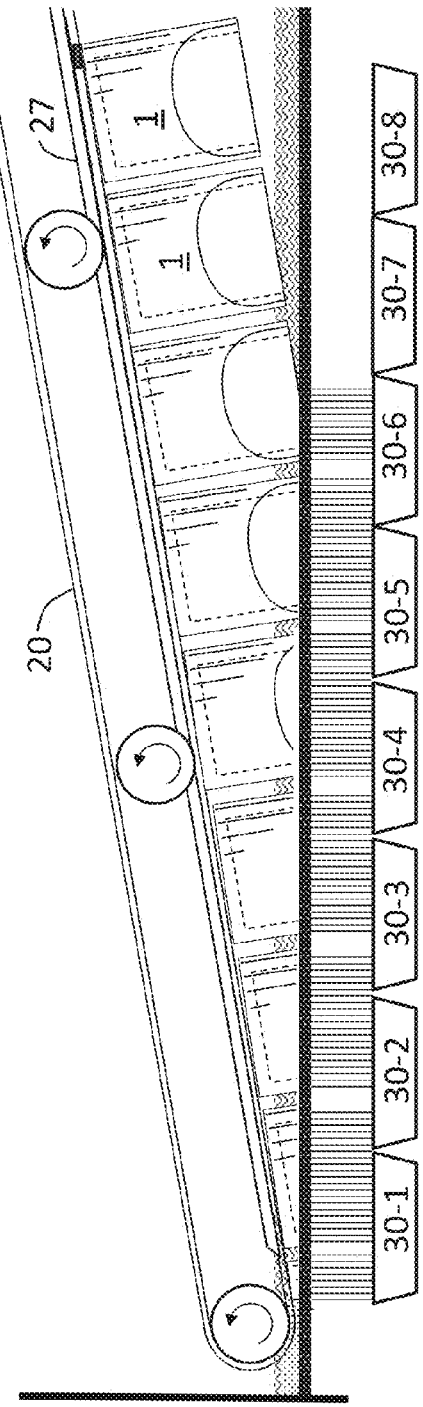

FIG. 17D shows the completion of built and completed 3D objects 1, raised up out of the monomer solution 14, which are then removed from the belt 20, washed and further processed.

FIG. 18A shows 3D printing apparatus 310 for building a 3D object on a continuous build surface that descends along and down into a container filled with a fluidizable powder, in the state of fluidization with a fluidizing gas. The printing apparatus 310 includes a build platform consisting of a conveyor belt 320 having a top-side build surface 322 that continuously descends down into a powder bed. After fusing a uniform layer of a fusable or agglomerable powder into a single layer of a partially-built 3D object 7 according to a programmed 3D model, the bed of powder material 313 within which the 3D object and the printing apparatus 310 reside is fluidized using a gas to form a fluidized powder 314. The gas 356 is introduced into a lower chamber 352 through one or more inlet ports 354, and passes up through a gas-permeable, powder impermeable floor 358 in the bottom of the container. Fluidizing of the powder can be by any other well-known and familiar fluidization technique. The fluidization mobilizes and reduces the bulk density of the bed of powder 313 to permit the movement of the 3D objects 7 disposed along the descending conveying belt 320 with little or no resistance. Excess powder material 313 is added to the bed using any means known to those skilled in the art to maintain a sufficient quantity of powder inside the printing apparatus.

Once the conveying build surface 322 of the belt 320 supporting the 3D objects 7 has been positioned in the proper position for forming the next layer of the 3D object, the fluidization is slowed and halted, slowing the powder 313 to settle and pack into a stable bed 315 of powder as shown in FIG. 18B. The excess powder ensures that there is sufficient powder 313 covering the 3D objects 7 for building the subsequent layer. The thickness and uniformity of a new layer 317 of powder can be formed over the previous build layer by well-known means, such as by running a blade 364 moving along a horizontal track 360 at a fixed distance above the build surface to form the layer 317 of powder with a uniform thickness. The uniform layer 317 of powder is then fused or agglomerated selectively to add a new fused or build layer to the upper surface of the 3D object.

The cycle of adding excess powder, fluidizing, positioning the conveyor, stabilizing and packing the powder bed, forming the uniform thickness of powder, and fusing or agglomerating the powder layer is repeated until a completed 3D object is formed. After the printing is completed, the finished 3D object is removed from the remaining powder material within which the object is embedded, manually or by any mechanical extraction means as known to those skilled in the art.

FIG. 19A an elevation view of an apparatus 410 for building a 3D object on a continuous build surface that ascends along and up through a fluidizable powder material 313. The printing apparatus 410 can include a build platform adapted to have a bottom-side build surface consisting of the lower surface 25 of the conveyor belt 20 that continuously ascends up through a fluidized bed 314 of powder material 313. The apparatus 410 has a bottom 13 comprised of a light transparent plate made of a light-transparent material. One or more UV light emitter units 30 are arranged in series along the length of the container, and are oriented to emit light upward and through the transparent bottom 13 of the container 11 for fusing or agglomerating a layer of the powder material 313 into a solid layer portion of a partially-built 3D object 7. At the lower end 21 of the conveyor belt 20, most proximate the transparent bottom 13, a first layer of fused or agglomerated powder material is formed onto the build surface 25 by fusing or agglomerating a thin layer 316 of powder material 313 disposed between the transparent bottom surface 13 and the build surface 25.

After fusing the first layer, the bed of powder 313 within which the 3D object and the conveyor 12 reside is fluidized by a gas into a fluidized bed 314 (FIG. 19B) to mobilize the powder material 313 and reduce the bulk density of the bed 314 of powder, to permit the movement of the 3D objects along the ascending conveying belt 20 with little or no resistance from the powder material 313. The quantity of powder material 313 within the apparatus can be a limited amount, sufficient to maintain a layer along and between the transparent bottom surface 313 and the last build layer of the 3D object 7, and to account for the build powder 313 that is fused into the previously-build layer of the 3D object 7. A means is provided to providing a compact, stable layer 316 of the powder material 313 between the transparent bottom 13 and the previously-build layer of the 3D object 7. The means can include advancing the conveyor belt 20 a distance beyond the position for forming the next build layer, to permit a sufficient amount of the fluidized bed 314 to pass between the bottom 13 and the 3D object 7 that, when the conveyor belt 20 is retreated back to the position for forming the next build layer, a sufficient and proper amount of the powder material 313 is formed. The means can also include vibrating the bottom 13 of the container 11 to spread and compact the powder 313. A series of 3D objects can be built on and along the length of the lower surface 25 of the belt 20. The conveyor belt 20 ascends out of the powder material 313 to a height sufficient to build a full height of a completed 3D object 1.

The present invention also includes a conveyor apparatus that includes a series of segments, each having an elongated length and width to form a planar build surface. The segments can be an integral element of the conveyor structure itself, or can be connected, including a removably connected, segment connected along the length of the conveyor. The planar build surface are conveyed along the length of the descending, or ascending, conveyor, and can be disposed in a horizontal plane, at an angle to the descending, or ascending, conveyer, or along the same angle as the conveyor. While each of the conveyor embodiments described herein after disposed within an apparatus for conveying the build surface to descending down and into a solution of solution, the conveyors can also be employed in a fluidized powder apparatus, as well as an ascending conveyor.

In the following embodiments, the conveying system can include any continuous pathway that includes means for attaching a segment having a planar build surface and a means for moving the attached segment along the pathway. The attachment of the segment to the conveyor should provide a stable orientation and constant planar angle as the segments moves along the pathway during the additive build process. The features of the conveying system can include those described herein above in earlier embodiments of the invention.

Non-limiting examples of a conveying system include conveying belts, chains, and cables with associated sprockets that pull the belts, chain or cable along the pathway. The conveying belt, chain, or cable includes a fixed base element that moves with belt, chain, or cable. The means for attaching a segment can include a mechanical or magnet element for securing the body of the segment to the base element. Other non-limiting examples of a conveying system include a one or more stationary tracks or rails with associated rollers that roll along the pathway defined by the tracks and rails. The rollers are fixed to a base element or directly to the segment having the planar build surface, for transport along the pathway.

Figure 20:
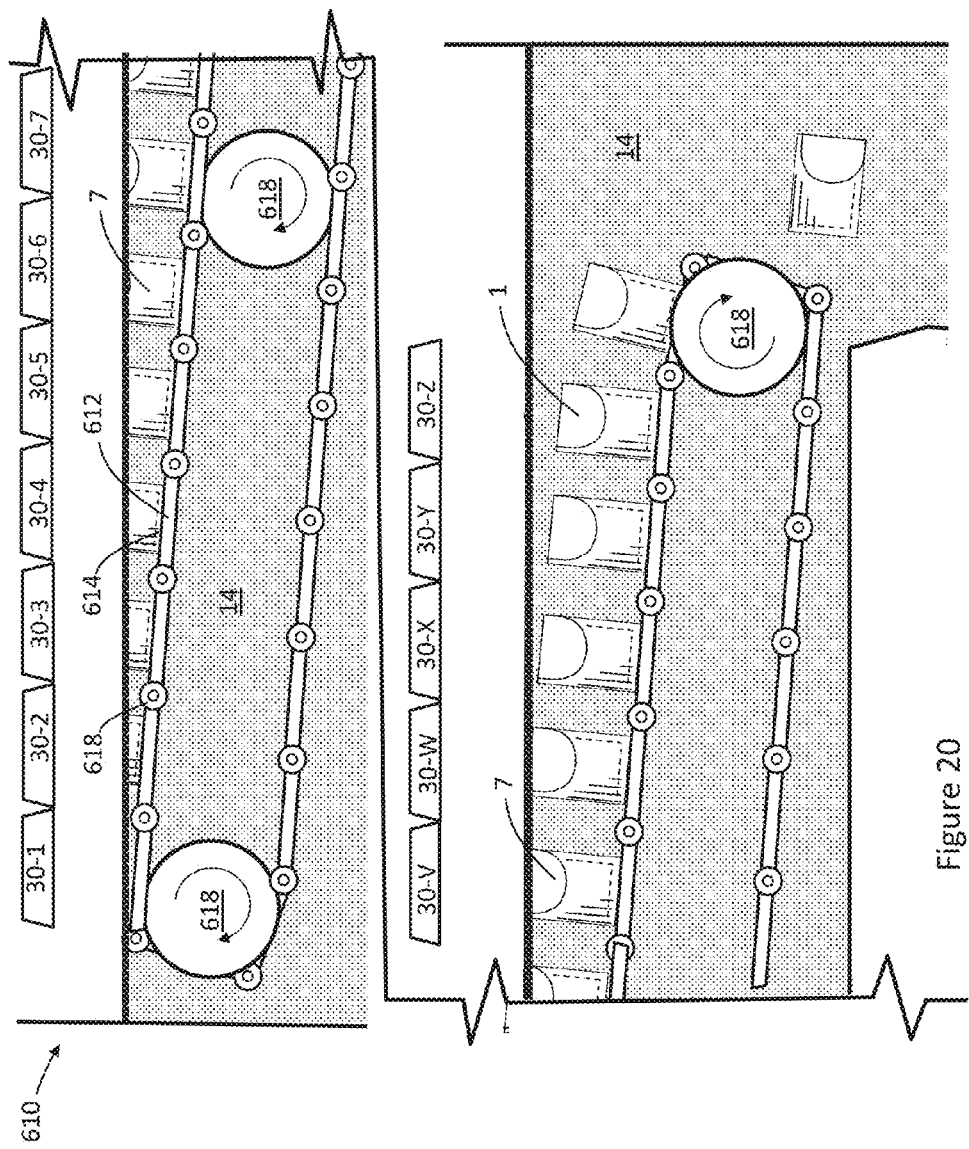
FIG. 20 shows an elevation view of an apparatus for building a plurality of 3D objects on a series of build surface segments that are connected in series to form a continuous build conveyor.

FIG. 20 shows an embodiment of a conveyor comprising a series of build surface segments 612 having a planar upper surface 614 on which the 3D objects 7 are built. The series of build surface segments 612 are connected by pivoting joints 618 to form a flexible conveyor that is driven by rotating sprockets 618. The segments 612 consequently provide the moving structure of the conveyor assembly.

Figure 21:
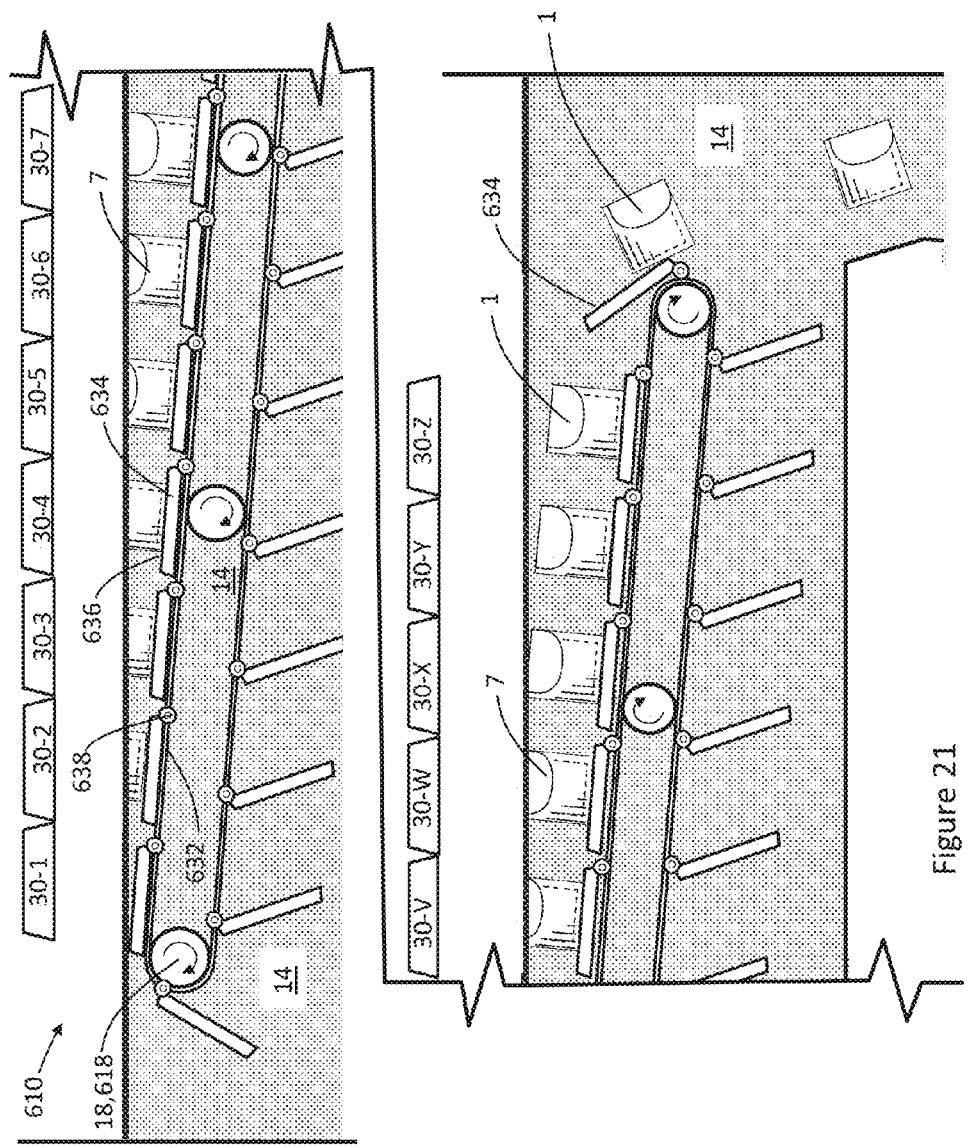
FIG. 21 shows an elevation view of an apparatus for building a plurality of 3D objects on a series of build surfaces connected to a continuous conveyor to form a continuous build conveyor.

FIG. 21 shows an embodiment of a conveyor comprising a series of build surface segments 634 having a planar upper surface 636 on which the 3D objects 7 are built. Each build surface segments 634 is connected to a continuous conveyor cable or belt 632 that is driven by rollers or sprockets 18,618. The connection of the build surface segments 634 to the conveyor cable or belt 632 is through a fixed or pivotable joint 638 that is fixed along the length of the conveyor cable or belt 632 and to the build surface segments 634. In the illustrated embodiment, the planar build surfaces 636 are oriented in a plane at substantially the same angle as the conveyer pathway. In an alternative embodiment, not shown, the build surface segment can be formed to provide a planar build surfaces that is oriented in a horizontal plane, relative to the angle of the conveyer pathway. In another embodiment, the build surface segment can be secured to the conveyor cable or belt with a plurality of securements that do not pivot or hinge.

Figure 22:
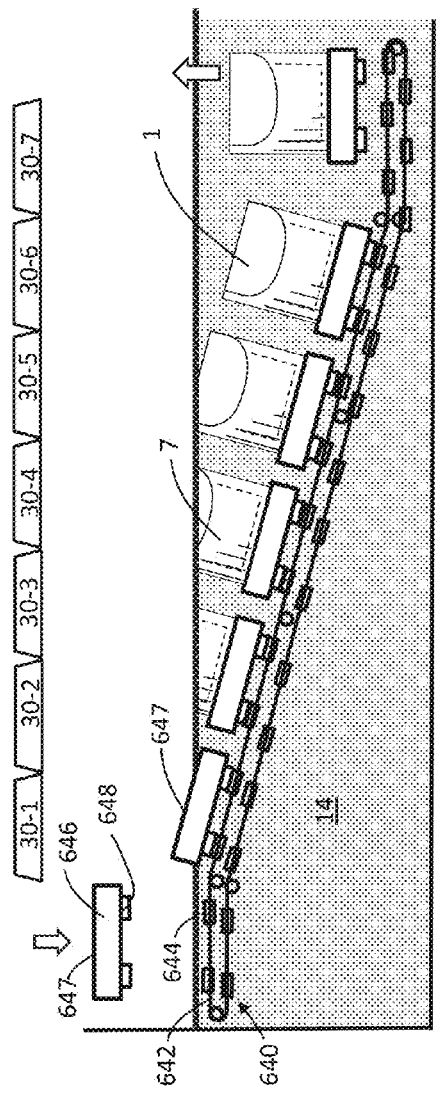
FIG. 22 shows an elevation view of an apparatus for building a plurality of 3D objects on a series of detachable build surfaces that are removably attached along a continuous conveyor to form a continuous build conveyor.
Figure 23:
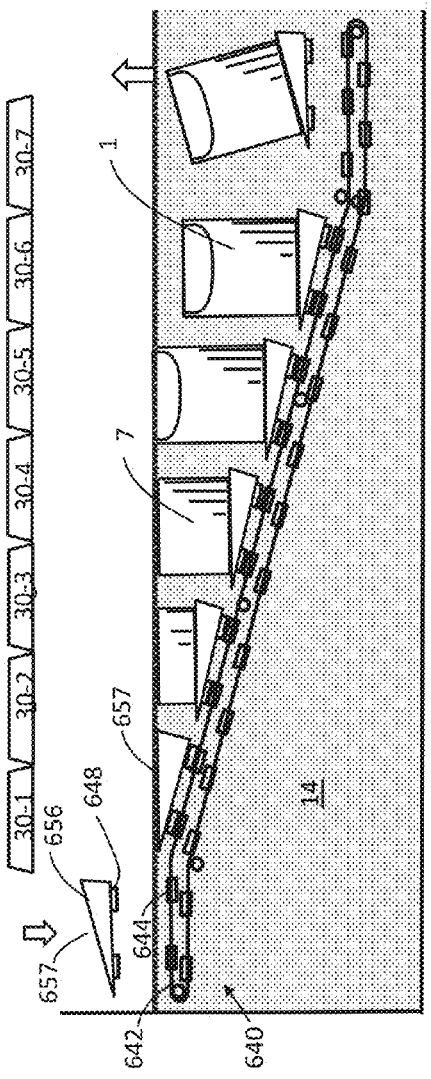
FIG. 23 shows an alternative apparatus to the continuous build conveyor shown in FIG. 22.

FIGS. 22 and 23 show embodiments of a conveyor comprising a series of build surface segments having a planar upper surface on which the 3D objects are built. The build surface segments or sleds 646,656 include one or more releasable securements 648 on a lower portion, for selectively attaching and releasing the build surface sleds 646, 656 to the conveyor. The conveyor includes a corresponding or mating securements 644 fixed to the conveyor, illustrated as a cable that pulled along the pathway by drive rollers. In FIG. 22, the build surface sled 646 includes a planar upper surface 647 that is parallel with the releasable securements 648, such that the planar upper surface 647 moves through the build solution 14 at the angle of the conveyor. In FIG. 23, the build surface sled 656 includes a planar upper surface 657 that is angled with the releasable securements 648, such that the planar upper surface 657 moves through the build solution 14 at in a horizontal orientation.

A build surface sled 646,656 is loaded onto the conveyor at a load station as illustrated in the top-left portion of the apparatus. Once loaded, the attached build surface sled 646,656 is drawn down into the build solution 14, and building of the 3D object can commence once the build surface 647,657 dips below the upper surface of the build solution 14.

Non-limiting examples of conveying systems for moving a build surface segment along a conveyor pathway include those described in the following, which are incorporated by reference: U.S. Pat. Nos. 3,587,829, 7,059,465, 8,839,943, and US Patent Publications 2006/0180470 and 2015/0274338.

Figure 24A:
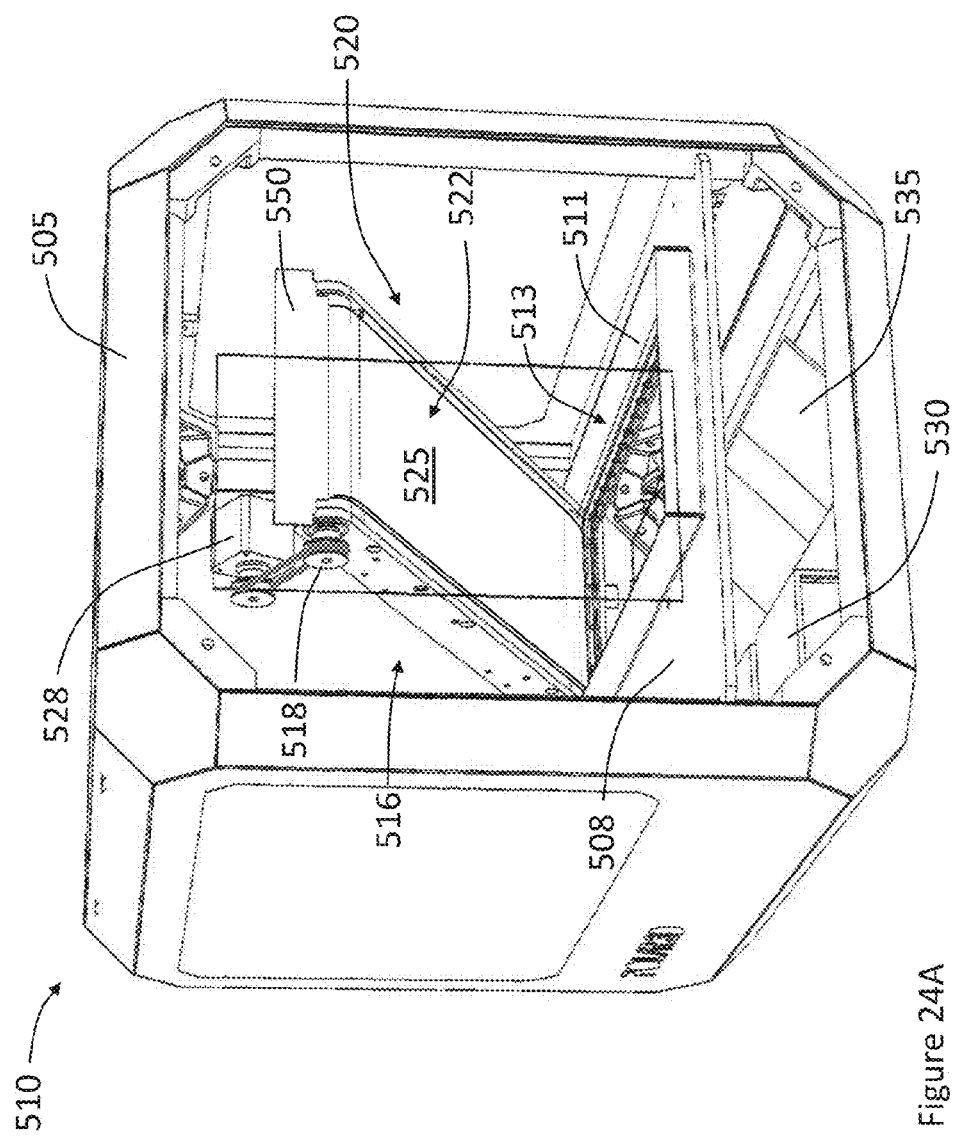
FIG. 24A shows a table-top 3D printing apparatus for building 3D objects on a continuous build surface that ascends from a pool of polymerizable monomer solution in a container.
Figure 24B:
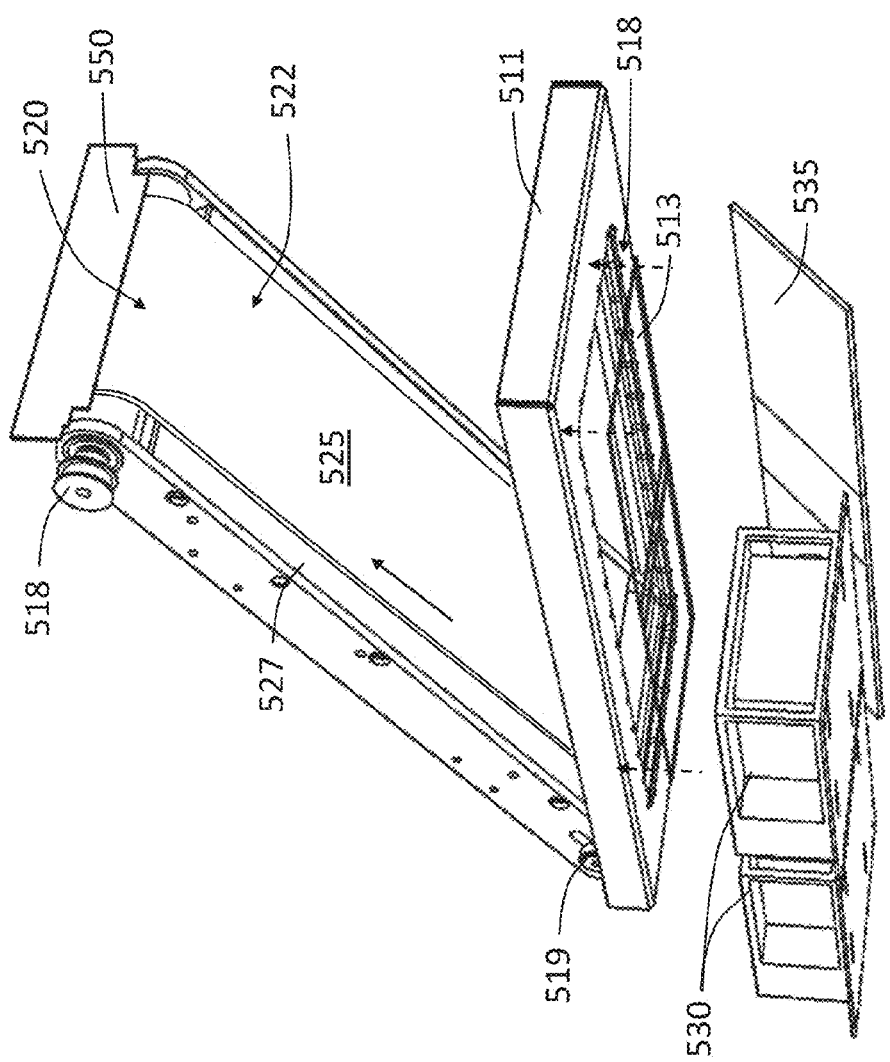
FIG. 24B shows the table-top 3D printing apparatus of FIG. 24A with the frame removed, and showing the illuminating elements that emit light up through a transparent bottom of the container.

FIGS. 24A and 24B show an embodiment of a desktop 3D printer that is portable and suitable for making continuously 3D objects that can be handled by hand. The desktop 3D printer 510 includes a cuboid frame 505 including a base 508 to which other functional components of the printer can be secured. A shallow reservoir 511 is configured to retain a pool of a polymerizable monomer liquid (not shown, but illustrated in FIG. 16A as monomer solution 14). The level of the monomer solution is maintained in the reservoir 511 by a reserve tank or other well-known means. The reservoir 511 has a rectangular opening 518 (FIG. 24B), and a transparent bottom plate 513 sealingly secured to cover the opening 518. The transparent bottom plate 513 is transmissive to light waves of a wavelength suitable to polymerize monomer.

A belt conveyor 516 passes in a loop of a belt material 520 between an upper belt roller 518 and a lower belt roller 519. The upper belt roller 518 is driven rotatively by a motor 528 to advance the belt 520 in a loop from the underside of the lower belt roller 519 upwardly at an angle to the underside of the upper belt roller 518. The motor 528 can include a controls for driving the loop of belt 520 at the programmed speed, including both continuous and intermittent movement.

A support plate 527 is attached to the belt conveyor 516, and the support plate 527 having a support surface that is positioned in confronting orientation to the inside surface of the ascending belt portion 522, and extends between the lower roller 518 and the upper roller 519. The outer planar surface of the support plate 527 supports the ascending belt portion 522 to provide a planar build surface 525. The lower end of the looped conveyor belt that curls under the lower roller 519 is disposed partly submerged into the pool of monomer solution to continuously wet the build surface 525 as the belt ascends upwardly.

Below the transparent plate 513 is disposed a light emitting source 530 (as described hereinabove; for example, a DLP light projector) and a mirror or reflective surface 535 that is positioned at an angle to the light output of the light emitting source 530, to direct the horizontally-emitted light vertically upward and through the transparent bottom 513.

Movement of the belt 520 and projection of a preprogrammed series of patterns of light through the transparent plate builds a 3-D object, or a plurality a 3-D objects, on the underside build surface 525 of the conveyor belt 520. Once the built object has been completed, the completed object continues to ascend attached to the underside of the belt 520, toward the upper roller 518, where the built object is pried free of the belt 520 by a doctor blade 550.

While particular embodiments of the invention have been described, the invention can be further modified within the spirit and scope of this disclosure. This application is therefore intended to cover any variations, uses or adaptations of the invention using its general principles. Further, the application is intended to cover such departures from the present disclosure as come within known or customary practice in the art to which this invention pertains and which fall within the appended claims.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

All publications, patents, and patent applications mentioned in this specification shall not be construed as an admission that such reference is available as prior art to the present invention. To the extent that section headings are used, they should not be construed as necessarily limiting.

I claim:

1. A printer apparatus for printing a three-dimensional (3D) object, comprising:
    A) an elongated container having a length for containing a build fluid, the contained build fluid having an upper surface,
    B) a build platform having a top-side build surface,
    C) a means for conveying the build platform along the length of the elongated container, and along a pathway that is angled relative to the upper surface of the contained build fluid, wherein the angled pathway descends down into and proceeds along a length of the build fluid and the elongated container,
    D) a matrix of light emitters, positioned over the elongated container and along the length of the conveying means, for emitting a reactive light toward the top-side build surface and at the upper surface of the build fluid, the reactive light being effective for at least partially polymerizing or agglomerating a portion of the upper surface of the build fluid into a layer of build material having a build pattern, and
    E) a computer with programming to selectively control the movement of the build platform and the pattern of light emitted from the matrix of light emitters at and along the upper surface of the build fluid, for printing the 3D object onto the top-side build surface.

2. The printer apparatus according to claim 1, wherein the build fluid comprises a monomer solution comprising a monomer.

3. The printer apparatus according to claim 2, wherein the light emitters comprise a plurality of UV light emitting elements, for polymerizing the monomer in the monomer solution by ultraviolet (UV) light waves, wherein the UV light emitting elements are selected from the group consisting of UV light emitting diodes (LEDs), UV laser light, and elements of a high-resolution digital light projector (DLP).

4. The printer apparatus according to claim 1, wherein the means for conveying the build platform comprises a continuous conveying belt having an elongated top-side surface, and a portion of the elongated top-side surface comprises the top-side build surface.

5. The printer apparatus according to claim 4, wherein the elongated top-side surface of the conveying belt comprises a plurality of top-side build surfaces, and the computer is programmed for printing a 3D object on each of the plurality of top-side build surfaces.

6. The printer apparatus according to claim 5, wherein the top-side build surface is angled relative to the upper surface of the contained build fluid.

7. The printer apparatus according to claim 6, wherein the conveying belt is programmed to move at a constant velocity along the angled pathway.

8. The printer apparatus according to claim 6, wherein the conveying belt is programmed for moving in steps or stages, comprising stopping at a predetermined position for a period of time, and then moving to a next predetermined position.

9. The printer apparatus according to claim 1, wherein the build platform comprises a plurality of build surface segments for printing a plurality of 3D objects, each build surface segment having a planar build surface, and the means for conveying the build platform comprises a conveying apparatus for conveying the plurality of build surface segments.

10. The printer apparatus according to claim 9, wherein the plurality of build surface segments are integral elements of a structure of the conveyor apparatus.

11. The printer apparatus according to claim 9, wherein the plurality of build surface segments comprises a plurality of removably connected segments along a length of a structure of the conveyor apparatus.

12. The printer apparatus according to claim 11, wherein the planar build surface is parallel with the upper surface of the contained build fluid.

13. The printer apparatus according to claim 12, wherein the plurality of build surface segments are programmed to move at a constant velocity along the angled pathway.

14. The printer apparatus according to claim 12, wherein the plurality of build surface segments are programmed for moving in steps or stages, comprising stopping at a predetermined position for a period of time, and then moving to a next pre-determined position.

15. The printer apparatus according to claim 1, wherein the build fluid comprises a fluidizable powder comprising an agglomerable or fusable compound or element.

16. The printer apparatus according to claim 15, wherein the agglomerable or fusable compound or element comprises a metal element, a metal complex, or a metal alloy.

17. The printer apparatus according to claim 15, wherein the light emitters comprise laser emitters for sintering the agglomerable or fusable compound or element.

18. A method for printing a three-dimensional (3D) object using a printer apparatus comprising an elongated container having a length, a build platform having a top-side, upward-facing build surface, a means for conveying the build platform along the length of the elongated container, a matrix of light emitters, positioned over the elongated container and along the length of the conveying means, and a computer with programming to selectively control the movement of the build platform and a pattern of reactive light emitted from the matrix of light emitters, the method comprising a step of passing the upward-facing build surface through a series of stages along a pathway that is angled relative to an upper surface of a build fluid contained in the elongated container, wherein the angled pathway descends down into and proceeds along a length of the build fluid, and printing a layer of build material at each stage, comprising the steps of:
   a) advancing the build surface by an increment length along the angled pathway;
   b) flooding at least one of the build surface and a previously-printed layer of build material with a surface layer of the build fluid; and
   c) exposing the upper surface layer of the build fluid to a predetermined pattern of the reactive light emitted toward the top-side build surface, to at least partially polymerize or agglomerate a selected portion of the surface layer of the build fluid into a printed layer of build material having a build pattern.

19. The method for printing the 3D object according to claim 18, wherein the build fluid comprises a monomer solution comprising a monomer, and the reactive light comprises ultraviolet (UV) light waves.

20. The method for printing the 3D object according to claim 18, wherein the step of passing the build surface comprises passing a series of build surfaces along the angled pathway, and printing a 3D object onto each of the series of build surfaces.

21. The method for printing the 3D object according to claim 18, wherein the upward-facing build surface is angled relative to the upper surface of the contained build fluid.

22. The method for printing the 3D object according to claim 18, wherein the upward-facing build surface is parallel with the upper surface of the contained build fluid, or at an angle relative to the angled pathway.

23. The method for printing a three-dimensional (3D) object according to claim 18, wherein the upward-facing build surface is angled relative to the upper surface of the contained build fluid, and the steps of passing and printing comprise the steps of:
   a) advancing the build surface by an increment length along the pathway;
   b) flooding over a first lateral portion of the build surface with a surface layer of the build fluid;
   c) exposing said surface layer of the build fluid to a predetermined pattern of a reactive light, to at least partially polymerize or agglomerate a selected portion of the said surface layer into a first layer of build material disposed on the first lateral portion of the build surface;
   d) advancing the build surface by an increment length along the pathway;
   e) flooding over the first layer of build material disposed on the first lateral portion of the build surface, and over a second lateral portion of the build surface with a surface layer of the build fluid;
   f) exposing said surface layer of build fluid to a predetermined pattern of the reactive light, to at least partially polymerize or agglomerate a selected portion of said surface layer of build fluid into a second layer of the build material disposed onto at least one of the first layer of the build material and the second lateral portion of the build surface;
   g) repeating a series of steps d), e) and f), a plurality of times, for a third and subsequent lateral portions of the build surface, until completing the printing of a base layer of an incomplete 3D object onto the upwardly-facing build surface, the incomplete 3D object having an upmost build layer;
   h) advancing the build surface by an increment length along the pathway;
   i) flooding the upmost build layer with a surface layer of the build fluid;
   j) exposing said surface layer of the build fluid, to a predetermined pattern of the reactive light, to at least partially polymerize or agglomerate a selected portion of said surface layer of the build fluid into a subsequent upmost build layer;
   k) repeating a series of steps h), i) and j), a plurality of times, until the complete 3D object has been printed; and
   l) releasing the printed 3D object from the build surface.

24. A printer apparatus for printing a three-dimensional (3D) object, comprising:

A) an elongated container having a length and including a light-transparent bottom, for containing build fluid comprising a monomer, B) a build platform having an under-side build surface, C) a means for conveying the build platform along the length of the container, and along a pathway that is angled relative to the light-transparent bottom, and wherein the angled pathway ascends up through the build fluid and proceeds along a length of the elongated container, D) a matrix of light emitting elements positioned under the light-transparent bottom and along the length of the conveying means, for emitting a predetermined pattern of a reactive light through the light-transparent bottom of the container and toward the under-side build surface, the reactive light being effective for at least partially polymerizing or agglomerating a portion of the build fluid adjacent the light-transparent bottom into a layer of build material having a build pattern, and E) a computer with programming to selectively control the movement of the build platform and the pattern of light emitted from the matrix of light emitters at and along the build fluid adjacent the light-transparent bottom, for printing the 3D object onto the under-side build surface.

25. The printer apparatus according to claim 24, wherein the build fluid comprises a monomer solution comprising a monomer, and the light emitters comprise a plurality of UV light emitting elements, for polymerizing the monomer in the monomer solution by ultraviolet (UV) light waves, wherein the UV light emitting elements are selected from the group consisting of UV light emitting diodes (LEDs), UV laser light, and elements of a high-resolution digital light projector (DLP).

26. The printer apparatus according to claim 24, wherein the means for conveying the build platform comprises a conveying belt having an elongated under-side surface, the elongated under-side surface of the conveying belt comprises a plurality of the under-side build surfaces, for printing a 3D object on each of the plurality of under-side build surfaces, and the under-side build surfaces are angled relative to the light-transparent bottom.

27. The printer apparatus according to claim 24, wherein the build platform comprises a plurality of build surface segments for printing a plurality of 3D objects, each build surface segment having a planar build surface, and the means for conveying the build platform comprises a conveying apparatus for conveying the plurality of build surface segments.

28. The printer apparatus according to claim 27, wherein the plurality of build surface segments comprises a plurality of removably connected segments along a length of a structure of the conveyor apparatus.

29. A printer apparatus for printing a three-dimensional (3D) object, comprising:

A) an elongated container including a light-transparent bottom, for containing build fluid comprising a monomer, B) a plurality of under-side, downward-facing, planar build surface segments for printing a plurality of 3D objects, C) a conveying apparatus for conveying the plurality of under-side, downward-facing, planar build surface segments along a pathway that is angled relative to the light-transparent bottom, and wherein the angled pathway ascends up through the build fluid and proceeds along a length of the elongated container, wherein the plurality of under-side, downward-facing, planar build surface segments are removably connected along a length of a structure of the conveyor apparatus, D) a matrix of light emitting elements for emitting a predetermined pattern of a reactive light through the light-transparent bottom of the container and toward the under-side build surface, the reactive light being effective for at least partially polymerizing or agglomerating a portion of the build fluid adjacent the light-transparent bottom into a layer of build material having a build pattern, and E) a computer with programming to selectively control the movement of the build platform and the pattern of light emitted from the matrix of light emitters at and along the build fluid adjacent the light-transparent bottom, for printing the 3D object onto the under-side build surface; and wherein the plurality of under-side, downward-facing planar build surface segments are either: (1) angled relative to the light-transparent bottom, or (2) parallel with the light-transparent bottom, or at an angle relative to the angled pathway.

* * * * *